(12) United States Patent
Ikeda et al.

(10) Patent No.: US 9,337,843 B2
(45) Date of Patent: May 10, 2016

(54) PROGRAMMABLE LOGIC DEVICE AND SEMICONDUCTOR DEVICE

(71) Applicant: Semiconductor Energy Laboratory Co., Ltd., Atsugi-shi, Kanagawa-ken (JP)

(72) Inventors: Takayuki Ikeda, Kanagawa (JP); Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 324 days.

(21) Appl. No.: 13/899,806

(22) Filed: May 22, 2013

(65) Prior Publication Data
US 2013/0314124 A1 Nov. 28, 2013

(30) Foreign Application Priority Data

May 25, 2012 (JP) .................. 2012-119929
Oct. 17, 2012 (JP) .................. 2012-229607
Jan. 21, 2013 (JP) .................. 2013-008054

(51) Int. Cl.
*H03K 19/177* (2006.01)

(52) U.S. Cl.
CPC .................. *H03K 19/177* (2013.01)

(58) Field of Classification Search
None
See application file for complete search history.

(56) References Cited

U.S. PATENT DOCUMENTS

| 4,870,302 | A | * | 9/1989 | Freeman ............ H03K 19/1736 326/40 |
| 5,343,406 | A | * | 8/1994 | Freeman ............ H03K 19/1736 326/40 |
| 5,426,378 | A | * | 6/1995 | Ong .................................. 326/39 |
| 5,432,719 | A | | 7/1995 | Freeman et al. |
| 5,488,316 | A | | 1/1996 | Freeman et al. |
| 5,625,301 | A | * | 4/1997 | Plants et al. .................... 326/41 |
| 5,731,856 | A | | 3/1998 | Kim et al. |
| 5,744,864 | A | | 4/1998 | Cillessen et al. |
| 6,172,521 | B1 | * | 1/2001 | Motomura .................... 326/40 |
| 6,294,274 | B1 | | 9/2001 | Kawazoe et al. |
| 6,404,224 | B1 | * | 6/2002 | Azegami et al. ............... 326/38 |
| 6,563,174 | B2 | | 5/2003 | Kawasaki et al. |
| 6,727,522 | B1 | | 4/2004 | Kawasaki et al. |
| 6,983,442 | B1 | * | 1/2006 | Wilton et al. .................. 326/38 |

(Continued)

FOREIGN PATENT DOCUMENTS

| CN | 102714496 A | 10/2012 |
| DE | 0 410 759 T1 | 8/1991 |

(Continued)

OTHER PUBLICATIONS

International Search Report, PCT Application No. PCT/JP2013/064299, dated Jul. 2, 2013, 2 pages.

(Continued)

*Primary Examiner* — Alexander H Taningco
*Assistant Examiner* — Nelson Correa
(74) *Attorney, Agent, or Firm* — Fish & Richardson P.C.

(57) ABSTRACT

Provided is a programmable logic device that includes logic elements arranged in a plurality of columns. Wirings connecting logic elements are arranged between the plurality of columns. Switch circuits that control electrical connections between the wirings and the logic elements are also arranged between the plurality of columns. Each of the switch circuit selects an electrical connection between one of the wirings and an input terminal of one of the logic elements in accordance with configuration data.

18 Claims, 34 Drawing Sheets

(56) References Cited

U.S. PATENT DOCUMENTS

| | | | |
|---|---|---|---|
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,132,851 B2* | 11/2006 | Young | H01L 27/0207 257/E27.107 |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,797,664 B2 | 9/2010 | Matsumoto et al. | |
| 8,294,489 B2* | 10/2012 | Tanamoto | H03K 19/1776 257/295 |
| 8,476,927 B2* | 7/2013 | Nishijima | H03K 19/17728 326/38 |
| 8,896,345 B2 | 11/2014 | Fukutome | |
| 8,970,251 B2 | 3/2015 | Kurokawa | |
| 8,975,918 B2 | 3/2015 | Takemura | |
| 9,007,093 B2* | 4/2015 | Kurokawa | H03K 19/177 326/38 |
| 9,117,501 B2 | 8/2015 | Takemura | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2007/0300201 A1 | 12/2007 | Matsumoto et al. | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0175646 A1 | 7/2011 | Takemura et al. | |
| 2012/0293200 A1 | 11/2012 | Takemura | |
| 2012/0293201 A1* | 11/2012 | Fujita et al. | 326/38 |
| 2012/0293202 A1 | 11/2012 | Nishijima et al. | |
| 2012/0293206 A1 | 11/2012 | Yoneda et al. | |
| 2012/0293209 A1 | 11/2012 | Takewaki | |
| 2012/0293242 A1 | 11/2012 | Kato | |
| 2013/0207170 A1 | 8/2013 | Kurokawa | |
| 2013/0285697 A1 | 10/2013 | Kurokawa | |
| 2013/0286757 A1 | 10/2013 | Takemura | |
| 2014/0176185 A1* | 6/2014 | Kurokawa | H03K 19/173 326/38 |
| 2015/0171865 A1 | 6/2015 | Kurokawa | |

FOREIGN PATENT DOCUMENTS

| | | |
|---|---|---|
| DE | 690 31 525 T2 | 1/1998 |
| EP | 0 410 759 A2 | 1/1991 |
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-132212 A | 6/1991 |
| JP | 05-251705 A | 9/1993 |
| JP | 08-264794 A | 10/1996 |
| JP | 10-285014 A | 10/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-034535 A | 2/2008 |
| JP | 2011-172214 A | 9/2011 |
| KR | 2012-0118034 A | 10/2012 |
| TW | 201140754 A | 11/2011 |
| WO | 2004/114391 A1 | 12/2004 |
| WO | 2011/089808 A1 | 7/2011 |

(56) References Cited

OTHER PUBLICATIONS

Written Opinion, PCT Application No. PCT/JP2013/064299, dated Jul. 2, 2013, 3 pages.
Ki Chul Chun et al.; "A 3T Gain Cell Embedded DRAM Utilizing Preferential Boosting for High Density and Low Power On-Die Caches"; IEEE Journal of Solid-State Circuits; 2011; pp. 1495-1505; vol. 46, No. 6.
Fatemeh Eslami et al.; "Capacitive Boosting for FPGA Interconnection Networks"; 2011 21st International Conference on Field Programmable Logic and Applications; 2011; pp. 453-458; vol. 21.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

(56) References Cited

OTHER PUBLICATIONS

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

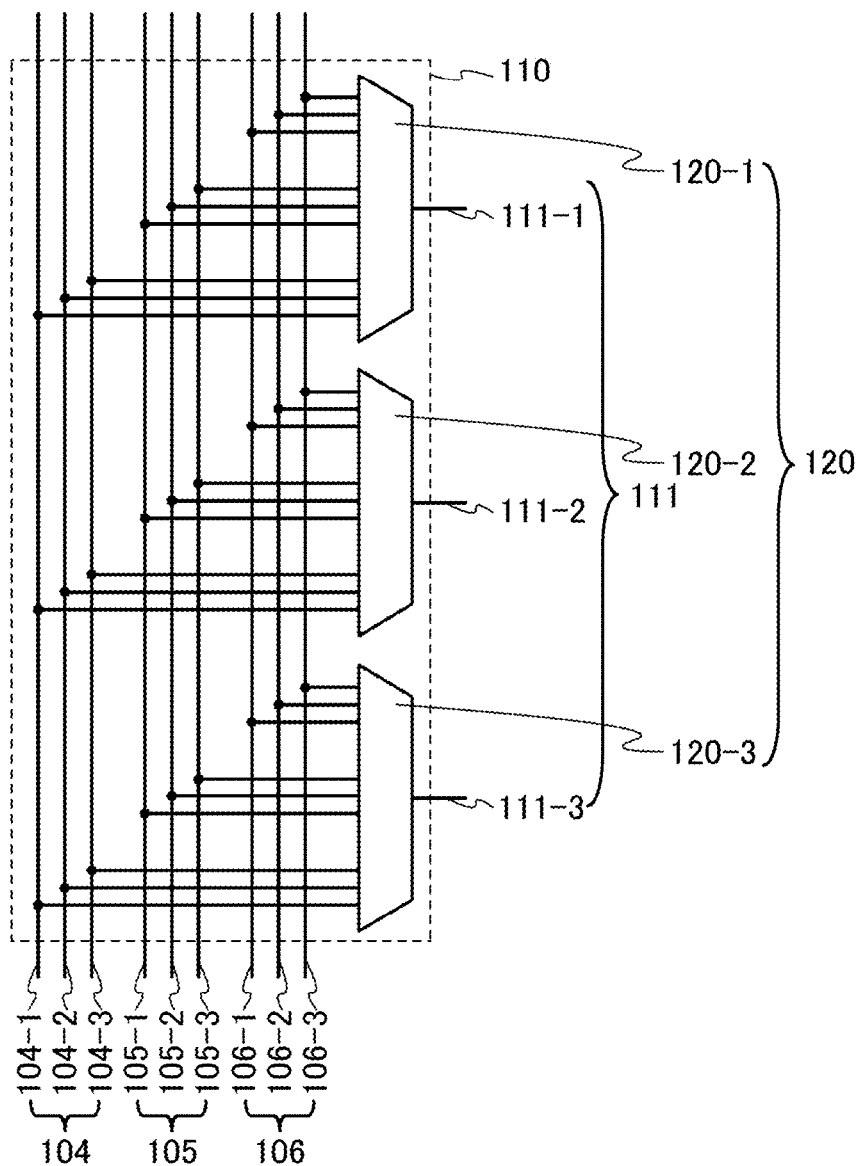

FIG. 30

| | Cell 140a | Cell 140b |
|---|---|---|
| Circuit diagram | 122⏋<br>121⎤ FD<br>131t(OS)<br>IN  130t(Si) OUT | 122⏋     180<br>121⎤ FD<br>131t(Si)  181<br>IN  130t(Si) OUT |
| Configuration data "1" | IN ‾‾⎍‾‾<br>FD ‾‾⎍‾‾ | IN ‾‾⎍‾‾<br>FD ―∧―∨― |
| Configuration data "0" | IN ‾‾⎍‾‾<br>FD ――――― | IN ‾‾⎍‾‾<br>FD ―∧―∨― |

PROGRAMMABLE LOGIC DEVICE AND SEMICONDUCTOR DEVICE

TECHNICAL FIELD

The present invention relates to an object, a method, or a manufacturing method. The present invention also relates to a process, a machine, a manufacture, or a composition of matter. In particular, the present invention relates to, for example, a semiconductor device, a display device, a light-emitting device, a power storage device, a driving method thereof, or a manufacturing method thereof. One embodiment of the present invention particularly relates to, for example, a programmable logic device in which the configuration of hardware can be changed and a semiconductor device including the programmable logic device.

BACKGROUND ART

In a programmable logic device (PLD), a logic circuit is composed of an adequate number of logic elements (basic blocks), and the function of each logic element and interconnections between the logic elements can be changed after manufacture. Specifically, the PLD includes a plurality of logic elements, a routing resource for controlling connection between the logic elements, and a register. The register stores data (configuration data) for defining a function of each logic element and connections between the logic elements formed by the routing resource.

A register for storing configuration data is called a configuration memory. Storing configuration data in a configuration memory is called configuration. In particular, rewriting the configuration memory with another configuration data is called reconfiguration.

A PLD in which a logic circuit can be reconfigured during the operation (the process is called dynamic reconfiguration) has an advantage of high area efficiency over a normal PLD. A multi-context system is a method of achieving dynamic reconfiguration in such a manner that configuration data read from a memory element is stored in configuration memories corresponding to logic elements or routing resources. A multi-context system is capable of performing reconfiguration of a logic circuit at higher speed than a configuration data transfer method by which dynamic reconfiguration is achieved by sequentially sending configuration data from a memory element to configuration memories corresponding to logic elements or routing resources.

Patent Document 1 discloses a programmable LSI in which reconfiguration is performed in a short time by storing configuration data sent from a dynamic random access memory (DRAM) in a configuration memory composed of a static random access memory (SRAM).

REFERENCE

Patent Document 1: Japanese Published Patent Application No. H10-285014

DISCLOSURE OF INVENTION

Since a PLD employing a multi-context system needs to have a configuration memory in addition to a memory element, the area of storage devices such as the memory element and the configuration memory in the PLD is larger than in the case of using another method of performing dynamic reconfiguration, such as a configuration data transfer method, and thus the PLD cannot fully take advantage of high area efficiency of dynamic reconfiguration. In particular, an SRAM requires a large number of elements per memory cell; thus, it is difficult to keep the area of storage devices small. A DRAM has a smaller number of elements per memory cell than an SRAM and is effective in keeping the area of a storage device small; however, it is difficult to reduce power consumption because refresh operation is necessary.

The number of switches included in a routing resource tends to increase as the design flexibility of a programmable logic device increases. Selection (switching) of the on/off state of the switch in the routing resource is determined in accordance with configuration data; when the number of switches increases, the volume of configuration data corresponding to one circuit structure becomes relatively large with respect to the circuit size of the programmable logic device. As a result, it takes time to transfer configuration data to a configuration memory. Moreover, an increase in the number of switches requires a memory element or a configuration memory with large storage capacity, which makes it difficult to prevent the area of a storage device from increasing. Further, with an increasing number of switches, delay of signals passing through the switches is significant in the programmable logic device, which prevents high-speed operation of the programmable logic device.

The potentials of a variety of wirings connected to the switches in the routing resource become sometimes floating after the programmable logic device is powered off. Depending on the structure of a storage element used for a configuration memory, configuration data for determining switching of the switch included in the routing resource is sometimes lost when the programmable logic device is powered off. For example, in the programmable LSI disclosed in Patent Document 1, since a configuration memory is composed of an SRAM, configuration data is lost when the programmable logic device is powered off. When the potential of a wiring becomes floating and configuration data is lost, wirings that are electrically separated during normal operation sometimes establish electrical continuity through the switch after the programmable logic device is powered on. In this case, when these wirings have different potentials, a large amount of current might damage the programmable logic device by flowing through the wirings.

In view of the foregoing technical background, an object of one embodiment of the present invention is to provide a programmable logic device having high design flexibility and a smaller number of switches for controlling connection between logic elements. Another object of one embodiment of the present invention is to provide a highly reliable programmable logic device.

Another object of one embodiment of the present invention is to provide a semiconductor device that achieves high-speed operation or high reliability by using the programmable logic device.

As the circuit size of the programmable logic device increases, a configuration memory with larger storage capacity is needed, so that it is difficult to prevent the area of the programmable logic device from increasing.

In view of the above, an object of one embodiment of the present invention is to provide a programmable logic device having a small layout area even with an increasing circuit size.

Another object of one embodiment of the present invention is to provide a programmable logic device in which the area of a storage device is small. Another object of one embodiment of the present invention is to provide a programmable logic device in which a logic circuit can be reconfigured at high speed and the area of a storage device is small. Another object of one embodiment of the present invention is to provide a programmable logic device in which a logic circuit can be reconfigured at high speed, the area of a storage device is small, and high-speed operation can be achieved.

Sill another object of one embodiment of the present invention is to provide a semiconductor device that is reduced in size or achieves high performance by using the programmable logic device.

An object of one embodiment of the present invention is to provide a novel semiconductor device or the like. Note that the description of these objects does not impede the existence of other objects. In one embodiment of the present invention, there is no need to achieve all the objects. Other objects will be apparent and can be derived from the description of the specification, the drawings, the claims, and the like.

In a first embodiment of the present invention, a switch circuit included in a routing resource additionally has a function of a storage device that holds data on its on/off state. Specifically, the switch circuit includes a plurality of groups each including a first transistor functioning as a first switch that controls electrical connection between wirings or terminals, and a second transistor functioning as a second switch that supplies, holds, and discharges electric charge in an amount determined by configuration data at a gate of the first transistor. The first transistor in one of the plurality of groups is turned on in accordance with the configuration data, thereby determining connections between a plurality of wirings and an input terminal of a logic element through the switch circuit.

A transistor having a channel formation region in a film of a semiconductor having a wider band gap and lower intrinsic carrier density than silicon can have much smaller off-state current than a transistor having a channel formation region in a semiconductor such as normal silicon or germanium. Examples of a semiconductor having a wider band gap and lower intrinsic carrier density than silicon are an oxide semiconductor, silicon carbide, and gallium nitride that have a band gap more than twice as wide as that of silicon.

The second transistor preferably has extremely small off-state current in order to prevent electric charge held at the gate of the first transistor from leaking. For this reason, the above-mentioned transistor having a channel formation region in a film of a semiconductor having a wider band gap and lower intrinsic carrier density than silicon is preferably used as the second transistor.

In the switch circuit having the above structure, the on/off state of the first transistor for controlling electrical connection between wirings or terminals is determined in accordance with configuration data and is held by the second transistor with extremely small off-state current. Thus, in the programmable logic device of one embodiment of the present invention, the switch circuit serves as both a configuration memory and a memory element, and the number of elements in each group is smaller than that of an SRAM. Consequently, the area of a storage device for storing configuration data can be smaller than that in the case of a programmable logic device having a conventional structure in which both a configuration memory and a memory element are provided.

Since the off-state current of the second transistor is smaller than that of a transistor having a channel formation region in a silicon film, the data retention time of the switch circuit can be longer than that of a DRAM. Thus, data rewriting can be performed less frequently, and power consumption can be reduced as a result.

In addition, the programmable logic device in the first embodiment of the present invention at least includes a column including a plurality of first logic elements, a column including a plurality of second logic elements, and a column including a plurality of third logic elements. The programmable logic device in the first embodiment of the present invention also includes a plurality of first wirings electrically connected to output terminals of the plurality of first logic elements, a plurality of second wirings electrically connected to output terminals of the plurality of second logic elements, and a plurality of third wirings electrically connected to output terminals of the plurality of third logic elements. The first and second wirings are provided between the plurality of first logic elements and the plurality of second logic elements. The third wiring is provided between the plurality of first logic elements and the plurality of second logic elements and between the plurality of second logic elements and the plurality of third logic elements.

In the first embodiment of the present invention, electrical connection between the first to third wirings and input terminals of the plurality of second logic elements is controlled by a plurality of the switch circuits. Specifically, in each of the switch circuits, the first transistor in one of the plurality of groups is turned on in accordance with configuration data, thereby determining electrical connections between the first to third wirings and the input terminals of the plurality of second logic elements.

In the first embodiment of the present invention, with the above structure, electrical connection between one second logic element and another second logic element can be controlled by one switch circuit. Electrical connection between one first logic element and one second logic element can be controlled by one switch circuit. Moreover, electrical connection between one second logic element and one third logic element can be controlled by one switch circuit. Accordingly, in one embodiment of the present invention, the number of switch circuits included in the routing resource can be small with high design flexibility of the programmable logic device.

In a second embodiment of the present invention, a switch circuit included in a routing resource includes a plurality of groups each at least including a first switch and a second switch that controls electrical connection between wirings in accordance with the potential of a node to which a signal including configuration data is applied through the first switch. The second switch in one of the plurality of groups is turned on in accordance with the configuration data, thereby determining connection through the switch circuit between one of a plurality of wirings connected to output terminals of a plurality of logic elements and one of wirings electrically connected to an input terminal of one logic element.

In addition, the programmable logic device in the second embodiment of the present invention at least includes a column including a plurality of first logic elements, a column including a plurality of second logic elements, and a column including a plurality of third logic elements. Here, a plurality of wirings electrically connected to output terminals of the plurality of first logic elements are called first wirings, a plurality of wirings electrically connected to output terminals of the plurality of second logic elements are called second wirings, and a plurality of wirings electrically connected to output terminals of the plurality of third logic elements are called third wirings. In one embodiment of the present invention, the plurality of first and second wirings are provided between the column including the plurality of first logic elements and the column including the plurality of second logic elements. Moreover, the plurality of third wirings are provided between the column including the plurality of first logic elements and the column including the plurality of second logic elements, and between the column including the plurality of second logic elements and the column including the plurality of third logic elements.

Here, a plurality of wirings electrically connected to input terminals of the plurality of second logic elements are called fourth wirings. In one embodiment of the present invention, electrical connections between the plurality of first to third wirings and the plurality of fourth wirings are controlled by a plurality of the switch circuits. Specifically, the second switch in one of the plurality of groups in each switch circuit is turned on in accordance with configuration data, thereby determining electrical connection between one of the plurality of first to third wirings and one of the plurality of fourth wirings.

In the second embodiment of the present invention, with the above structure, electrical connection between one second logic element and another second logic element can be controlled by one switch circuit. Electrical connection between one first logic element and one second logic element can be controlled by one switch circuit. Moreover, electrical connection between one second logic element and one third logic element can be controlled by one switch circuit. Accordingly, in one embodiment of the present invention, the number of switch circuits included in the routing resource can be small with high design flexibility of the programmable logic device.

The programmable logic device in the second embodiment of the present invention also includes a switch that controls electrical connection between a wiring electrically connected to the input terminal of any one of the first to third logic elements and a wiring supplied with a predetermined potential. In one embodiment of the present invention, with this structure, the potential of the wiring electrically connected to the input terminal can be initialized to be at a predetermined level. Accordingly, even if the potential of the wiring electrically connected to the input terminal becomes floating and configuration data is lost after the programmable logic device is powered off, and thus electrical continuity is established between the wiring electrically connected to the input terminal and the plurality of wirings electrically connected to the output terminal after the programmable logic device is powered on, current flowing between these wirings can be prevented from flowing into the logic element through the input terminal. Consequently, damage to the programmable logic device can be prevented. In some cases, the input terminal of the logic element has an intermediate potential between a high-level potential and a low-level potential just after the programmable logic device is powered on. When the intermediate potential is applied to the input terminal of the logic element, a shoot-through current is likely to be generated in a CMOS circuit included in the logic element. However, in one embodiment of the present invention, the above structure can prevent the input terminal from having an intermediate potential after power is on, and thus can prevent generation of the shoot-through current.

The programmable logic device in the second embodiment of the present invention may include, in addition to the switch for initialization, a latch that has a function of keeping the potential of the wiring electrically connected to the input terminal high or low. In one embodiment of the present invention, with this structure, the potential of the input terminal can be kept high or low after power is on; thus, the shoot-through current can be prevented from being generated.

In a third embodiment of the present invention, a configuration memory included in a logic element includes a plurality of first switches; a plurality of second switches each of which controls electrical connection between a first wiring supplied with a first potential and a second wiring in accordance with the potential of a first node to which a first signal including configuration data is applied through the first switch; a plurality of third switches; a plurality of fourth switches each of which controls electrical connection between a third wiring supplied with a second potential lower than the first potential and the second wiring in accordance with the potential of a second node to which a second signal of polarity opposite to that of the first signal is applied through the third switch; and a plurality of fifth switches each of which controls output of the potential of the second wiring to the fourth wiring. Logic operation performed in the logic clement is defined in accordance with the configuration data.

In the third embodiment of the present invention, with the above structure, the first potential or the second potential can be applied to the fourth wiring in accordance with configuration data. Accordingly, configuration data can be read correctly without precharging the fourth wiring before the configuration data is read from the configuration memory. As a result, a circuit for precharging is not necessarily provided in a circuit for driving the configuration memory, which prevents an increase in the area of a programmable logic device.

In a fourth embodiment of the present invention, a plurality of logic elements each including a configuration memory with the above structure are arranged in columns, and the configuration memories included in the plurality of logic elements are arranged in rows and columns. In the fourth embodiment of the present invention, a plurality of switch circuits included in a routing resource are also arranged in rows and columns.

In the configuration memory in the third embodiment, a portion configured with the first and second switches and a portion configured with the third and fourth switches have the same connection structure between the switches as a portion configured with the first and second switches in the switch circuit of the second embodiment. Accordingly, in the fourth embodiment of the present invention, the configuration memories and the switch circuits are arranged in rows and columns, so that the operation of the configuration memories and the operation of the switch circuits can be controlled by the same driver circuit. Thus, an increase in the area of a programmable logic device can be prevented as compared to the case where a driver circuit for the switch circuits and a driver circuit for the configuration memories are separately provided.

One embodiment of the present invention can provide a programmable logic device in which the area of a storage device is small. One embodiment of the present invention can provide a programmable logic device in which a logic circuit can be reconfigured at high speed and the area of a storage device is small. Moreover, one embodiment of the present invention can provide a programmable logic device in which a logic circuit can be reconfigured at high speed, the area of a storage device is small, and high-speed operation can be performed. One embodiment of the present invention can provide a semiconductor device that is reduced in size or achieves high performance by using the programmable logic device.

One embodiment of the present invention can provide a programmable logic device having high design flexibility and a smaller number of switches for controlling connection between logic elements. One embodiment of the present invention can provide a highly reliable programmable logic device. Further, one embodiment of the present invention can provide a semiconductor device that achieves high-speed operation or high reliability.

One embodiment of the present invention can provide a programmable logic device having a small layout area even with an increasing circuit size. One embodiment of the present invention can provide a semiconductor device that is reduced in size.

BRIEF DESCRIPTION OF DRAWINGS

In the accompanying drawings:
FIG. 2 illustrates a structure of a switch circuit;
FIG. 30 shows circuit diagrams of cells and timing charts.

BEST MODE FOR CARRYING OUT THE INVENTION

Embodiments of the present invention will be described below in detail with reference to the accompanying drawings. Note that the present invention is not limited to the following description, and it is easily understood by those skilled in the art that the mode and details can be variously changed without departing from the scope and spirit of the present invention. Accordingly, the present invention should not be construed as being limited to the description of the embodiments below.

Note that a programmable logic device of the present invention includes, in its category, a variety of semiconductor integrated circuits formed using semiconductor elements, such as microprocessors, image processing circuits, controllers for semiconductor display devices, digital signal processors (DSP), and microcontrollers. A semiconductor device of the present invention includes, in its category, various devices such as RF tags formed using any of the above semiconductor integrated circuits and semiconductor display devices. The semiconductor display device includes, in its category, liquid crystal display devices, light-emitting devices in which a light-emitting element typified by an organic light-emitting diode (OLED) is provided for each pixel, electronic paper, digital micromirror devices (DMD), plasma display panels (PDP), field emission displays (FED), and other semiconductor display devices in which a semiconductor element is included in a driver circuit.

<Structure Example of PLD>

Figure 1A:
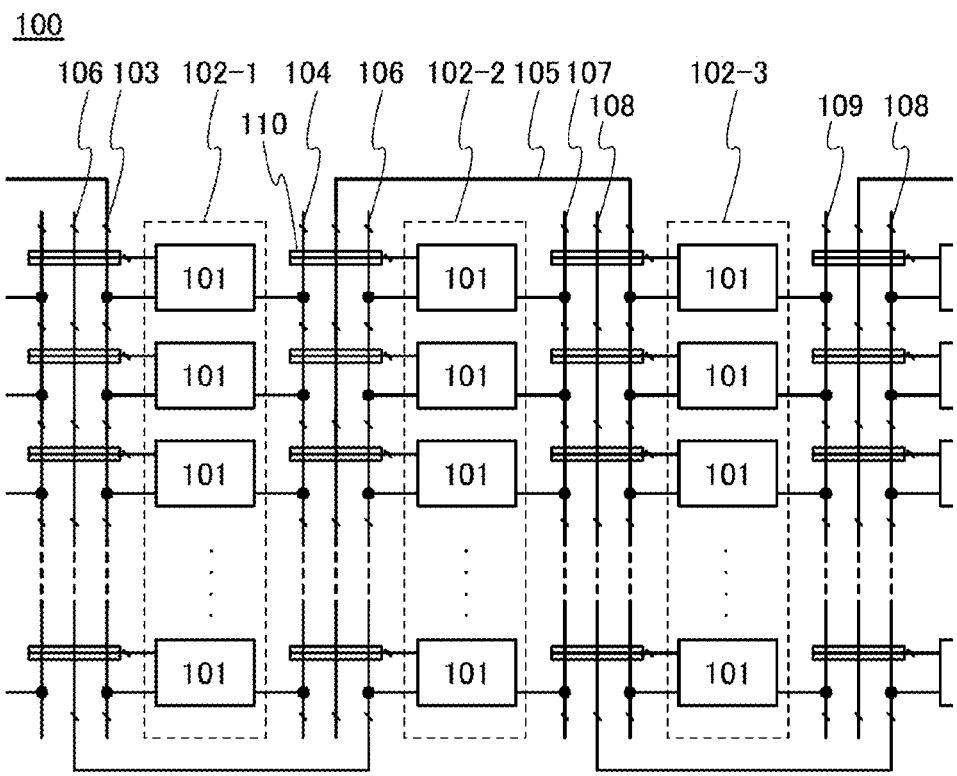
FIGS. 1A to 1C illustrate structures of a PLD and a switch circuit.

In a PLD in one embodiment of the present invention, a plurality of columns each including a plurality of logic elements (LEs) are arranged, and a plurality of wirings and a plurality of switch circuits are arranged between the columns. FIG. 1A illustrates an example of part of a PLD 100 in one embodiment of the present invention.

In FIG. 1A, a first column 102-1 including a plurality of LEs 101, a second column 102-2 including a plurality of LEs 101, and a third column 102-3 including a plurality of LEs 101 are provided in the PLD 100. FIG. 1A illustrates an example where the first column 102-1, the second column 102-2, and the third column 102-3 are positioned in parallel in this order from the left.

In FIG. 1A, a plurality of wirings 103, a plurality of wirings 104, a plurality of wirings 105, a plurality of wirings 106, a plurality of wirings 107, a plurality of wirings 108, a plurality of wirings 109 are provided in the PLD 100.

A first output terminal of each LE 101 in the first column 102-1 is connected to one of the plurality of wirings 103. A second output terminal of each LE 101 in the first column 102-1 is connected to one of the plurality of wirings 104.

A first output terminal of each LE 101 in the second column 102-2 is connected to one of the plurality of wirings 106. A second output terminal of each LE 101 in the second column 102-2 is connected to one of the plurality of wirings 107.

A first output terminal of each LE 101 in the third column 102-3 is connected to one of the plurality of wirings 105. A second output terminal of each LE 101 in the third column 102-3 is connected to one of the plurality of wirings 109.

Note that the number of the first output terminals and the number of the second output terminals of the LE 101 are not limited to one, and either or both of the number of the first output terminals and the number of the second output terminals may be more than one. Note also that one output terminal is always connected to one wiring regardless of the number of the first output terminals and the number of the second output terminals. That is, when the column 102 includes Y LEs 101 (Y is a natural number), the PLD 100 at least includes Y wirings connected to the first output terminals and Y wirings connected to the second output terminals.

Note that "connection" in this specification means electrical connection and corresponds to the state in which current, voltage, or a potential can be supplied or transmitted. Therefore, a connection state means not only a state of a direct connection but also a state of indirect connection through a circuit element such as a wiring, a resistor, a diode, or a transistor in which current, voltage, or a potential can be supplied or transmitted.

The first column 102-1 is placed between the plurality of wirings 103 and the plurality of wirings 104. The second column 102-2 is placed between the plurality of wirings 106 and the plurality of wirings 107. The third column 102-3 is placed between the plurality of wirings 105 and the plurality of wirings 109.

The plurality of wirings 106, which are connected to the first output terminals of the LEs 101 in the second column 102-2, are provided both between the first column 102-1 and the second column 102-2 and between the first column 102-1 and a column (not illustrated) of the LEs 101 positioned on the left side of the first column 102-1 in FIG. 1A. The plurality of wirings 105, which are connected to the first output terminals of the LEs 101 in the third column 102-3, are provided both between the first column 102-1 and the second column 102-2 and between the second column 102-2 and the third column 102-3. The plurality of wirings 108 connected to first output terminals of the LEs 101 (not illustrated) positioned on the right side of the third column 102-3 in FIG. 1A are provided both between the second column 102-2 and the third column 102-3 and between the third column 102-3 and a column (not illustrated) of the LEs 101 positioned on the right side of the third column 102-3.

When attention is focused on an N-th column (N is a natural number of 3 or more), a plurality of wirings connected to the first output terminals of the LEs 101 in the N-th column are provided both between the N-th column and the (N-1)th column and between the (N-1)th column and an (N-2)th column. In the case where N is 2, a plurality of wirings connected to the first output terminals of the LEs 101 in the second column are provided both between the second column and the first column and between the first column and an I/O element (IO). The IO has a function of an interface that controls input of signals to the LEs 101 from the outside of the PLD or output of signals from the LEs 101 to the outside of the PLD.

The positional relation between the columns 102 including the LEs 101 and a variety of wirings which is illustrated in FIG. 1A is one example in one embodiment of the present invention. In one embodiment of the present invention, the columns 102 including the LEs 101 and a variety of wirings are arranged in parallel.

In one embodiment of the present invention, when attention is focused on the (N-1)th column (N is a natural number of 3 or more), a plurality of wirings connected to the first output terminals of the LEs 101 in the (N-1)th column, a plurality of wirings connected to the first output terminals of the LEs 101 in the N-th column, and a plurality of wirings connected to the second output terminals of the LEs 101 in the (N-2)th column are connected to a plurality of input terminals of the LEs 101 in the (N-1)th column through switch circuits 110.

Specifically, in FIG. 1A, for example, the plurality of wirings 106 connected to the first output terminals of the LEs 101 in the second column 102-2, the plurality of wirings 105 connected to the first output terminals of the LEs 101 in the third column 102-3, and the plurality of wirings 104 connected to the second output terminals of the LEs 101 in the first column 102-1 are connected to a plurality of input terminals of the LEs 101 in the second column 102-2 through the switch circuits 110.

Figure 1B:
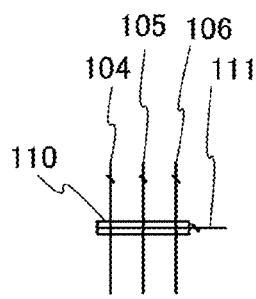
Figure 1C:
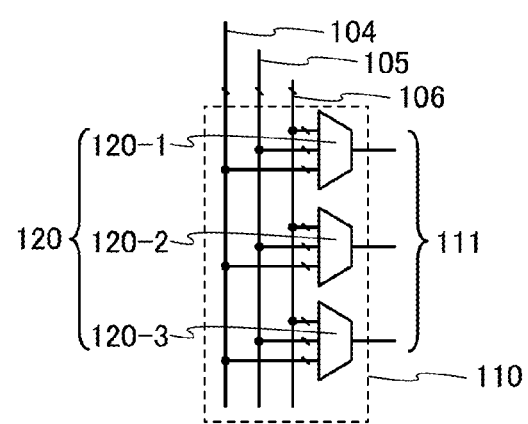

FIG. 1B is a circuit diagram of the switch circuit 110 that controls connection between the plurality of wirings 104, the plurality of wirings 105, and the plurality of wirings 106 and the plurality of input terminals of the LEs 101 in the second column 102-2 illustrated in FIG. 1A. A plurality of wirings 111 in FIG. 1B are connected to the plurality of input terminals of the LE 101 in the second column 102-2. The switch circuit 110 includes a plurality of switch circuits 120. FIG. 1C illustrates a specific structure example of the switch circuit 110 illustrated in FIG. 1B. As illustrated in FIG. 1C, the switch circuit 110 in FIG. 1B includes three switch circuits 120 of a switch circuit 120-1, a switch circuit 120-2, and a switch circuit 120-3.

FIG. 1C illustrates the switch circuit 110 corresponding to three wirings 111 and thus shows the case where the switch circuit 110 includes the three switch circuits 120 of the switch circuit 120-1, the switch circuit 120-2, and the switch circuit 120-3. The number of the switch circuits 120 included in the switch circuit 110 can be determined in accordance with the number of input terminals of the LE 101.

FIGS. 1B and 1C illustrate the switch circuit 110 that controls connection between the plurality of wirings 104, 105, and 106 and the plurality of wirings 111; the switch circuit 110 that controls connection between plural wirings and plural wirings in FIG. 1A has a structure similar to the above structure.

Next, FIG. 2 illustrates a more specific example of the structure of the switch circuit 110 in FIG. 1C. FIG. 2 more clearly shows a connection relation between the plurality of wirings 104, the plurality of wirings 105, and the plurality of wirings 106 and the switch circuit 110. As illustrated in FIG. 2, each of the switch circuits 120 controls connection between all the plurality of wirings 104, 105, and 106 and one of the plurality of wirings 111.

Specifically, FIG. 2 illustrates an example where the plurality of wirings 104 include a wiring 104-1, a wiring 104-2, and a wiring 104-3; the plurality of wirings 105 include a wiring 105-1, a wiring 105-2, and a wiring 105-3; and the plurality of wirings 106 include a wiring 106-1, a wiring 106-2, and a wiring 106-3. FIG. 2 illustrates an example where the plurality of wirings 111 include a wiring 111-1, a wiring 111-2, and a wiring 111-3.

In FIG. 2, the switch circuit 120-1 controls connection between all the plurality of wirings 104, 105, and 106 and the wiring 111-1. Specifically, the switch circuit 120-1 has a function of selecting one of the plurality of wirings 104, 105, and 106 in accordance with configuration data and connecting the one selected wiring to the wiring 111-1.

The switch circuit 120-2 controls connection between all the plurality of wirings 104, 105, and 106 and the wiring 111-2. Specifically, the switch circuit 120-2 has a function of selecting one of the plurality of wirings 104, 105, and 106 in accordance with configuration data and connecting the one selected wiring to the wiring 111-2.

The switch circuit 120-3 controls connection between all the plurality of wirings 104, 105, and 106 and the wiring 111-3. Specifically, the switch circuit 120-3 has a function of selecting one of the plurality of wirings 104, 105, and 106 in accordance with configuration data and connecting the one selected wiring to the wiring 111-3.

<Structure Example of Switch Circuit>

Figure 3:
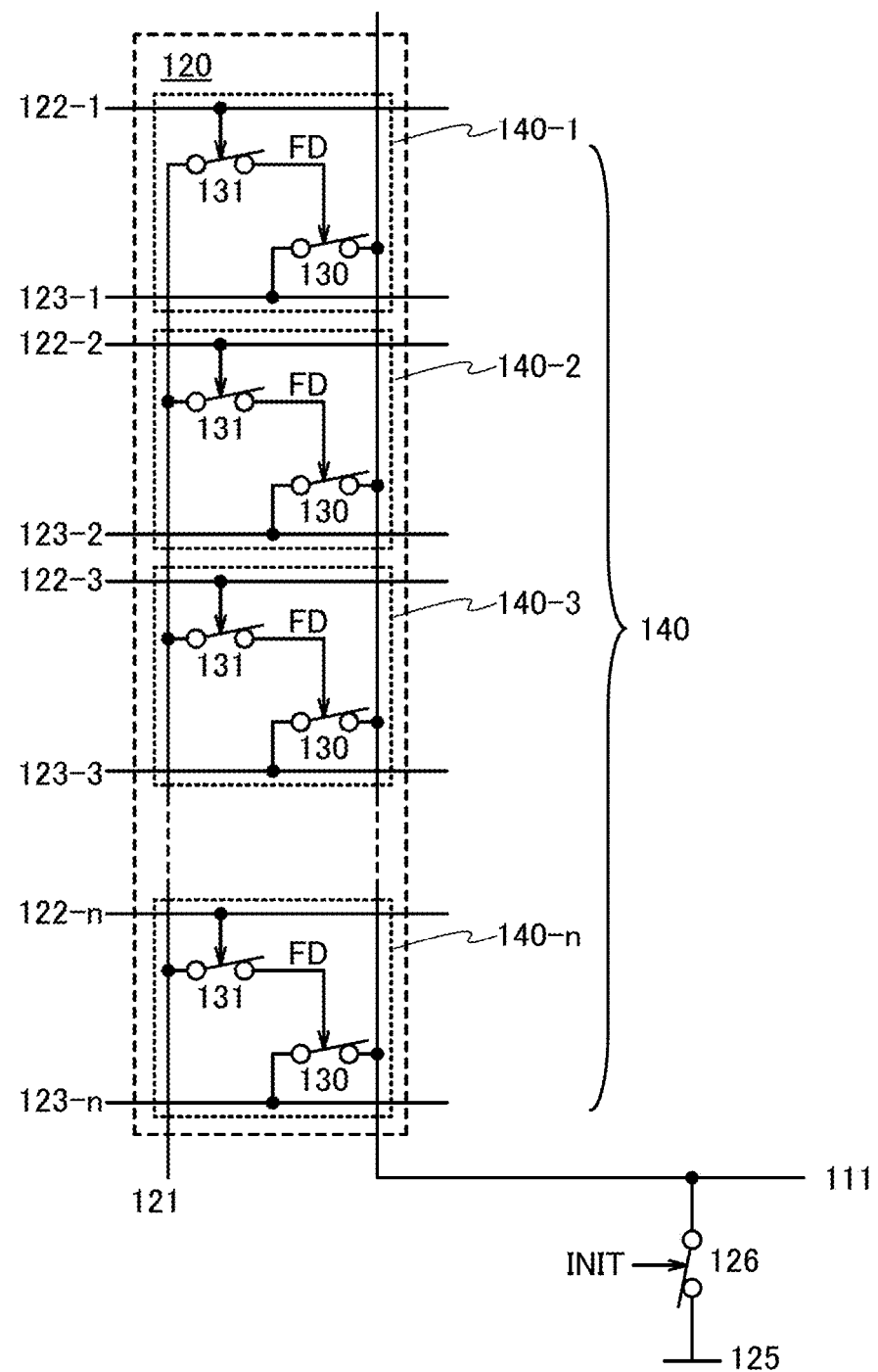
FIG. 3 illustrates a structure of a switch circuit.

Next, an example of the structure of the switch circuit 120 will be described. FIG. 3 illustrates an example of the structure of the switch circuit 120 in one embodiment of the present invention. The switch circuit 120 includes a plurality of groups each including at least a switch 131 and a switch 130. In FIG. 3, each group is shown as a cell 140. FIG. 3 illustrates an example where the switch circuit 120 includes a plurality of cells 140 denoted by cells 140-1 to 140-$n$ ($n$ is a natural number).

The switch 131 has a function of controlling supply of the potential of a signal including configuration data to a node FD in the cell 140. Specifically, when the switch 131 is conducting (on), the potential of a signal that includes configuration data and is applied to a wiring 121 is supplied to the node FD. When the switch 131 is not conducting (is off), the potential of the node FD is held.

The on/off state of the switch 131 is selected in accordance with the potential of a signal supplied to a wiring 122. FIG. 3 illustrates the case where the on/off state of the switch 131 in each of the cells 140-1 to 140-$n$ is selected in accordance with the potential of a signal supplied to a corresponding one of a plurality of wirings 122 denoted by wirings 122-1 to 122-$n$.

The switch 130 has a function of controlling electrical connection between a wiring 123 and the wiring 111 in accordance with the potential of the node FD. Specifically, when the switch 130 is on, the wiring 123 and the wiring 111 are electrically connected to each other. When the switch 130 is off, the wiring 123 and the wiring 111 are electrically separated from each other. FIG. 3 illustrates an example where in each of the cells 140-1 to 140-$n$, the switch 130 controls electrical connection between the wiring 111 and a corresponding one of a plurality of wirings 123 denoted by wirings 123-1 to 123-$n$.

Note that the wirings 123 are electrically connected to output terminals of LEs and IOs, and the wirings 111 are electrically connected to input terminals of the LEs and the IOs. Consequently, when the switch 130 is turned on in at least one of the cells 140-1 to 140-$n$ in accordance with configuration data, at least one of the plurality of wirings 123 (the wirings 123-1 to 123-$n$), that is, at least one of the output terminals of the LEs or the IOs is selected by the switch circuit 120, and the selected output terminal is electrically connected to the wiring 111, that is, the input terminal of the LE or the IO.

Note that an input terminal in this specification refers to a node of a wiring or the like supplied with an input signal, and the potential, voltage, current, or the like of an input signal is supplied to a circuit through the node. Thus, a wiring electrically connected to the input terminal can be regarded as part of the input terminal. Moreover, an output terminal in this specification refers to a node of a wiring or the like supplied with an output signal, and the potential, voltage, current, or the like of an output signal is output to a circuit through the node. Thus, a wiring electrically connected to the output terminal can be regarded as part of the output terminal.

The PLD 100 in one embodiment of the present invention also includes a switch 126 that controls electrical connection between the wiring 111 and a wiring 125 supplied with a predetermined potential. The switch 126 is turned on and off in accordance with a signal INIT. Specifically, the potential of the wiring 125 is applied to the wiring 111 when the switch 126 is on, whereas the potential of the wiring 125 is not applied to the wiring 111 when the switch 126 is off.

In one embodiment of the present invention, by turning on the switch 126, the potential of the wiring 111 can be initialized to be at a predetermined level. Note that the potentials of the wirings 111 and 123 are likely to become floating after the PLD 100 is powered off. After the PLD is powered off, configuration data is sometimes lost depending on the structure of a storage element included in a configuration memory. In this case, when the PLD is powered on, electrical continuity is established between the wiring 111 and the plurality of wirings 123 through the switch circuit 120, and a large amount of current sometimes flows through these wirings when the wiring 111 and the plurality of wirings 123 have different potentials. However, in one embodiment of the present invention, the potential of the wiring 111 can be initialized as described above, thereby preventing a large amount of current from flowing between the wiring 111 and the plurality of wirings 123. This can prevent breakage of the PLD.

The potential of the input terminal of the LE 101 sometimes becomes an intermediate potential between a high-level potential and a low-level potential immediately after the PLD 100 is powered on. If the intermediate potential is applied to the input terminal of the LE 101, a shoot-through current is likely to be generated in a CMOS circuit included in the LE 101. However, in one embodiment of the present invention, since the potential of the wiring 111 can be initialized as described above, the input terminal of the LE 101 can be prevented from having the intermediate potential immediately after power is turned on; thus, generation of the shoot-through current can be prevented.

In the PLD 100 of one embodiment of the present invention, after the PLD 100 is powered on and the potential of the wiring 111 is initialized, configuration data with which the switch 130 is turned off in all the cells 140 included in the switch circuit 120 may be written into a configuration memory. Accordingly, the wiring 111 and the plurality of wirings 123 can be electrically separated from each other; thus, when the wiring 111 and the plurality of wirings 123 have different potentials, a large amount of current can be prevented from flowing between the wiring 111 and the wirings 123 through the switch circuit 120. Consequently, breakage of the PLD 100 can be prevented.

In the case where the switch circuit 120 illustrated in FIG. 3 is used as the switch circuit 120-1 in FIG. 2, the plurality of wirings 104, 105, and 106 in FIG. 2 correspond to the wirings 123-1 to 123-$n$ in FIG. 3 and the wiring 111-1 in FIG. 2 corresponds to the wiring 111 in FIG. 3.

In the case where the switch circuit 120 illustrated in FIG. 3 is used as the switch circuit 120-2 in FIG. 2, the plurality of wirings 104, 105, and 106 in FIG. 2 correspond to the wirings 123-1 to 123-$n$ in FIG. 3 and the wiring 111-2 in FIG. 2 corresponds to the wiring 111 in FIG. 3.

In the case where the switch circuit 120 illustrated in FIG. 3 is used as the switch circuit 120-3 in FIG. 2, the plurality of wirings 104, 105, and 106 in FIG. 2 correspond to the wirings 123-1 to 123-$n$ in FIG. 3 and the wiring 111-3 in FIG. 2 corresponds to the wiring 111 in FIG. 3.

As described above, in one embodiment of the present invention, one of a plurality of wirings, such as the wirings 104, 105, and 106, which are electrically connected to the output terminal of the LE 101 is selected in accordance with configuration data, and the one selected wiring and one wiring, such as the wiring 111, which is electrically connected to the input terminal of the LE 101 are electrically connected by the switch circuit 120. Further, in one embodiment of the present invention, the switch circuit 110 including the switch circuit 120 with the above structure and the aforementioned various wirings whose electrical connections are controlled by the switch circuits 110 are provided between columns including the LEs 101, such as the first column 102-1, the second column 102-2, and the third column 102-3; thus, in the PLD 100 illustrated in FIG. 1A, electrical connection between one of the LEs 101 in the second column 102-2 and another one of the LEs 101 in the second column 102-2 can be controlled by one switch circuit 120. Electrical connection between one of the LEs 101 in the first column 102-1 and one of the LEs 101 in the second column 102-2 can be controlled by one switch circuit 120. Moreover, electrical connection between one of the LEs 101 in the second column 102-2 and one of the LEs 101 in the third column 102-3 can be controlled by one switch circuit 120. Accordingly, one embodiment of the present invention can achieve the PLD 100 that includes a small number of switch circuits in a routing resource while having high design flexibility.

<Specific Structure Example 1 of Switch Circuit>

Figure 4:
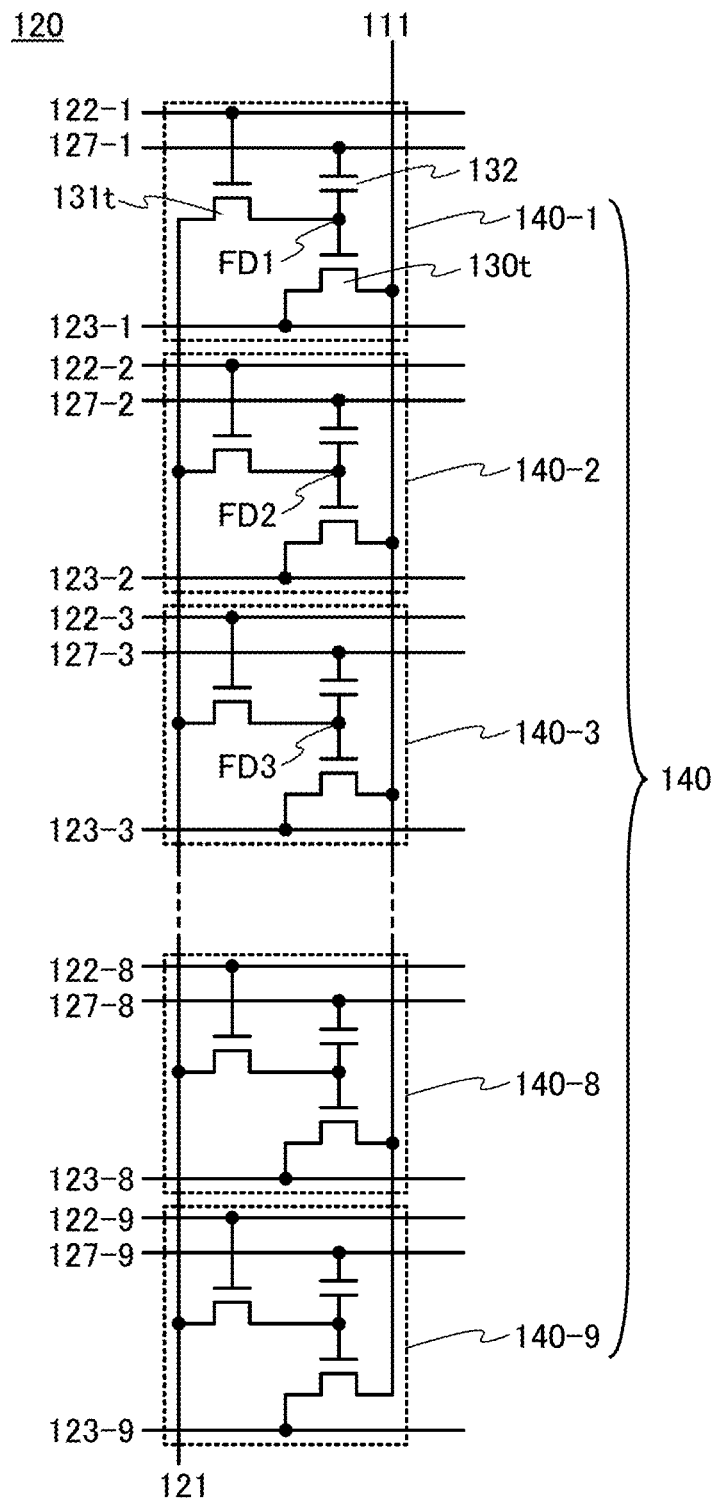
FIG. 4 illustrates a structure of a switch circuit.

Next, a specific structure example of the switch circuit 120 illustrated in FIG. 3 will be described. FIG. 4 illustrates an example of the structure of the switch circuit 120. The switch circuit 120 includes a plurality of groups each including a transistor 130$t$ that controls electrical connection between wirings or terminals and a transistor 131$t$ that has extremely small off-state current and supplies, holds, and discharges electric charge in an amount determined by configuration data at a gate of the transistor 130t.

In FIG. 4, each group is shown as the cell 140. The cells 140 corresponding to the total number of the plurality of wirings 104, 105, and 106 are provided in the switch circuit 120 illustrated in FIG. 4. Note that FIG. 2 illustrates the case where the total number of the plurality of wirings 104, 105, and 106 is nine; accordingly, to match the structure in FIG. 2, FIG. 4 illustrates an example where the switch circuit 120 includes nine cells 140 of cells 140-1 to 140-9 and nine wirings 123 (wirings 123-1 to 123-9) that correspond to the plurality of wirings 104, 105, and 106.

Each of the cells 140 includes a capacitor 132 connected to a gate of the transistor 130t, in addition to the transistor 130t and the transistor 131t. The capacitor 132 has a function of adding a change in the potential of a wiring 127 to the gate potential of the transistor 130t while keeping the gate of the transistor 130t floating, as well as a function of holding electric charge accumulated in the gate of the transistor 130t.

Specifically, one of a source and a drain of the transistor 130t is connected to the wiring 111 and the other thereof is connected to one wiring 123, which corresponds to one of the plurality of wirings 104, 105, and 106. One of a source and a drain of the transistor 131t is connected to the gate of the transistor 130t and the other thereof is connected to the wiring 121. A gate of the transistor 131t is connected to one of the plurality of wirings 122 (the wirings 122-1 to 122-9). One of a pair of electrodes of the capacitor 132 is connected to one of the plurality of wirings 127 (the wirings 127-1 to 127-9) and the other thereof is connected to the gate of the transistor 130t.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, for convenience, a connection relation of the transistor is sometimes described assuming that the source and the drain are fixed; actually, the names of the source and the drain interchange with each other depending on the relation of the potentials.

The cell 140 may further include another circuit element such as a transistor, a diode, a resistor, a capacitor, or an inductor as needed.

Next, an example of the operation of the switch circuit 120 illustrated in FIG. 4 will be described with reference to a timing chart in FIG. 5. Note that in the timing chart in FIG. 5, the transistor 130t and the transistor 131t are n-channel transistors.

First, first writing of configuration data from time T1 to time T6 is described. A ground potential GND is applied to the wirings 127 from the time T1 to the time T6.

From the time T1 to the time T2, a high-level potential VDD that is higher than the ground potential GND is applied to the wiring 122-1 among the plurality of wirings 122, and a low-level potential VSS that is lower than the ground potential GND is applied to the other wirings 122. The potential VSS is applied to the wiring 121. Thus, the potential VSS is applied to the gate (FD1) of the transistor 130t included in the cell 140-1. Consequently, configuration data corresponding to a digital value "0" is stored in the cell 140-1.

From the time T3 to the time T4, the high-level potential VDD is applied to the wiring 122-2 among the plurality of wirings 122, and the low-level potential VSS is applied to the other wirings 122. The high-level potential VDD is applied to the wiring 121. Thus, the potential VDD is applied to the gate (FD2) of the transistor 130t included in the cell 140-2. Consequently, configuration data corresponding to a digital value "1" is stored in the cell 140-2.

From the time T5 to the time T6, the high-level potential VDD is applied to the wiring 122-3 among the plurality of wirings 122, and the low-level potential VSS is applied to the other wirings 122. The potential VSS is applied to the wiring 121. Thus, the potential VSS is applied to the gate (FD3) of the transistor 130t included in the cell 140-3. Consequently, configuration data corresponding to a digital value "0" is stored in the cell 140-3.

Figure 5:
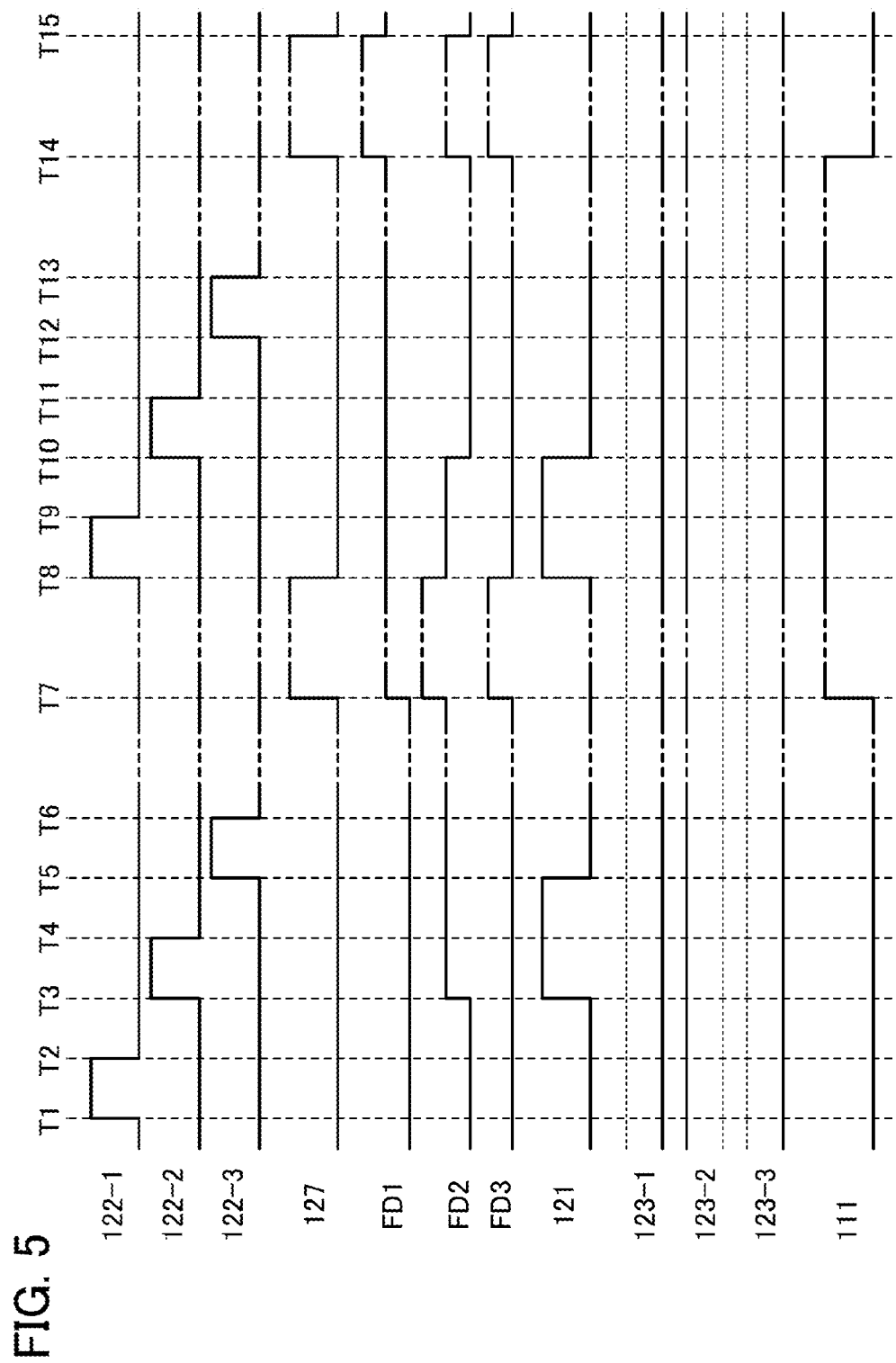
FIG. 5 is a timing chart.

Note that the timing chart in FIG. 5 only shows first writing of configuration data into the cells 140-1 to 140-3; first writing of configuration data into the cells 140-4 to 140-9 is performed in a similar manner. Note that among the cells 140-1 to 140-9, there is only one cell 140 in which configuration data corresponding to a digital value "1" is stored by the first writing.

Then, the description is made on first switching of logic circuits that is performed in accordance with the configuration data stored in the cells 140 by the first writing.

From time T7 to time T8, the high-level potential VDD is applied to the wirings 127. From the time T7 to the time T8, the transistor 130t in the cell 140-1 is off, the transistor 130t in the cell 140-2 is on, and the transistor 130t in the cell 140-3 is off. Thus, electrical continuity is established between the wiring 123-2 and the wiring 111, so that the potential of the wiring 123-2 is applied to the wiring 111. Specifically, the timing chart in FIG. 5 shows the case where the potential VDD is applied to the wiring 111.

Next, second writing of configuration data from the time T8 to time T13 is described. The ground potential GND is applied to the wirings 127 from the time T8 to the time T13.

From the time T8 to the time T9, the high-level potential VDD is applied to the wiring 122-1 among the plurality of wirings 122, and the low-level potential VSS is applied to the other wirings 122. The high-level potential VDD is applied to the wiring 121. Thus, the potential VDD is applied to the gate (FD1) of the transistor 130t included in the cell 140-1. Consequently, configuration data corresponding to a digital value "1" is stored in the cell 140-1.

From the time T10 to the time T11, the high-level potential VDD is applied to the wiring 122-2 among the plurality of wirings 122, and the low-level potential VSS is applied to the other wirings 122. The potential VSS is applied to the wiring 121. Thus, the potential VSS is applied to the gate (FD2) of the transistor 130t included in the cell 140-2. Consequently, configuration data corresponding to a digital value "0" is stored in the cell 140-2.

From the time T12 to the time T13, the high-level potential VDD is applied to the wiring 122-3 among the plurality of wirings 122, and the low-level potential VSS is applied to the other wirings 122. The potential VSS is applied to the wiring 121. Thus, the potential VSS is applied to the gate (FD3) of the transistor 130t included in the cell 140-3. Consequently, configuration data corresponding to a digital value "0" is stored in the cell 140-3.

Note that the timing chart in FIG. 5 only shows second writing of configuration data into the cells 140-1 to 140-3; second writing of configuration data into the cells 140-4 to 140-9 is performed in a similar manner. Note that among the cells 140-1 to 140-9, there is only one cell 140 in which configuration data corresponding to a digital value "1" is stored by the second writing.

Then, the description is made on second switching of logic circuits that is performed in accordance with the configuration data stored in the cells 140 by the second writing.

From time T14 to time T15, the high-level potential VDD is applied to the wiring 127. From the time T14 to the time T15, the transistor 130t in the cell 140-1 is on, the transistor 130t in the cell 140-2 is off, and the transistor 130t in the cell 140-3 is off. Thus, electrical continuity is established between the wiring 123-1 and the wiring 111, so that the potential of the wiring 123-1 is applied to the wiring 111. Specifically, the timing chart in FIG. 5 shows the case where the ground potential GND is applied to the wiring 111.

Note that in writing of configuration data, the potentials of the wirings 123-1 to 123-9 and the potential of the wiring 111 are preferably kept the same, in which case, even if the transistor 130t is turned on during writing of configuration data, an excessive amount of current can be prevented from flowing between the wiring 111 and any of the wirings 123-1 to 123-9 through the transistor 130t.

The potential of the wiring 111 is preferably kept at a predetermined level by a latch circuit or the like, in which case the potential of the wiring 111 can be prevented from being floating and an excessive amount of current can be prevented from being generated in an LE having an input terminal supplied with the potential of the wiring 111.

As described above, one of the plurality of cells 140 included in the switch circuit 120 is conducting in accordance with configuration data, whereby connection between the wiring 111 and one of the plurality of wirings 123 is determined in the switch circuit 120.

In one embodiment of the present invention, the above structure allows electrical connection between one of the LEs 101 in the second column 102-2 and another one of the LEs 101 in the second column 102-2 to be controlled by one switch circuit 120 in the PLD 100 illustrated in FIG. 1A. Electrical connection between one of the LEs 101 in the first column 102-1 and one of the LEs 101 in the second column 102-2 can be controlled by one switch circuit 120. Moreover, electrical connection between one of the LEs 101 in the second column 102-2 and one of the LEs 101 in the third column 102-3 can be controlled by one switch circuit 120. Accordingly, one embodiment of the present invention can achieve the PLD 100 that includes a small number of switch circuits in a routing resource while having high design flexibility.

In the transistor 131t with extremely small off-state current, a channel formation region is formed in a film of a semiconductor having a wider band gap and lower intrinsic carrier density than silicon. Examples of such a semiconductor are an oxide semiconductor, silicon carbide, and gallium nitride that have a band gap more than twice as wide as that of silicon. A transistor including the semiconductor can have much smaller off-state current than a transistor including a normal semiconductor such as silicon or germanium. Consequently, the use of the transistor 131t having the above structure can prevent leakage of electric charge held at the gate of the transistor 130t for controlling electrical connection between wirings or terminals.

In the switch circuit 120 having the above structure, the on/off state of the transistor 130t for controlling electrical connection between wirings or terminals is determined in accordance with configuration data and is held by the transistor 131t with extremely small off-state current. Thus, in one embodiment of the present invention, the switch circuit 110 serves as both a configuration memory and a memory element, and the number of elements in each cell 140 is smaller than that of an SRAM. Consequently, the area of a storage device for storing configuration data can be smaller than that in the case of a PLD having a conventional structure in which both a configuration memory and a memory element are provided.

Since the off-state current of the transistor 131t is smaller than that of a transistor having a channel formation region in a silicon film, the data retention time of the switch circuit 110 can be longer than that of a DRAM. Thus, data rewriting can be performed less frequently, and power consumption can be reduced as a result.

<Specific Structure Example 2 of Switch Circuit>

Figure 6:
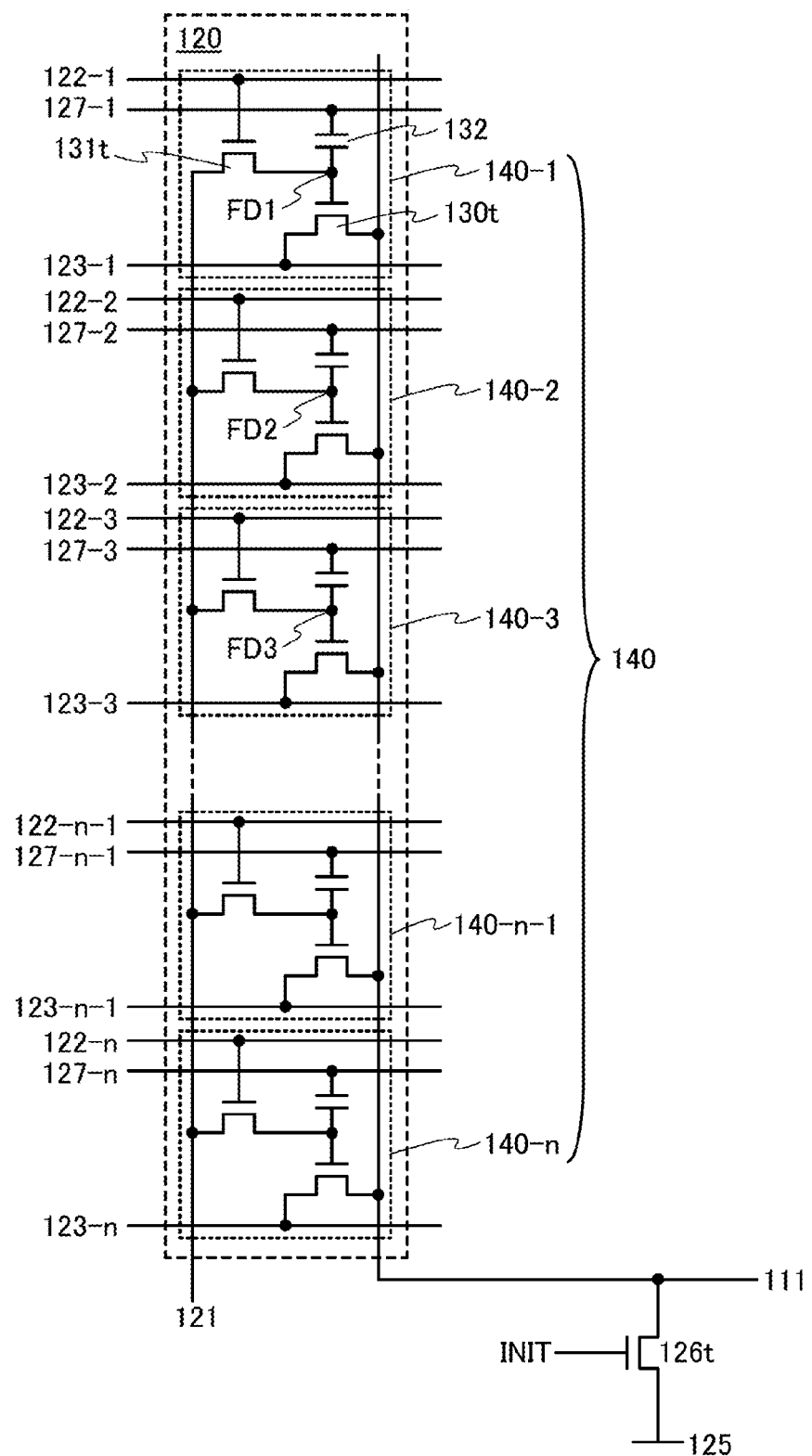
FIG. 6 illustrates a structure of a switch circuit.

Next, another specific example of the structure of the switch circuit 120 illustrated in FIG. 3 will be described. The switch circuit 120 illustrated in FIG. 6 includes a plurality of cells 140 each including the transistor 131t functioning as the switch 131, the transistor 130t functioning as the switch 130, and the capacitor 132 electrically connected to the gate of the transistor 130t. FIG. 6 specifically illustrates an example where the switch circuit 120 includes n cells 140 of the cells 140-1 to 140-n.

Specifically, the gate of the transistor 131t is electrically connected to the wiring 122. One of the source and the drain of the transistor 131t is electrically connected to the wiring 121, and the other thereof is electrically connected to the gate of the transistor 130t. One of the source and the drain of the transistor 130t is electrically connected to the wiring 123, and the other thereof is electrically connected to the wiring 111.

One of the pair of electrodes of the capacitor 132 is electrically connected to the gate of the transistor 130t, and the other thereof is electrically connected to one of the plurality of wirings 127 of the wirings 127-1 to 127n. The capacitor 132 has a function of adding a change in the potential of the wiring 127 to the potential of the node FD while keeping the node FD floating, in addition to a function of holding electric charge accumulated in the node FD.

The cell 140 may further include another circuit element such as a transistor, a diode, a resistor, a capacitor, or an inductor as needed.

<Example of Operation of Switch Circuit>

Next, an example of the operation of the switch circuit 120 illustrated in FIG. 6 will be described with reference to a timing chart in FIG. 7. Note that in the timing chart in FIG. 7, the transistor 130t and the transistor 131t are n-channel transistors. Note also that the wiring 125 is supplied with the low-level potential VSS, which is lower than the ground potential GND.

First, the description is made on initialization of the potential of the wiring 111 and initialization of the potential of the node FD that are performed from time T1 to time T8 after the PLD is powered on.

A time before the time T1 is immediately after the PLD is powered on, and it is therefore assumed that the potentials of the plurality of wirings 123 and the wiring 111 are floating, and that the potential of the node FD in each of the cells 140 is floating. In FIG. 7, a period during which a potential is floating is indicated by shaded lines.

From the time T1 to the time T8, the potential of the signal INIT that is input to a gate of a transistor 126t becomes high, and the transistor 126t is turned on. Thus, the potential VSS is applied to the wiring 111 through the transistor 126t. Note that when the potential of the signal INIT is set high at the same time as power on of the PLD, a period during which the potential of the wiring 111 is floating can be further shortened. In one embodiment of the present invention, the potential of the wiring 111 can be initialized by application of the potential VSS to the wiring 111, so that an input terminal of an LE is not floating and shoot-through current can be prevented in a CMOS circuit included in the LE. Thus, breakage of the PLD can be prevented. In addition, by application of the ground potential GND to the wiring 127 from the time T1 to the time T8, electrical continuity between the wiring 123 and the wiring 111 can be prevented, and a large amount of current can be prevented from flowing between the wiring 123 and the wiring 111 even when the wiring 123 and the wiring 111 have different potentials.

From the time T1 to the time T8, the potentials of the nodes FD in all the cells 140 are initialized while the potential VSS is applied to the wiring 111. Specifically, in FIG. 7, first, from the time T2 to the time T3, the high-level potential VDD, which is higher than the ground potential GND, is applied to the wiring 122-1 among the plurality of wirings 122, and the potential VSS is applied to the other wirings 122. The potential VSS is also applied to the wiring 121. Thus, in the cell 140-1, the potential VSS is applied to the node FD1, so that the transistor 130t is turned off.

Then, from the time T4 to the time T5, the high-level potential VDD, which is higher than the ground potential GND, is applied to the wiring 122-2 among the plurality of wirings 122, and the potential VSS is applied to the other wirings 122. The potential VSS is also applied to the wiring 121. Thus, in the cell 140-2, the potential VSS is applied to the node FD2, so that the transistor 130t is turned off.

Subsequently, from the time T6 to the time T7, the high-level potential VDD, which is higher than the ground potential GND, is applied to the wiring 122-3 among the plurality of wirings 122, and the potential VSS is applied to the other wirings 122. The potential VSS is also applied to the wiring 121. Thus, in the cell 140-3, the potential VSS is applied to the node FD3, so that the transistor 130t is turned off.

Figure 7:
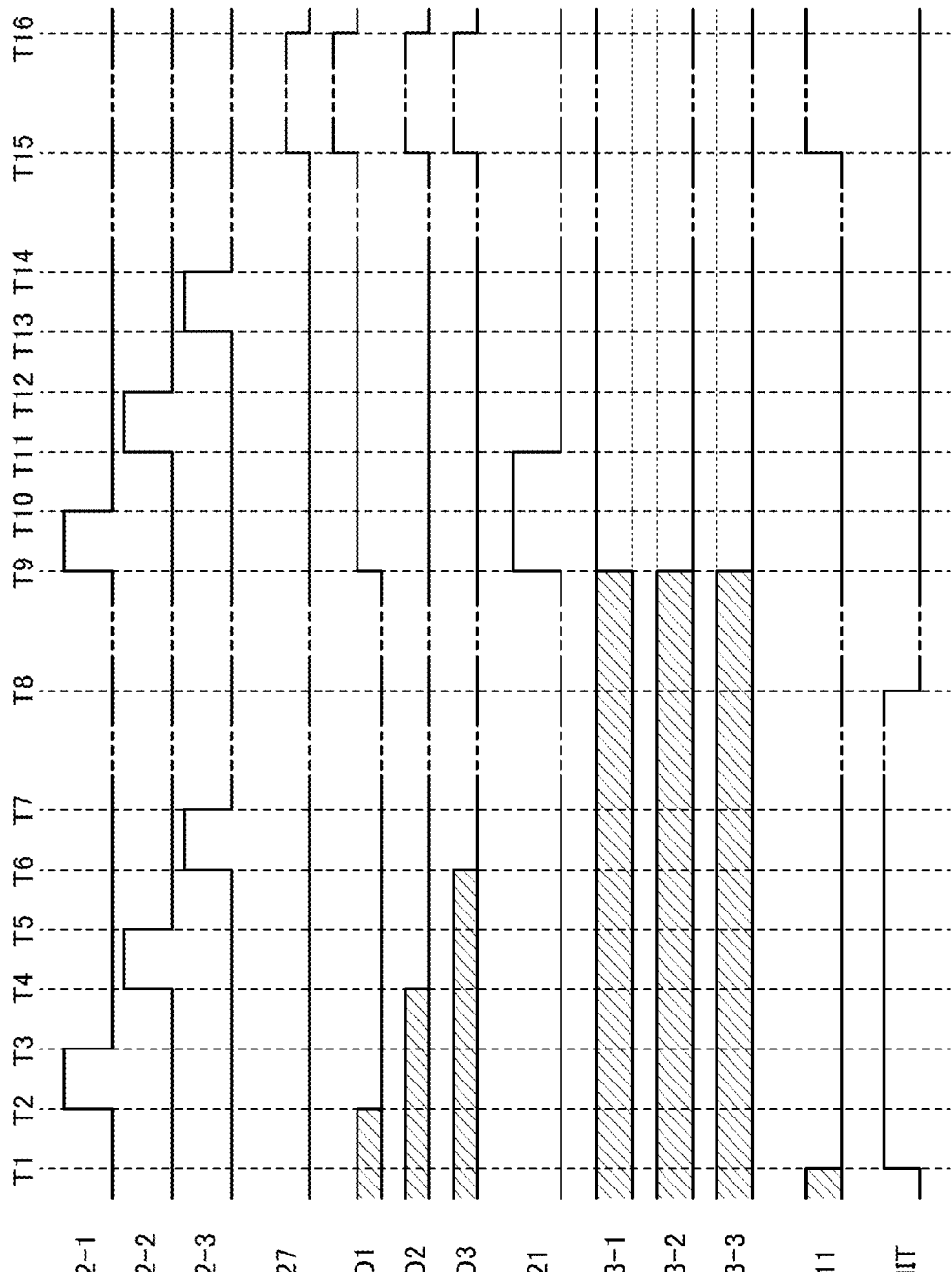
FIG. 7 is a timing chart.

Note that the timing chart in FIG. 7 only shows initialization of the potentials of the nodes FD in the cells 140-1 to 140-3; the potentials of the nodes FD in the cells 140-4 to 140-n are initialized in a similar manner. With a series of operations, the potential of the node FD is initialized and the transistor 130t is turned off in all the cells 140.

Then, at the time T8, the potential of the signal INIT becomes low, and the transistor 126t is turned off.

Next, writing of configuration data from time T9 to time T15 is described. From the time T9 to the time T15, it is assumed that the ground potential GND is applied to the wiring 127. From the time T9 to the time T15, the potential of the signal INIT remains low and the transistor 126t remains off.

First, from the time T9 to the time T10, the high-level potential VDD is applied to the wiring 122-1 among the plurality of wirings 122, and the low-level potential VSS is applied to the other wirings 122. The high-level potential VDD is applied to the wiring 121. Thus, the potential VDD is applied to the node FD1 in the cell 140-1. In other words, the cell 140-1 stores configuration data corresponding to a digital value "1".

Next, from the time T11 to the time T12, the high-level potential VDD is applied to the wiring 122-2 among the plurality of wirings 122, and the low-level potential VSS is applied to the other wirings 122. The low-level potential VSS is applied to the wiring 121. Thus, the potential VSS is applied to the node FD2 in the cell 140-2. In other words, the cell 140-2 stores configuration data corresponding to a digital value "0".

Subsequently, from the time T13 to the time T14, the high-level potential VDD is applied to the wiring 122-3 among the plurality of wirings 122, and the low-level potential VSS is applied to the other wirings 122. The low-level potential VSS is applied to the wiring 121. Thus, the potential VSS is applied to the node FD3 in the cell 140-3. In other words, the cell 140-3 stores configuration data corresponding to a digital value "0".

Note that the timing chart in FIG. 7 only shows writing of configuration data into the cells 140-1 to 140-3; writing of configuration data into the cells 140-4 to 140-n is performed in a similar manner. Note that among the cells 140-1 to 140-n, there is only one cell 140 in which configuration data corresponding to a digital value "1" is stored by the writing.

Then, the description is made on switching of logic circuits that is performed in accordance with the configuration data stored in the cells 140 by the writing.

From the time T15 to time T16, when the high-level potential VDD is applied to the wiring 127, a difference between the ground potential GND and the potential VDD is added to the node FD in each cell 140. Thus, in a period from the time T9 to the time T15, the potential of the node FD becomes sufficiently high and the transistor 130t is turned on only in the cell 140 that stores configuration data corresponding to a digital value "1". Specifically, in the timing chart in FIG. 7, configuration data corresponding to a digital value "1" is stored in the cell 140-1 from the time T9 to the time T15, so that the transistor 130t that controls electrical connection between the wiring 123-1 and the wiring 111 is turned on, and the potential of the wiring 123-1 is applied to the wiring 111 through the transistor 130t.

As described above, one of the plurality of cells 140 included in the switch circuit 120 is conducting in accordance with configuration data, whereby connection between the wiring 111 and one of the plurality of wirings 123 is determined in the switch circuit 120.

Although FIG. 7 shows the case where the potentials of the nodes FD are initialized sequentially in the cells 140 one by one, the potentials of the nodes FD in all the cells 140 may be concurrently initialized.

<Specific Structure Example 3 of Switch Circuit>

Next, a specific structure example of the switch circuit 120 illustrated in FIG. 3, which is different from that in FIG. 4, will be described.

Figure 8:
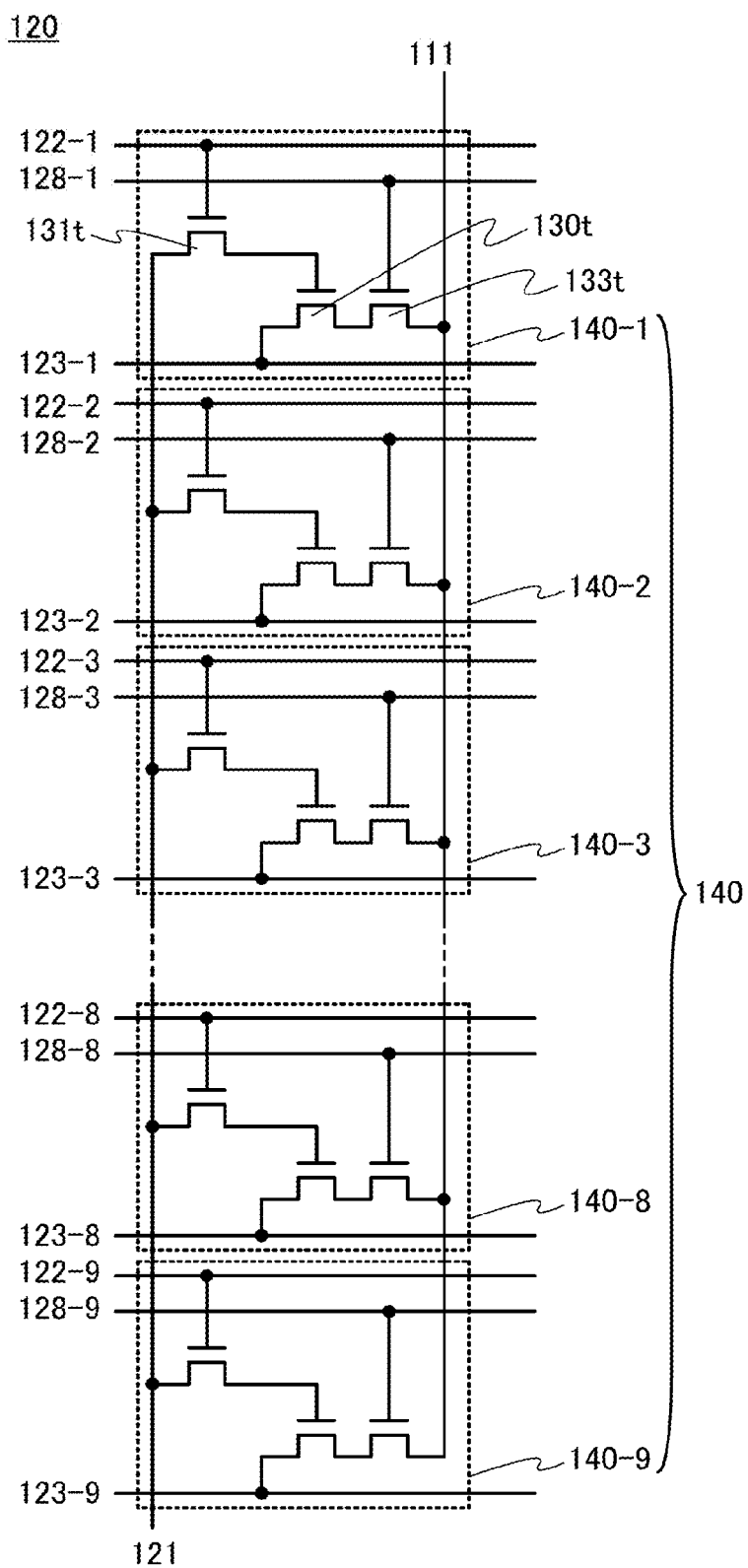
FIG. 8 illustrates a structure of a switch circuit.

FIG. 8 illustrates an example of the structure of the switch circuit 120. The switch circuit 120 includes a plurality of groups each including the transistor 130t that controls electrical connection between wirings or terminals, the transistor 131t that has extremely small off-state current and supplies, holds, and discharges electric charge in an amount determined by configuration data at the gate of the transistor 130t, and a transistor 133t that is connected in series with the transistor 130t.

Note that in this specification, a state in which transistors are connected in series with each other means, for example, a state in which only one of a source and a drain of a first transistor is connected to only one of a source and a drain of a second transistor. In addition, a state in which transistors are connected in parallel with each other means a state in which one of a source and a drain of a first transistor is connected to one of a source and a drain of a second transistor and the other of the source and the drain of the first transistor is connected to the other of the source and the drain of the second transistor.

In FIG. 8, each group is shown as the cell 140. The cells 140 corresponding to the total number of the plurality of wirings 104, 105, and 106 are provided in the switch circuit 120 illustrated in FIG. 8. Note that FIG. 2 illustrates the case where the total number of the plurality of wirings 104, 105, and 106 is nine; accordingly, to match the structure in FIG. 2, FIG. 8 illustrates an example where the switch circuit 120 includes nine cells 140 of cells 140-1 to 140-9 and nine wirings 123 that correspond to the plurality of wirings 104, 105, and 106.

Specifically, one of a source and a drain of the transistor 133t is connected to the wiring 111 and the other thereof is connected to one of the source and the drain of the transistor 130t. The other of the source and the drain of the transistor 130t is connected to one of the plurality of wirings 123 (the wirings 123-1 to 123-9). One of the source and the drain of the transistor 131t is connected to the gate of the transistor 130t and the other thereof is connected to the wiring 121. The gate of the transistor 131t is connected to one of the plurality of wirings 122 (the wirings 122-1 to 122-9). A gate of the transistor 133t is connected to one of the plurality of wirings 128 (the wirings 128-1 to 128-9).

The cell 140 may further include another circuit element such as a transistor, a diode, a resistor, a capacitor, or an inductor as needed.

The timing chart in FIG. 5 can be referred to for the operation of the switch circuit 120 illustrated in FIG. 8. Note that the timing chart in FIG. 5 shows the case where the transistors 130t, 131t, and 133t are n-channel transistors.

<Specific Structure Example 4 of Switch Circuit>

Figure 9:
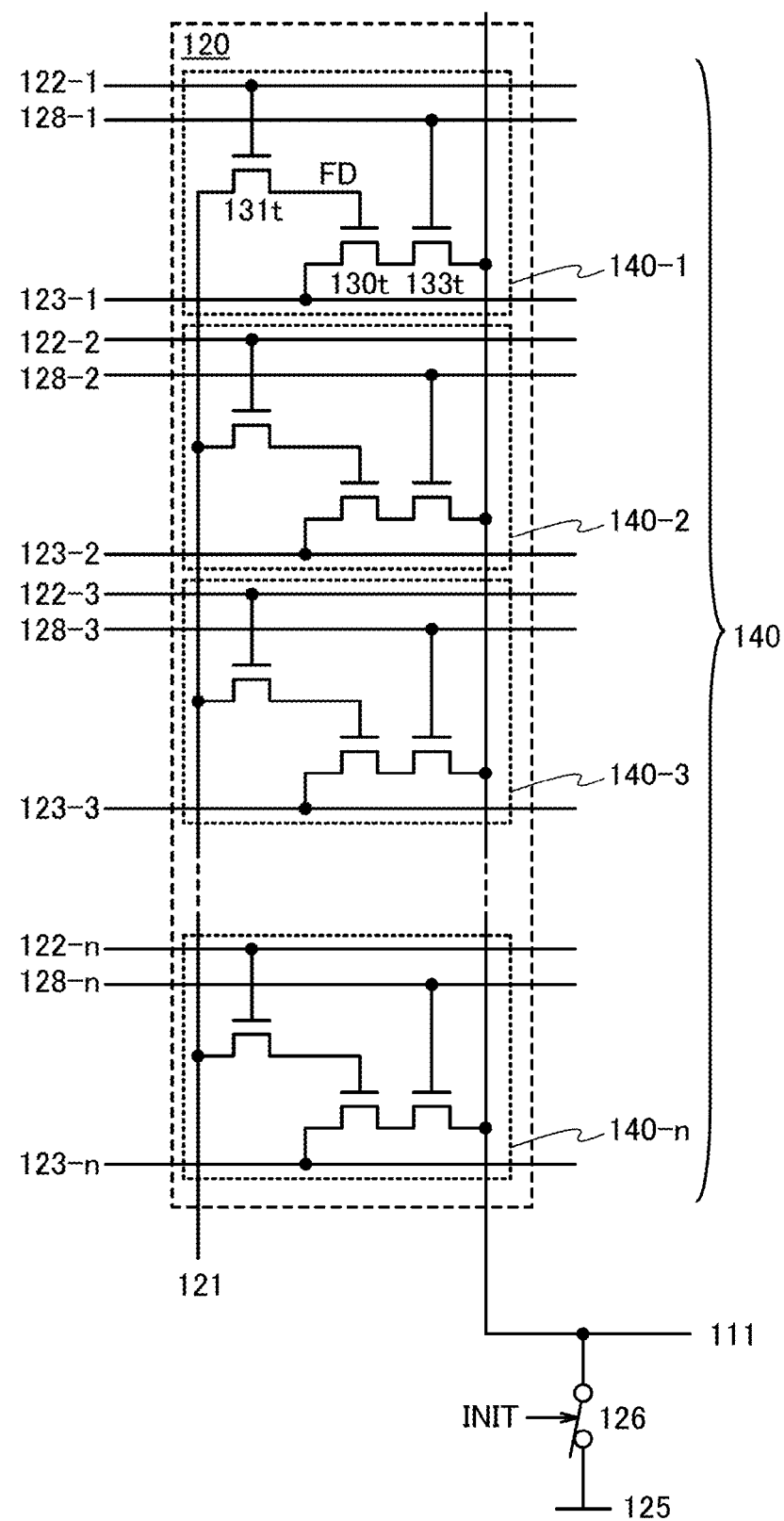
FIG. 9 illustrates a structure of a switch circuit.

Next, an example of the structure of the switch circuit 120 illustrated in FIG. 3, which is different from that in FIG. 6, will be described. The switch circuit 120 illustrated in FIG. 9 includes a plurality of cells 140 each including the transistor 131t, the transistor 130t, and the transistor 133t. FIG. 9 specifically illustrates an example where the switch circuit 120 includes n cells 140 of the cells 140-1 to 140-n.

The transistor 131t has a function of controlling supply of the potential of a signal including configuration data to the node FD. The on/off state of the transistor 130t is selected depending on the potential of the node FD. The on/off state of the transistor 133t is selected depending on the potential of the wiring 128. The transistors 130t and 133t are connected in series with each other and both of them have a function of controlling electrical connection between the wiring 123 and the wiring 111.

Specifically, the gate of the transistor 131t is electrically connected to the wiring 122. One of the source and the drain of the transistor 131t is electrically connected to the wiring 121, and the other thereof is electrically connected to the gate of the transistor 130t. One of the source and the drain of the transistor 130t is electrically connected to the wiring 123, and the other thereof is electrically connected to one of the source and the drain of the transistor 133t. The other of the source and the drain of the transistor 133t is electrically connected to the wiring 111. The gate of the transistor 133t is electrically connected to the wiring 128.

The cell 140 may further include another circuit element such as a transistor, a diode, a resistor, a capacitor, or an inductor as needed.

<Specific Structure Example 5 of Switch Circuit>

Next, another specific example of the structure of the switch circuit 120, which is different from that in FIG. 4, will be described using the structure of the switch circuit 120 in FIG. 2 as an example.

Figure 10:
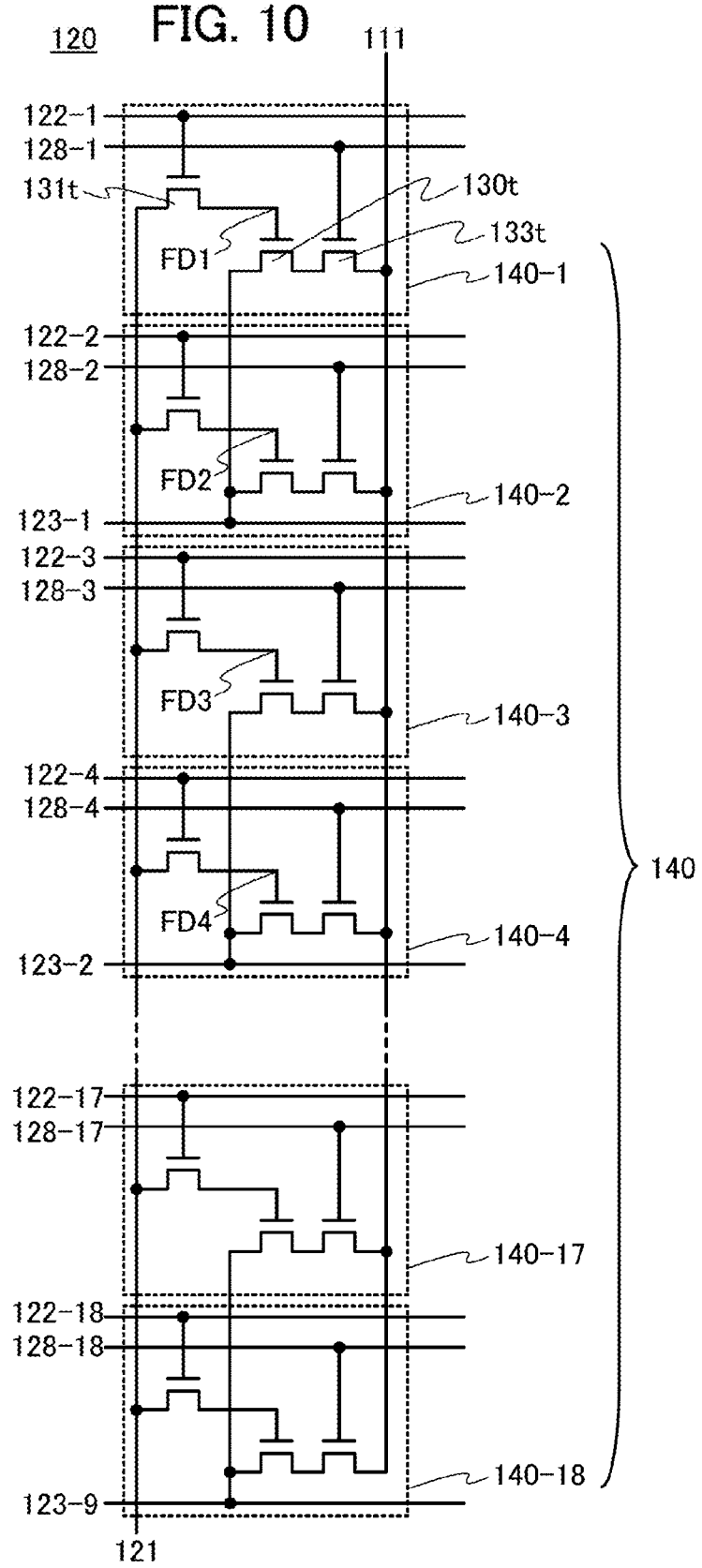
FIG. 10 illustrates a structure of a switch circuit.

FIG. 10 illustrates an example of the structure of the switch circuit 120. Like the switch circuit 120 illustrated in FIG. 8, the switch circuit 120 illustrated in FIG. 10 includes a plurality of groups each including the transistor 130t that controls electrical connection between wirings or terminals, the transistor 131t that has extremely small off-state current and supplies, holds, and discharges electric charge in an amount determined by configuration data at the gate of the transistor 130t, and the transistor 133t that is connected in series with the transistor 130t. Note that FIG. 10 illustrates an example where two groups are provided for each of the plurality of wirings 104, 105, and 106.

In FIG. 10, each group is shown as the cell 140. In the switch circuit 120 illustrated in FIG. 10, two cells 140 are provided for one of the plurality of wirings 104, 105, and 106. Note that FIG. 2 illustrates the case where the total number of the plurality of wirings 104, 105, and 106 is nine; accordingly, to match the structure in FIG. 2, FIG. 10 illustrates an example where the switch circuit 120 includes 18 cells 140 of cells 140-1 to 140-18 and 9 wirings 123 that correspond to the plurality of wirings 104, 105, and 106.

Note that the number of cells 140 corresponding to each of the plurality of wirings 104, 105, and 106 is not limited to two; three or more cells 140 may correspond to each of the plurality of wirings 104, 105, and 106.

Specifically, in FIG. 10, two of the plurality of cells 140 are connected to one of the plurality of wirings 123. For example, both the other of the source and the drain of the transistor 130t in the cell 140-1 and the other of the source and the drain of the transistor 130t in the cell 140-2 are connected to the wiring 123-1.

The cell 140 may further include another circuit element such as a transistor, a diode, a resistor, a capacitor, or an inductor as needed.

Note that FIG. 8 and FIG. 10 show the case where the transistor 133t is connected between one of the source and the drain of the transistor 130t and the wiring 111. The transistor 133t may be connected between the other of the source and the drain of the transistor 130t and one of the plurality of wirings 123.

Next, an example of the operation of the switch circuit 120 illustrated in FIG. 10 will be described with reference to a timing chart in FIG. 11. Note that in the timing chart in FIG. 11, the transistors 130t, 131t, and 133t are n-channel transistors.

First, writing of configuration data from time T1 to time T8 is described. From the time T1 to the time T8, the ground potential GND is applied to the plurality of wirings 128, and the transistors 133t in all the cells 140 are off.

From the time T1 to the time T2, the high-level potential VDD is applied to the wiring 122-1 among the plurality of wirings 122, and the low-level potential VSS is applied to the other wirings 122. The potential VDD is applied to the wiring 121. Thus, the potential VDD is applied to the gate (FD1) of the transistor 130t included in the cell 140-1. Consequently, first configuration data corresponding to a digital value "1" is stored in the cell 140-1.

From the time T3 to the time T4, the high-level potential VDD is applied to the wiring 122-2 among the plurality of wirings 122, and the low-level potential VSS is applied to the other wirings 122. The potential VSS is applied to the wiring 121. Thus, the potential VSS is applied to the gate (FD2) of the transistor 130t included in the cell 140-2. Consequently, second configuration data corresponding to a digital value "0" is stored in the cell 140-2.

From the time T5 to the time T6, the high-level potential VDD is applied to the wiring 122-3 among the plurality of wirings 122, and the low-level potential VSS is applied to the other wirings 122. The potential VSS is applied to the wiring 121. Thus, the potential VSS is applied to the gate (FD3) of the transistor 130t included in the cell 140-3. Consequently, first configuration data corresponding to a digital value "0" is stored in the cell 140-3.

From the time T7 to the time T8, the high-level potential VDD is applied to the wiring 122-4 among the plurality of wirings 122, and the low-level potential VSS is applied to the other wirings 122. The potential VDD is applied to the wiring 121. Thus, the potential VDD is applied to the gate (FD4) of the transistor 130t included in the cell 140-4. Consequently, second configuration data corresponding to a digital value "1" is stored in the cell 140-4.

Figure 11:
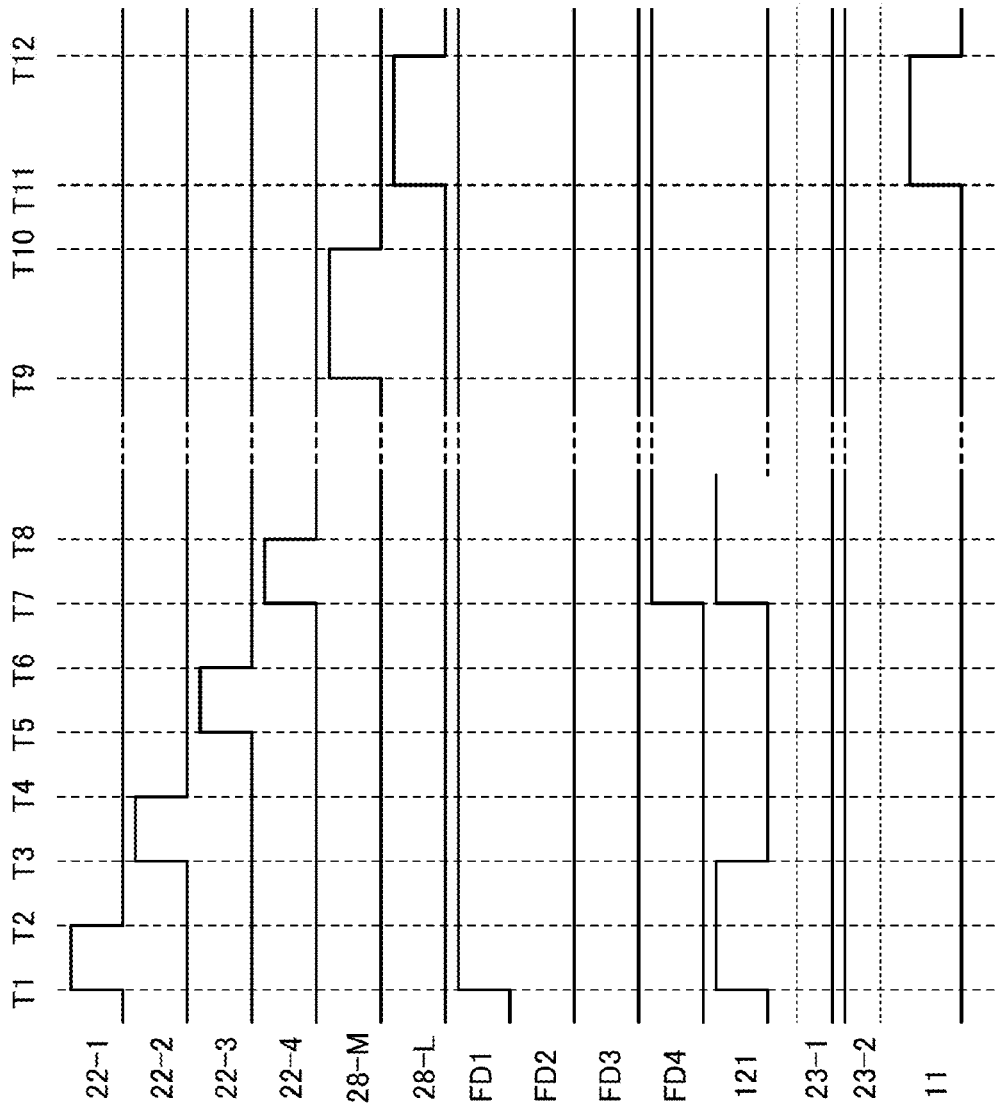
FIG. 11 is a timing chart.

Note that the timing chart in FIG. 11 only shows writing of first configuration data or second configuration data into the cells 140-1 to 140-4; first configuration data or second configuration data is written into the cells 140-5 to 140-18 in a similar manner. Note that among a plurality of cells 140 denoted by cells 140-M (M is a natural number and an odd number less than 18), there is only one cell 140 in which configuration data corresponding to a digital value "1" is stored by writing of first configuration data. Further, among a plurality of cells 140 denoted by cells 140-L (L is a natural number and an even number of 18 or less), there is only one cell 140 in which configuration data corresponding to a digital value "1" is stored by writing of second configuration data.

Then, the description is made on first switching of logic circuits that is performed in accordance with the first configuration data.

From time T9 to time T10, the high-level potential VDD is applied to a plurality of wirings 128 denoted by wirings 128-M. The ground potential GND is continuously applied to a plurality of wirings 128 denoted by wirings 128-L. From the time T9 to the time T10, among the plurality of cells 140-M, the cell 140-1 is conducting and the other cells 140 are not conducting. Thus, electrical continuity is established between the wiring 123-1 and the wiring 111, so that the potential of the wiring 123-1 is applied to the wiring 111. Specifically, the timing chart in FIG. 11 shows the case where the ground potential GND is applied to the wiring 111.

Next, the description is made on second switching of logic circuits that is performed in accordance with the second configuration data.

From time T11 to time T12, the high-level potential VDD is applied to the plurality of wirings 128-L. The ground potential GND is applied to the plurality of wirings 128-M. From the time T11 to the time T12, among the plurality of cells 140-L, the cell 140-4 is conducting and the other cells 140 are not conducting. Thus, electrical continuity is established between the wiring 123-2 and the wiring 111, so that the potential of the wiring 123-2 is applied to the wiring 111. Specifically, the timing chart in FIG. 11 shows the case where the potential VDD is applied to the wiring 111.

Note that in writing of first configuration data or second configuration data, the potentials of the wirings 123-1 to 123-18 and the potential of the wiring 111 are preferably kept the same, in which case, even if the transistor 130t is turned on during writing of first configuration data or second configuration data, an excessive amount of current can be prevented from flowing between the wiring 111 and any of the wirings 123-1 to 123-18 through the transistor 130t.

The potential of the wiring 111 is preferably kept at a predetermined level by a latch circuit or the like, in which case the potential of the wiring 111 can be prevented from being floating and an excessive amount of current can be prevented from being generated in an LE having an input terminal supplied with the potential of the wiring 111.

Note that in the switch circuit 120 illustrated in FIG. 10, plural pieces of configuration data are stored, and configuration data used for configuration can be freely selected. Accordingly, one piece of configuration data can be rewritten while a PLD in which a logic circuit is configured in accordance with another piece of configuration data operates.

<Specific Structure Example 6 of Switch Circuit>

Next, another example of the structure of the switch circuit 120 illustrated in FIG. 3, which is different from that in FIG. 6, will be described. Like the switch circuit 120 illustrated in FIG. 9, the switch circuit 120 illustrated in FIG. 12 includes a plurality of cells 140 each including the transistor 131t, the transistor 130t, and the transistor 133t. Note that FIG. 12 illustrates an example of the switch circuit 120 in which each of the plurality of wirings 123 is shared by two cells 140.

Figure 12:
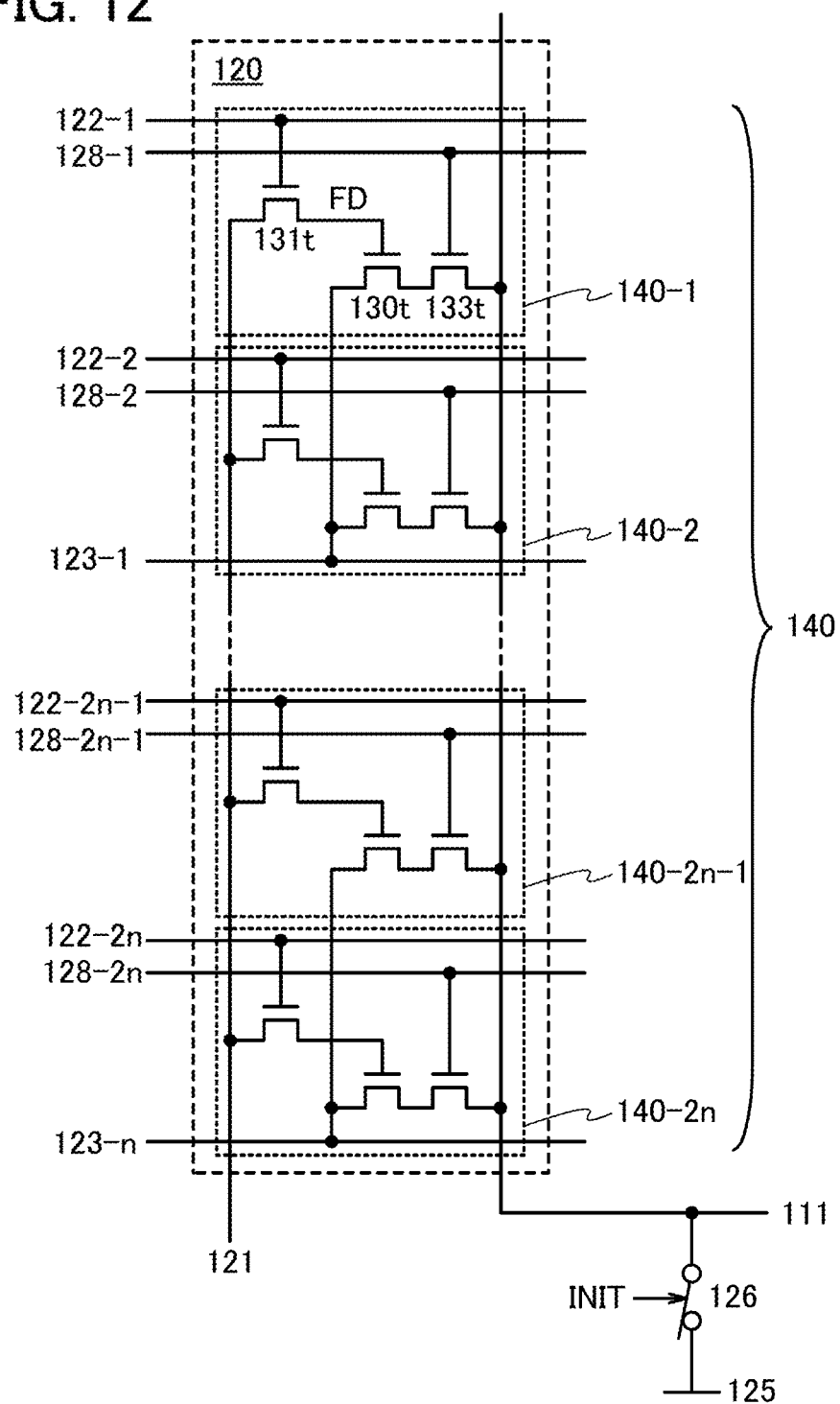
FIG. 12 illustrates a structure of a switch circuit.

FIG. 12 specifically illustrates an example where the switch circuit 120 includes 2n cells 140 of cells 140-1 to 140-2n. One wiring 123 among the wirings 123-1 to 123-n is shared by the cell 140i and the cell 140-i+1 (i is a natural number of 2n-1 or less) among the 2n cells 140.

Note that the number of cells 140 that share each of the plurality of wirings 123 is not limited to two; three or more cells 140 may share each of the plurality of wirings 123.

FIG. 12 specifically illustrates the case where one of the source and the drain of the transistor 130t in the cell 140-1 and one of the source and the drain of the transistor 130t in the cell 140-2 are electrically connected to the wiring 123-1.

The cell 140 may further include another circuit element such as a transistor, a diode, a resistor, a capacitor, or an inductor as needed.

Note that FIG. 9 and FIG. 12 show the case where the transistor 133t is electrically connected between the other of the source and the drain of the transistor 130t and the wiring 111. The transistor 133t may be electrically connected between one of the source and the drain of the transistor 130t and the wiring 123.

In the switch circuit 120 illustrated in FIG. 12, plural pieces of configuration data for a plurality of circuit structures can be stored in a plurality of cells 140 electrically connected to one wiring 123. Logic circuits can be switched in accordance with configuration data in such a manner that the transistor 133t in the cell 140 that stores configuration data corresponding to one circuit structure is turned on and the transistors 133t in the cells 140 that store configuration data corresponding to other circuit structures are turned off.

Thus, in the switch circuit 120 illustrated in FIG. 12, plural pieces of configuration data are stored, and configuration data used for configuration can be freely selected. Accordingly, one piece of configuration data can be rewritten while a PLD in which a logic circuit is configured in accordance with another piece of configuration data operates.

In Patent Document 1 mentioned above, configuration data needs to be read from a DRAM to switch configuration data in a multi-context system, and a sense amplifier is required to read the configuration data. In one embodiment of the present invention illustrated in FIG. 10 or FIG. 12, it is not necessary to read configuration data from a DRAM in order to switch configuration data in a multi-context system; therefore, it is not necessary to use a sense amplifier. Consequently, a time for switching configuration data can be shortened, and as a result, a logic circuit in a programmable logic device can be reconfigured at high speed.

Note that the transistor 131t is preferably a transistor with extremely small off-state current because it has a function of holding the potential of the node FD in the switch circuit 120. A transistor in which a channel formation region is formed in a film of a semiconductor having a wider band gap and lower intrinsic carrier density than silicon has extremely small off-state current and thus is preferably used as the transistor 131t. Examples of such a semiconductor are an oxide semiconductor and gallium nitride that have a band gap more than twice as wide as that of silicon. A transistor including the semiconductor can have much smaller off-state current than a transistor including a normal semiconductor such as silicon or germanium. Consequently, the use of the transistor 131t having the above structure can prevent leakage of electric charge held at the node FD.

In the switch circuit 120 having the above structure, the on/off state of the transistor 130t for controlling electrical connection between wirings is selected in accordance with configuration data, and the potential of a signal including configuration data is held at the node FD by turning off the transistor 131t. Thus, in one embodiment of the present invention, the switch circuit 120 included in a routing resource is additionally provided with a function of a configuration memory that holds information on selection of its on/off state. Since the number of elements in each cell 140 is smaller than that of an SRAM, the area of the configuration memory can be smaller than that in the case of a PLD having a conventional structure in which both a configuration memory and a switch are provided.

In particular, a multi-context PLD achieves dynamic reconfiguration by storing plural pieces of configuration data corresponding to a plurality of circuit structures in configuration memories; therefore, the area of the configuration memories in the multi-context PLD is much larger than that in the case of using another method of performing dynamic reconfiguration, such as a configuration data transfer method. In contrast, in the PLD that includes the switch circuit 120 with the structure illustrated in FIG. 10 or FIG. 12 according to one embodiment of the present invention, the area of the configuration memories can be small as described above even when a multi-context system is employed.

Note that a highly purified oxide semiconductor (purified OS) obtained by reduction of impurities such as moisture or hydrogen serving as an electron donor (donor) and by reduction of oxygen defects is an intrinsic (i-type) semiconductor or a substantially i-type semiconductor. For this reason, a transistor having a channel formation region in a highly purified oxide semiconductor film has extremely small off-state current and high reliability. Consequently, when the transistor is used as the transistor 131t in the switch circuit 120, the data retention time can be longer.

Specifically, various experiments can prove a small off-state current of a transistor having a channel formation region in a highly purified oxide semiconductor. For example, the off-state current of even an element having a channel width of $1 \times 10^6$ μm and a channel length of 10 μm can be less than or equal to the measurement limit of a semiconductor parameter analyzer, that is, less than or equal to $1 \times 10^{-13}$ A at a voltage between the source electrode and the drain electrode (a drain voltage) of 1 V to 10 V. In this case, it can be seen that off-state current standardized on the channel width of the transistor is smaller than or equal to 100 zA/μm. In addition, the off-state current is measured using a circuit in which a capacitor and a transistor are connected to each other and electric charge flowing into or from the capacitor is controlled by the transistor. In the measurement, a highly purified oxide semiconductor film is used for a channel formation region of the transistor, and the off-state current of the transistor is measured from a change in the amount of electric charge of the capacitor per unit time. As a result, it is found that when the voltage between the source electrode and the drain electrode of the transistor is 3 V, a smaller off-state current of several tens of yoctoamperes per micrometer (yA/μm) is obtained. Consequently, the transistor in which a highly purified oxide semiconductor film is used for a channel formation region has much smaller off-state current than a transistor including crystalline silicon.

In—Ga—Zn-based oxide and In—Sn—Zn-based oxide among oxide semiconductors have the following advantages over silicon carbide, gallium nitride, and gallium oxide: transistors with excellent electrical characteristics can be formed by sputtering or a wet process and thus can be mass-produced easily. Further, unlike in the case of using silicon carbide, gallium nitride, or gallium oxide, with the use of the oxide semiconductor (In—Ga—Zn-based oxide), transistors with excellent electrical characteristics can be formed over a glass substrate or on an integrated circuit using silicon, and a larger substrate can be used.

An oxide semiconductor preferably contains at least indium (In) or zinc (Zn). Further, as a stabilizer for reducing variations in electric characteristics of transistors using the oxide semiconductor, the oxide semiconductor preferably contains gallium (Ga), tin (Sn), hafnium (Hf), aluminum (Al), and/or zirconium (Zr) in addition to indium (In) and/or zinc (Zn).

As another stabilizer, the oxide semiconductor may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide refers to an oxide containing In, Ga, and Zn, and there is no limitation on the composition ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8) or an oxide with an atomic ratio close to the above atomic ratios may be used.

For example, high mobility can be obtained relatively easily with an In—Sn—Zn-based oxide. However, mobility can be increased by reducing the defect density in a bulk also in the case of using an In—Ga—Zn-based oxide.

A structure of an oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 28 may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by sputtering with a polycrystalline oxide semiconductor sputtering target. By collision of ions with the sputtering target, a crystal region included in the sputtering target may be separated from the target along an a-b plane; in other words, sputtered particles having a plane parallel to the a-b plane (flat-plate-like sputtered particles or pellet-like sputtered particles) may flake off from the target. In this case, the flat-plate-like sputtered particles reach a substrate while maintaining their crystal state, whereby the CAAC-OS film can be formed.

For the deposition of the CAAC-OS film, the following conditions are preferably used.

The crystal state can be prevented from being broken by the impurities by reducing the amount of impurities entering the CAAC-OS film during the deposition, for example, by reducing the concentration of impurities (e.g., hydrogen, water, carbon dioxide, and nitrogen) that exist in the deposition chamber or by reducing the concentration of impurities in a deposition gas. Specifically, a deposition gas with a dew point of −80° C. or lower, preferably −100° C. or lower is used.

By increasing the substrate heating temperature during the deposition, migration of sputtered particles is likely to occur after the sputtered particles reach a substrate surface. Specifically, the substrate heating temperature during the deposition ranges from 100° C. to 740° C., preferably from 200° C. to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

It is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target will be described below.

A polycrystalline In—Ga—Zn-based oxide target is made by mixing $InO_X$ powder, $GaO_Y$ powder, and $ZnO_Z$ powder at a predetermined molar ratio, applying pressure to the mixture, and then performing heat treatment on the mixture at temperatures ranging from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

The semiconductor film may be a stack of a plurality of oxide semiconductor films formed using metal oxide targets with different atomic ratios of metals. For example, the semiconductor stack may be formed in such a manner that a first oxide semiconductor film is formed using a target with an atomic ratio of In:Ga:Zn of 1:1:1 and a second oxide semiconductor film is formed using a target with an atomic ratio of In:Ga:Zn of 3:1:2. Alternatively, the semiconductor stack may be formed in such a manner that a first oxide semiconductor film, a second oxide semiconductor film, and a third oxide semiconductor film are formed with targets having an atomic ratio of In:Ga:Zn of 1:3:2, 3:1:2, and 1:1:1, respectively.

Alternatively, the semiconductor film may be a stack of a plurality of oxide semiconductor films formed using metal oxide targets containing different metals.

Note that the transistor 130t or the transistor 133t may be a transistor having a channel formation region in an amorphous, microcrystalline, polycrystalline, or single crystal semiconductor film of silicon, germanium, or the like, or alternatively may be a transistor having a channel formation region in a film of a semiconductor having a wider band gap and lower intrinsic carrier density than silicon, like the transistor 131t. As silicon, any of the following can be used, for example: amorphous silicon manufactured by sputtering or vapor deposition such as plasma CVD, polycrystalline silicon obtained by crystallization of amorphous silicon by treatment such as laser annealing, and single crystal silicon obtained in such a manner that a surface portion of a single crystal silicon wafer is separated after implantation of hydrogen ions or the like into the silicon wafer.

<Structure Example of Cell>

Figure 13A:
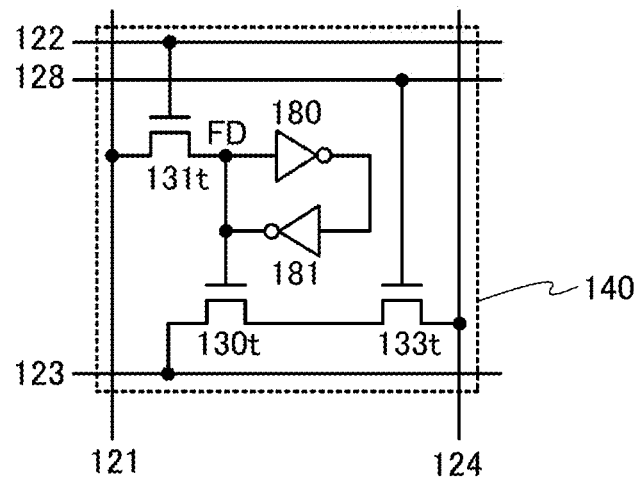
FIGS. 13A and 13B each illustrate a structure of a cell.

Next, another example of the structure of the switch circuit 120 illustrated in FIG. 3 will be described. FIG. 13A illustrates an example of the cell 140 included in the switch circuit 120. Like the cell 140 included in the switch circuit 120 illustrated in FIG. 9, the cell 140 illustrated in FIG. 13A includes the transistor 131t, the transistor 130t, and the transistor 133t. Note that the cell 140 in FIG. 13A differs from the cell 140 in FIG. 9 in that an inverter 180 and an inverter 181 for holding the potential of the node FD are provided.

Specifically, in FIG. 13A, an input terminal of the inverter 180 and an output terminal of the inverter 181 are electrically connected to the node FD, and an output terminal of the inverter 180 and an input terminal of the inverter 181 are electrically connected to each other. With this structure, the potential of the node FD can be held by the inverters 180 and 181 in the cell 140 illustrated in FIG. 13A.

Figure 13B:
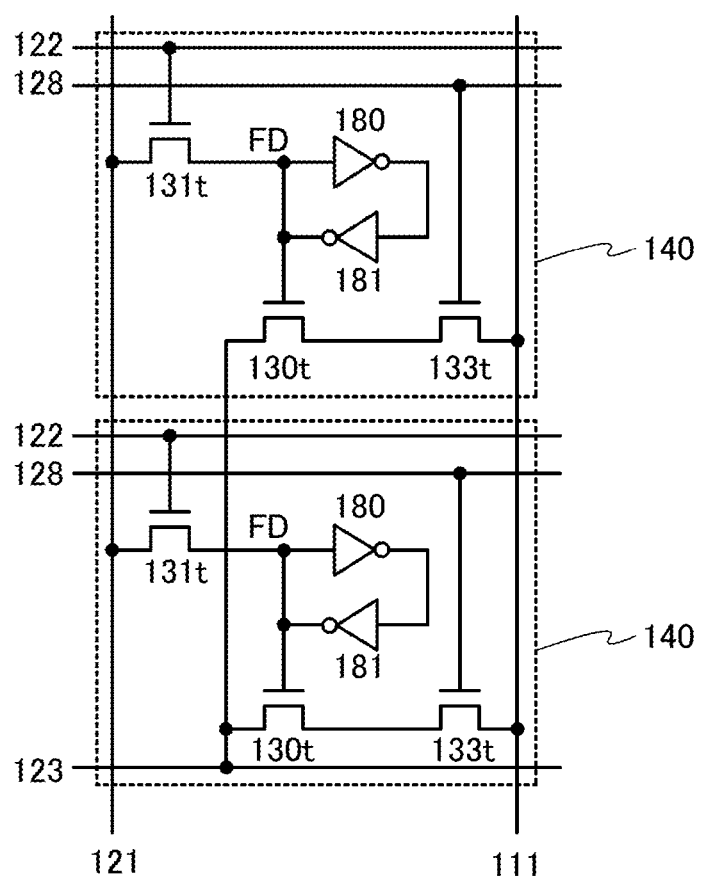

FIG. 13B illustrates an example in which the wiring 123 is shared by two cells 140 having the structure illustrated in FIG. 13A. Although FIG. 13B illustrates the case where the wiring 123 is shared by the two cells 140, the wiring 123 may be shared by three or more cells 140 in one embodiment of the present invention.

The cells 140 illustrated in FIGS. 13A and 13B may further include another circuit element such as a transistor, a diode, a resistor, a capacitor, or an inductor as needed.

Note that FIGS. 13A and 13B show the case where the transistor 133t is electrically connected between the other of the source and the drain of the transistor 130t and the wiring 111. The transistor 133t may be electrically connected between one of the source and the drain of the transistor 130t and the wiring 123.

<Preventing Shoot-Through Current by Latch>

Figure 14A:
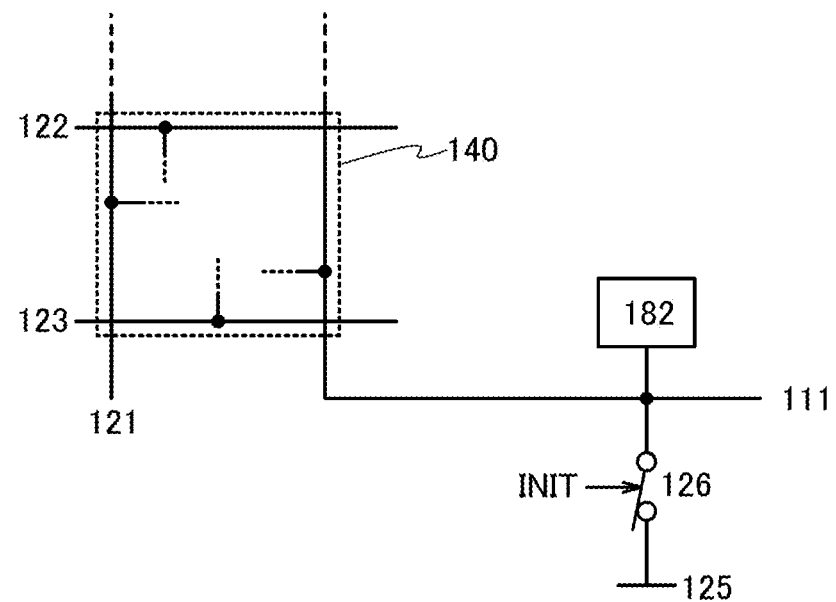
FIGS. 14A and 14B illustrate a structure of a latch.

In the PLD in one embodiment of the present invention, a latch may be electrically connected to the wiring 111 electrically connected to an input terminal of an LE. FIG. 14A illustrates that a latch 182 and the switch 126 for performing initialization are electrically connected to the wiring 111. The latch 182 illustrated in FIG. 14A has a function of keeping the potential of the wiring 111, which is electrically connected to the input terminal of the LE, high or low.

Figure 14B:
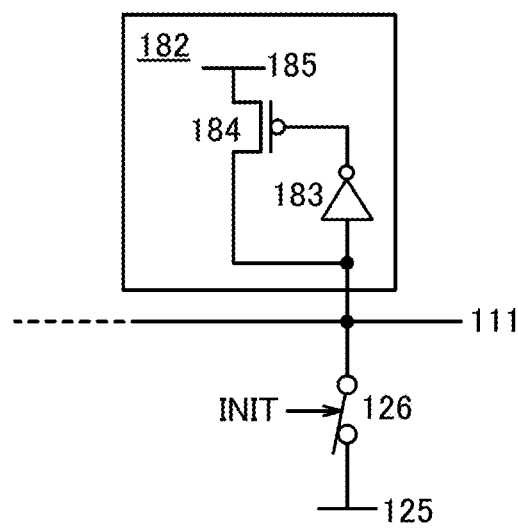

FIG. 14B illustrates an example of the structure of the latch 182. The latch 182 in FIG. 14B includes an inverter 183 and a p-channel transistor 184. An input terminal of the inverter 183 is electrically connected to the wiring 111. An output terminal of the inverter 183 is electrically connected to a gate of the transistor 184. One of a source and a drain of the transistor 184 is electrically connected to a wiring 185 supplied with a potential higher than a potential applied to the wiring 125. The other of the source and the drain of the transistor 184 is electrically connected to the wiring 111.

In one embodiment of the present invention, the latch 182 having the above structure is electrically connected to the wiring 111, whereby the potential of the wiring 111 can be kept high or low after the PLD is powered on. Accordingly, application of an intermediate potential to the wiring 111 can prevent a shoot-through current from being generated in the LE having the input terminal connected to the wiring 111.

<Connection Between IO and Logic Element>

Figure 15:
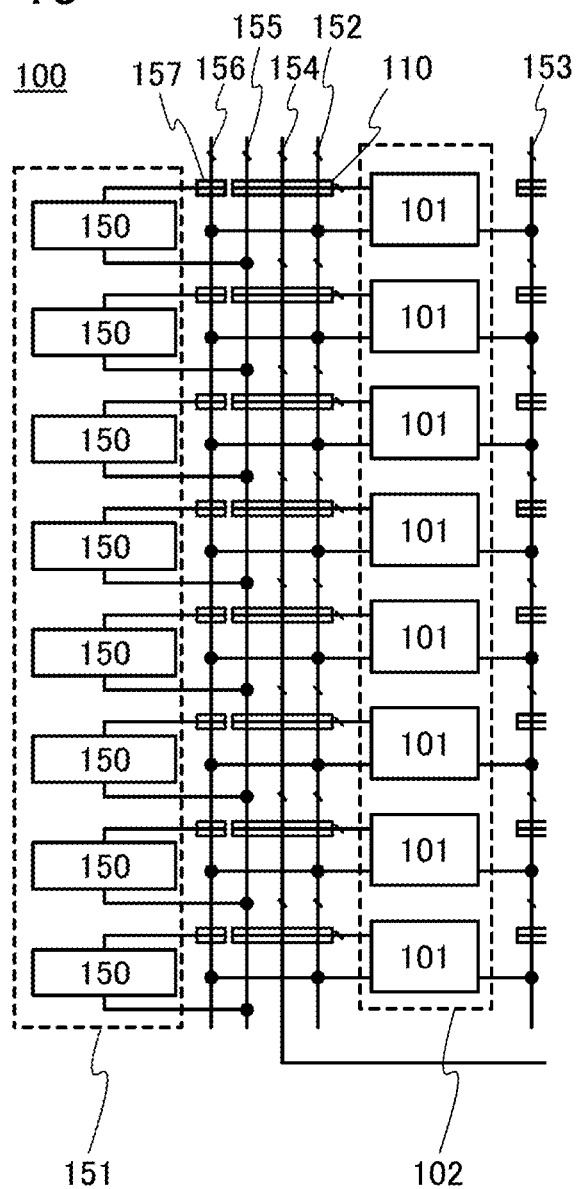
FIG. 15 illustrates a structure of a PLD.

Next, connections between IOs and logic elements in the PLD 100 will be described. FIG. 15 illustrates an example of part of the PLD 100 in one embodiment of the present invention.

In FIG. 15, the column 102 including a plurality of LEs 101 and a column 151 including a plurality of IOs 150 are provided in the PLD 100. FIG. 15 illustrates an example where the column 151 and the column 102 are positioned in parallel in this order from the left.

In the PLD 100 illustrated in FIG. 15, a plurality of wirings 152, a plurality of wirings 153, a plurality of wirings 154, a plurality of wirings 155, and a plurality of wirings 156 are provided.

The first output terminals of the LEs 101 in the column 102 are connected to the plurality of wirings 152 and the plurality of wirings 156. The second output terminals of the LEs 101 in the column 102 are connected to the plurality of wirings 153. Output terminals of the IOs 150 in the column 151 are connected to the plurality of wirings 155. The plurality of wirings 154 are connected to the first output terminals of a plurality of LEs 101 (not illustrated) that are positioned on the right side of the column 102 in FIG. 15.

The number of output terminals of the IO 150 is not limited to one and can be more than one. Note that one output terminal is always connected to one wiring regardless of the number of the output terminals. That is, when the column 151 includes Y IOs 150 (Y is a natural number), the PLD 100 at least includes Y wirings 155 electrically connected to the output terminals.

The plurality of wirings 152, the plurality of wirings 154, the plurality of wirings 155, and the plurality of wirings 156 are positioned between the column 151 and the column 102. The column 102 is positioned between the plurality of wirings 152 and the plurality of wirings 153.

In FIG. 15, the plurality of wirings 152, the plurality of wirings 154, and the plurality of wirings 155 are electrically connected to a plurality of input terminals of the LEs 101 in the column 102 through the switch circuits 110. Moreover, in FIG. 15, the plurality of wirings 156 are electrically connected to the input terminals of the IOs 150 in the column 151 through switches 157.

The switch 157 includes one switch circuit 120 having the aforementioned structure. The switch circuit 120 included in the switch 157 has functions of selecting one of the plurality of wirings 156 in accordance with configuration data and connecting the one selected wiring to the input terminals of the IOs 150.

Note that FIG. 1A and FIG. 15 each illustrate the example in which the LEs 101 that belong to one column are connected to each other through a plurality of wirings provided between columns including the LEs 101; alternatively, the PLD 100 may include a wiring that directly connects the LEs 101 belonging to one column.

<Structure Example of LE>

Figure 16A:
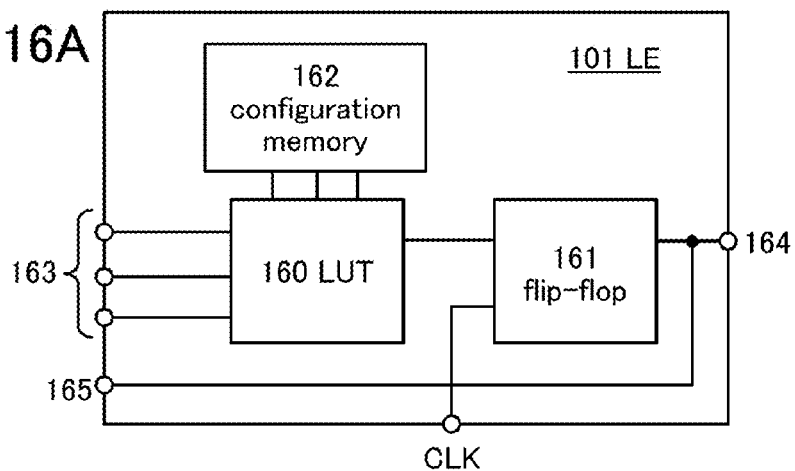
FIGS. 16A to 16C each illustrate a structure of a logic element.

FIG. 16A illustrates one embodiment of the LE 101. The LE 101 illustrated in FIG. 16A includes a lookup table (LUT) 160, a flip-flop 161, and a configuration memory 162. The configuration memory 162 has a function of storing configuration data transmitted from a memory element. A logic circuit determined by the LUT 160 varies depending on the content of configuration data transmitted from the configuration memory 162. When the configuration data is determined, one output value of the LUT 160 with respect to input values of a plurality of input signals applied to input terminals 163 is determined. Then, the LUT 160 outputs a signal including the output value. The flip-flop 161 holds the signal output from the LUT 160 and outputs an output signal corresponding to the signal from a first output terminal 164 and a second output terminal 165 in synchronization with a clock signal CLK.

Note that the LE 101 may further include a multiplexer to select whether the output signal from the LUT 160 passes through the flip-flop 161 or not.

The type of the flip-flop 161 may be determined by configuration data. Specifically, the flip-flop 161 may have a function of any of a D flip-flop, a T flip-flop, a JK flip-flop, and an RS flip-flop depending on the configuration data.

Figure 16B:
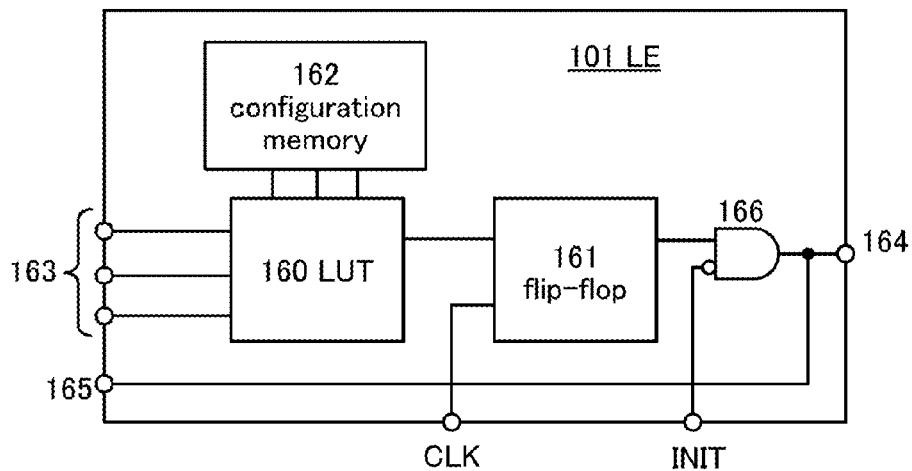

FIG. 16B illustrates another embodiment of the LE 101. The LE 101 illustrated in FIG. 16B includes an AND circuit 166 in addition to the components of the LE 101 in FIG. 16A. To the AND circuit 166, a signal from the flip-flop 161 is applied as an active high input, and the signal INIT for initializing the potential of the wiring 111 in FIG. 3 is applied as an active low input. Accordingly, an output signal from the LE 101 can have the same potential as the wiring 125 when the potential of the wiring 111 is initialized in accordance with the signal INIT. As a result, a large amount of current can be prevented from flowing through the wiring 111 and the plurality of wirings 123 which are illustrated in FIG. 3 and to which the output signal from the LE 101 is applied. Thus, breakage of the PLD can be prevented.

Figure 16C:
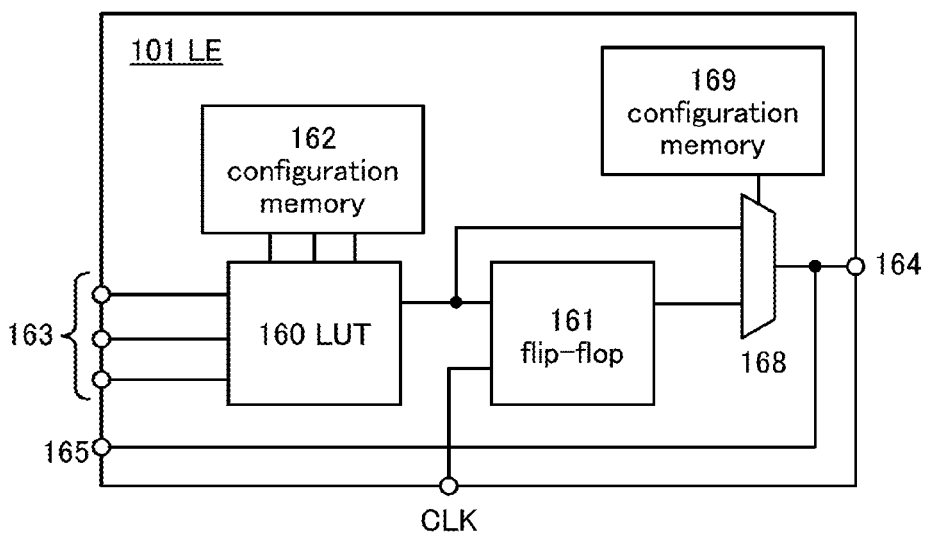

FIG. 16C illustrates another embodiment of the LE 101. The LE 101 illustrated in FIG. 16C includes a multiplexer 168 and a configuration memory 169 in addition to the components of the LE 101 in FIG. 16A. In FIG. 16C, an output signal from the LUT 160 and an output signal from the flip-flop 161 are input to the multiplexer 168. The multiplexer 168 has a function of selecting and outputting one of the two output signals in accordance with configuration data stored in the configuration memory 169. The output signal of the multiplexer 168 is output from the first output terminal 164 and the second output terminal 165.

<Top View of PLD>

Figure 17:
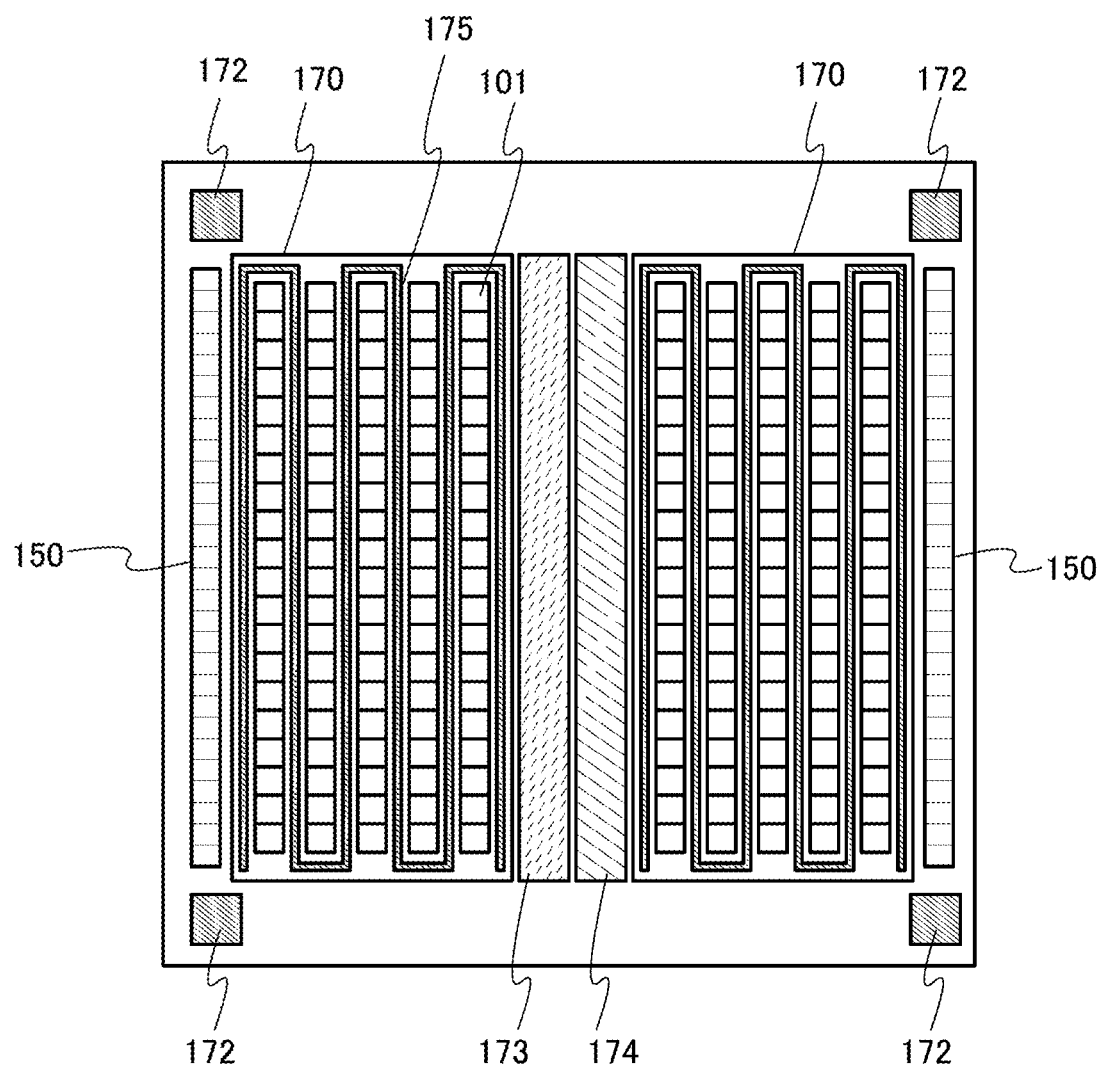
FIG. 17 is a top view of a PLD.

FIG. 17 is an example of a top view of the PLD 100.

The PLD 100 in FIG. 17 includes logic arrays 170, the IOs 150, phase lock loops (PLLs) 172, a RAM 173, and a multiplier 174.

The logic array 170 includes a plurality of LEs 101 and a routing resource 175 that includes wirings and switches for controlling connections between the LEs 101. The PLL 172 has a function of generating the clock signal CLK. The RAM 173 has a function of storing data used for logic operation. The multiplier 174 corresponds to a logic circuit dedicated to multiplication. The multiplier 174 is not necessarily provided when the logic array 170 has a function of executing multiplication.

Although FIG. 17 illustrates the case where configuration data for the LEs 101 with which a logic circuit is determined are stored in a memory element provided outside the PLD 100, the memory element may be provided in the PLD 100.

<Structure Example of LUT>

An example of the structure of the LUT 160 included in the LE 101 will be described. The LUT 160 can be composed of a plurality of multiplexers. Configuration data can be input to any of input terminals and control terminals of the plurality of multiplexers.

Figure 18A:
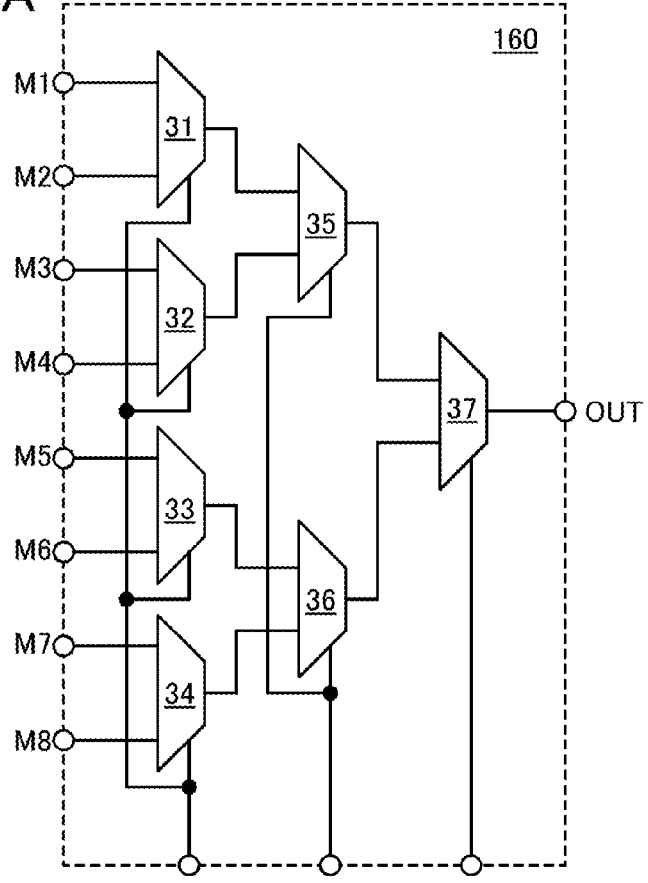
FIGS. 18A to 18C each illustrate a structure of a LUT.

FIG. 18A illustrates one embodiment of the LUT 160 included in the LE 101.

In FIG. 18A, the LUT 160 is composed of seven two-input multiplexers (multiplexers 31 to 37). Input terminals of the multiplexers 31 to 34 correspond to input terminals M1 to M8 of the LUT 160.

Control terminals of the multiplexers 31 to 34 are electrically connected to each other and correspond to an input terminal IN3 of the LUT 160. Output terminals of the multiplexers 31 and 32 are electrically connected to two respective input terminals of the multiplexer 35. Output terminals of the multiplexers 33 and 34 are electrically connected to two respective input terminals of the multiplexer 36. Control terminals of the multiplexers 35 and 36 are electrically connected to each other and correspond to an input terminal IN2 of the LUT 160. Output terminals of the multiplexers 35 and 36 are electrically connected to two respective input terminals of the multiplexer 37. A control terminal of the multiplexer 37 corresponds to an input terminal IN1 of the LUT 160. An output terminal of the multiplexer 37 corresponds to an output terminal OUT of the LUT 160.

The kind of logic operation performed by the LUT 160 can be determined in such a manner that output signals corresponding to configuration data stored in a configuration memory is input from the configuration memory to the input terminals M1 to M8.

Figure 18B:
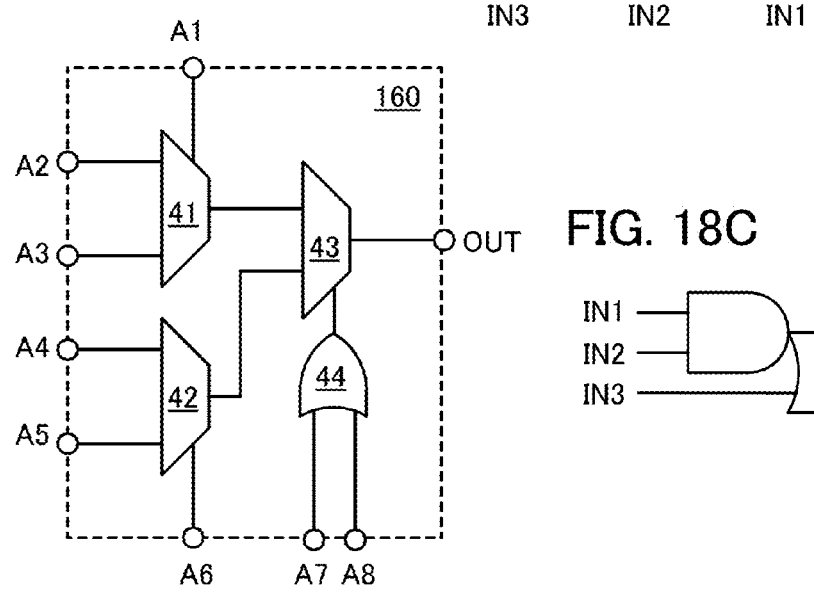
Figure 18C:

For example, when output signals corresponding to configuration data that are stored in the configuration memory and have digital values "0", "1", "0", "1", "0", "1", "1", and "1" are input from the configuration memory to the input terminals M1 to M8 of the LUT 160 in FIG. 18A, the function of an equivalent circuit illustrated in FIG. 18C is obtained.

FIG. 18B illustrates another embodiment of the LUT 160 included in the LE 101.

In FIG. 18B, the LUT 160 is composed of three two-input multiplexers (multiplexers 41 to 43) and a two-input OR circuit 44.

Output terminals of the multiplexers 41 and 42 are electrically connected to two respective input terminals of the multiplexer 43. An output terminal of the OR circuit 44 is electrically connected to a control terminal of the multiplexer 43. An output terminal of the multiplexer 43 corresponds to the output terminal OUT of the LUT 160.

The kind of logic operation performed by the LUT 160 can be determined when an output signal corresponding to configuration data stored in a configuration memory is input from the configuration memory to any of a control terminal A1 and input terminals A2 and A3 of the multiplexer 41, a control terminal A6 and input terminals A4 and A5 of the multiplexer 42, and input terminals A7 and A8 of the OR circuit 44.

For example, when output signals corresponding to configuration data that are stored in the configuration memory and have digital values "0", "1", "0", "0", and "0" are input from the configuration memory to the input terminal A2, the input terminal A4, the input terminal A5, the control terminal A6, and the input terminal A8 of the LUT 160 in FIG. 18B, the function of the equivalent circuit illustrated in FIG. 18C is obtained. In the above structure, the control terminal A1, the input terminal A3, and the input terminal A7 correspond to the input terminal IN1, the input terminal IN2, and the input terminal IN3, respectively.

Note that FIGS. 18A and 18B illustrate examples of the LUT 160 composed of two-input multiplexers; alternatively, the LUT 160 may be composed of multiplexers with three or more inputs.

The LUT 160 may further include any or all of a diode, a resistor, a logic circuit (or a logic element), and a switch in addition to the multiplexers. As the logic circuit (or the logic element), a buffer, an inverter, a NAND circuit, a NOR circuit, a three-state buffer, a clocked inverter, or the like can be used. As the switch, an analog switch or a transistor can be used, for example.

The case illustrated in FIG. 18C in which three-input one-output logic operation is performed with the LUT 160 in FIG. 18A or FIG. 18B is described here; however, one embodiment of the present invention is not limited thereto. By appropriately selecting the structure of the LUT 160 and configuration data to be input, logic operation with four or more inputs and two or more outputs can be performed.

<Example of Cross-Sectional Structure of Cell>

Figure 19:
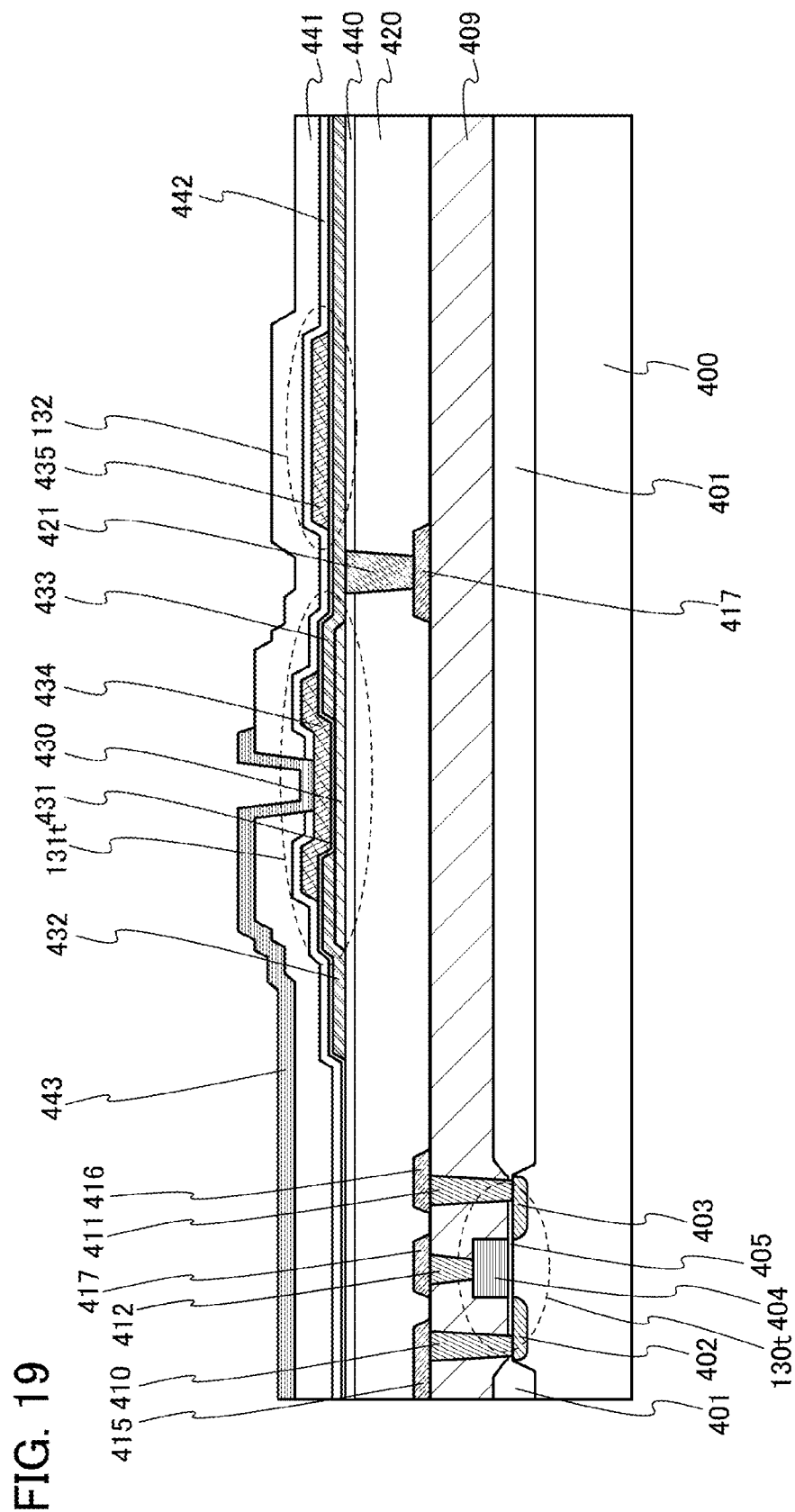
FIG. 19 is a cross-sectional view of a cell.

FIG. 19 illustrates an example of a cross-sectional structure of the transistor 130$t$, the transistor 131$t$, and the capacitor 132 included in the cell 140 illustrated in FIG. 6.

The case is shown where the transistor 131$t$ having a channel formation region in an oxide semiconductor film and the capacitor 132 are formed over the transistor 130$t$ having a channel formation region in a single crystal silicon substrate.

Note that an active layer in the transistor 130$t$ can be an amorphous, microcrystalline, polycrystalline, or signal crystal semiconductor film of silicon, germanium, or the like. Alternatively, the active layer in the transistor 130$t$ may be formed using an oxide semiconductor. In the case where an oxide semiconductor is used for active layers of all the transistors, the transistor 131$t$ is not necessarily stacked over the transistor 130$t$, and the transistors 131$t$ and 130$t$ may be formed in the same layer.

In the case where the transistor 130$t$ is formed using a silicon thin film, any of the following can be used, for example: amorphous silicon formed by sputtering or vapor deposition such as plasma CVD, polycrystalline silicon obtained by crystallization of amorphous silicon by laser annealing or the like, and single crystal silicon obtained in such a manner that a surface portion of a single crystal silicon wafer is separated after implantation of hydrogen ions or the like into the silicon wafer.

Examples of a semiconductor substrate 400 where the transistor 130$t$ is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). As an example, FIG. 19 illustrates the case where an n-type single crystal silicon substrate is used.

The transistor 130$t$ is electrically isolated from other transistors by an element isolation insulating film 401. The element isolation insulating film 401 can be formed by a local oxidation of silicon (LOCOS) method, a trench isolation method, or the like.

Specifically, the transistor 130$t$ includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps a channel formation region formed between the impurity regions 402 and 403, with the gate insulating film 405 placed between the gate electrode 404 and the channel formation region.

An insulating film 409 is provided over the transistor 130t. Openings are formed in the insulating film 409. A wiring 410 in contact with the impurity region 402, a wiring 411 in contact with the impurity region 403, and a wiring 412 electrically connected to the gate electrode 404 are formed in the openings.

The wiring 410 is electrically connected to a wiring 415 formed over the insulating film 409. The wiring 411 is electrically connected to a wiring 416 formed over the insulating film 409. The wiring 412 is electrically connected to a wiring 417 formed over the insulating film 409.

An insulating film 420 and an insulating film 440 are formed to be stacked in this order over the wirings 415 to 417. An opening is formed in the insulating films 420 and 440. A wiring 421 electrically connected to the wiring 417 is formed in the opening.

In FIG. 19, the transistor 131t and the capacitor 132 are formed over the insulating film 440.

The transistor 131t includes, over the insulating film 440, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that is positioned over the gate insulating film 431 and overlaps the semiconductor film 430 between the conductive films 432 and 433. Note that the conductive film 433 is electrically connected to the wiring 421.

A conductive film 435 is provided over the gate insulating film 431 to overlap the conductive film 433. A portion where the conductive film 435 overlaps the conductive film 433 with the gate insulating film 431 placed therebetween functions as the capacitor 132.

Note that the case where the capacitor 132, together with the transistor 131t, is provided over the insulating film 440 is illustrated in FIG. 19 as an example; alternatively, the capacitor 132 may be provided below the insulating film 440 along with the transistor 130t.

An insulating film 441 and an insulating film 442 are formed to be stacked in this order over the transistor 131t and the capacitor 132. An opening is formed in the insulating films 441 and 442. A conductive film 443 that is in contact with the gate electrode 434 in the opening is provided over the insulating film 441.

In FIG. 19, the transistor 131t includes the gate electrode 434 on at least one side of the semiconductor film 430. Alternatively, the transistor 131t may include a pair of gate electrodes with the semiconductor film 430 placed therebetween.

In the case where the transistor 131t has a pair of gate electrodes with the semiconductor film 430 therebetween, one of the gate electrodes may be supplied with a signal for controlling the on/off state of the transistor 131t, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

Although FIG. 19 illustrates an example where the transistor 131t has a single-gate structure including one channel formation region corresponding to one gate electrode 434, the transistor 131t may have a multi-gate structure in which a plurality of gate electrodes electrically connected to each other are provided and thus a plurality of channel formation regions are included in one active layer.

<Structure Example of Transistor>

Next, the description is made on an example of the structure of a transistor having a channel formation region in an oxide semiconductor film.

Figure 20:
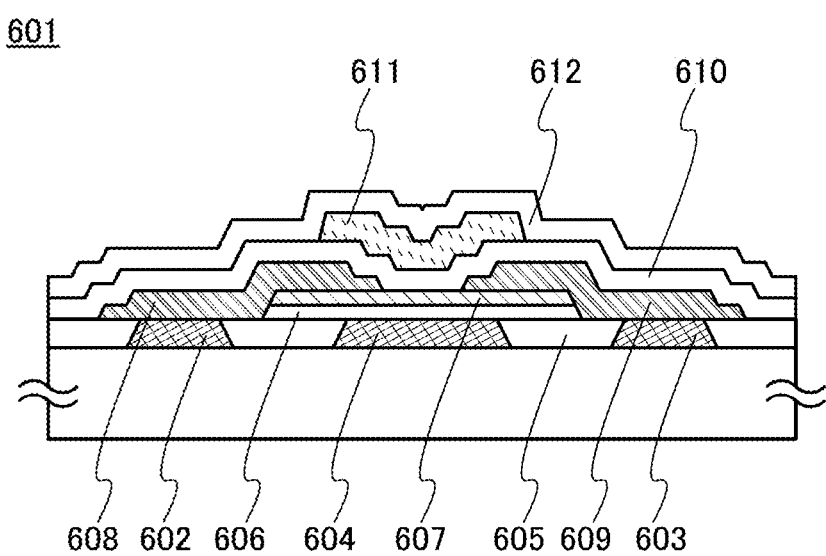
FIG. 20 is a cross-sectional view of a transistor.

A transistor 601 illustrated in FIG. 20 includes, over an insulating surface, a conductive film 602, a conductive film 603, and a gate electrode 604. The gate electrode 604 is placed between the conductive film 602 and the conductive film 603. The transistor 601 also includes an insulating film 605 that is provided over the insulating surface to be placed between the gate electrode 604 and each of the conductive films 602 and 603.

Moreover, the transistor 601 includes an island-shaped insulating film 606 over the gate electrode 604 and the insulating film 605, and an island-shaped oxide semiconductor film 607 over the insulating film 606. The transistor 601 also includes a source electrode 608 over the conductive film 602 and the oxide semiconductor film 607, and a drain electrode 609 over the conductive film 603 and the oxide semiconductor film 607.

The transistor 601 includes an insulating film 610 provided over the oxide semiconductor film 607, the source electrode 608, and the drain electrode 609.

Note that the thickness of end portions of the source electrode 608 and the drain electrode 609 is reduced stepwise. Alternatively, the end portions of the source electrode 608 and the drain electrode 609 may be continuously reduced in thickness. Such a structure can improve the step coverage of the end portions of the source electrode 608 and the drain electrode 609 with the insulating film 610 provided over the source electrode 608 and the drain electrode 609.

The transistor 601 includes a gate electrode 611 provided over the insulating film 610. The gate electrode 611 overlaps the oxide semiconductor film 607 with the insulating film 610 placed therebetween.

Note that FIG. 20 illustrates the case where the transistor 601 includes an insulating film 612 provided to cover the gate electrode 611 and the insulating film 610.

Figure 21:
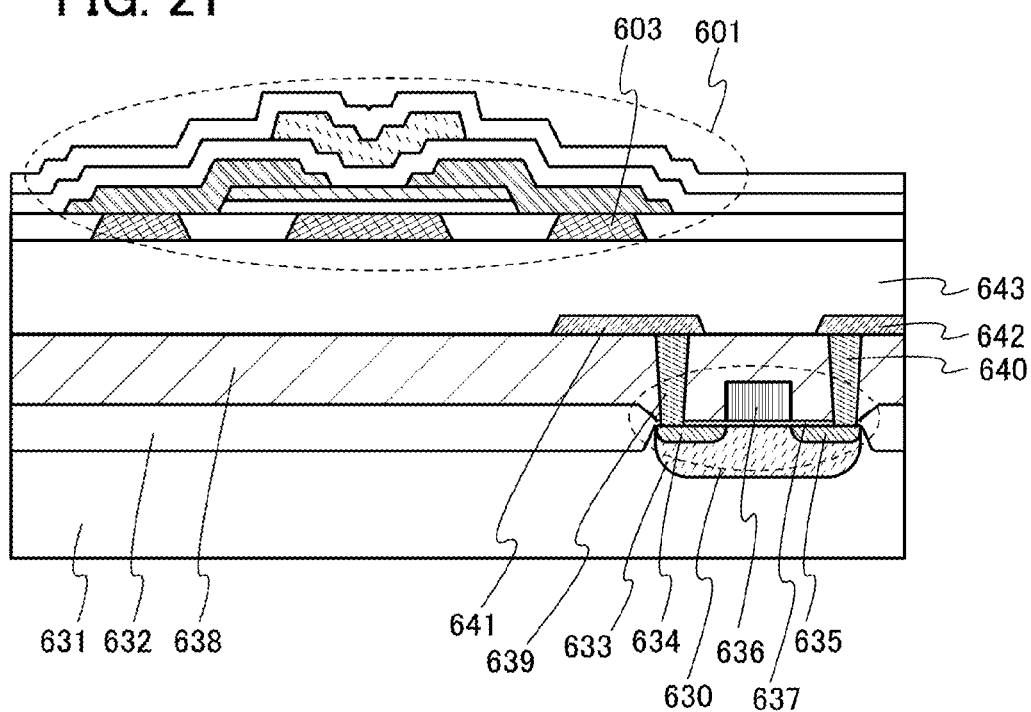
FIG. 21 illustrates a layered structure of transistors.

FIG. 21 is a cross-sectional view illustrating that the transistor 601 illustrated in FIG. 20 is stacked over a transistor 630 having a channel formation region in a single crystal silicon substrate.

As illustrated in FIG. 21, the transistor 630 is formed using a semiconductor substrate 631. The semiconductor substrate 631 can be, for example, an n-type or p-type single crystal silicon substrate or compound semiconductor substrate (e.g., GaAs substrate, InP substrate, GaN substrate, SiC substrate, GaP substrate, GaInAsP substrate, or ZnSe substrate). As an example, FIG. 21 illustrates the case where an n-type single crystal silicon substrate is used.

The transistor 630 is electrically isolated from other semiconductor elements such as a transistor by an element isolation insulating film 632. The element isolation insulating film 632 can be formed by a local oxidation of silicon (LOCOS) method, a trench isolation method, or the like.

In a region where the n-channel transistor 630 is formed, a p-well 633 is formed by selective introduction of an impurity element imparting p-type conductivity. In the case where a p-channel transistor is formed using a semiconductor substrate having p-type conductivity, an impurity element imparting n-type conductivity is selectively introduced to a region where the p-channel transistor is formed, so that a region called an n-well is formed.

Specifically, the transistor 630 includes impurity regions 634 and 635 that are formed in the semiconductor substrate 631 and function as a source region and a drain region, a gate electrode 636, and a gate insulating film 637 provided between the semiconductor substrate 631 and the gate electrode 636. The gate electrode 636 overlaps a channel formation region formed between the impurity regions 634 and 635, with the gate insulating film 637 placed between the gate electrode 636 and the channel formation region.

An insulating film 638 is formed over the transistor 630. Openings are formed in the insulating film 638. Wirings 639 and 640 that are in contact with the impurity region 634 and the impurity region 635, respectively, are formed in the openings.

The wiring 639 is connected to a wiring 641 formed over the insulating film 638. The wiring 640 is connected to a wiring 642 formed over the insulating film 638.

An insulating film 643 is formed over the wirings 641 and 642.

In FIG. 21, the transistor 601 is formed over the insulating film 643. The conductive film 603 is connected to the gate electrode of the transistor 630.

Figure 22:
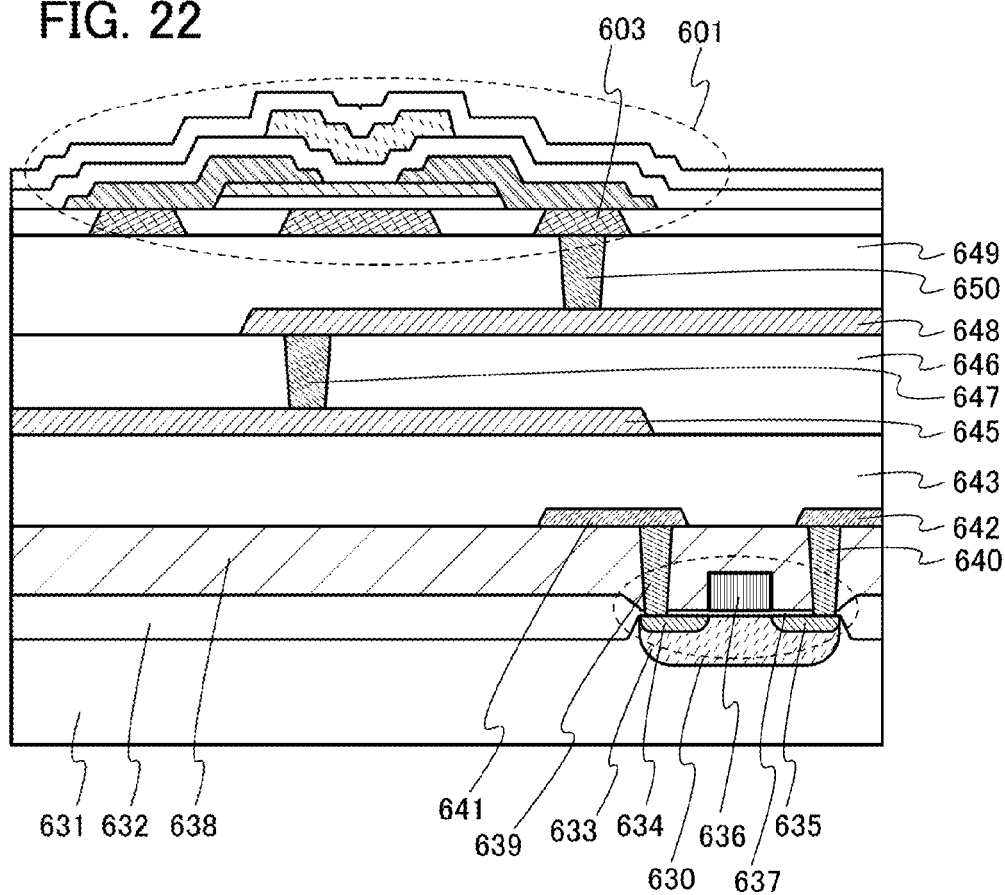
FIG. 22 illustrates a layered structure of transistors.

FIG. 22 is a cross-sectional view illustrating that a wiring layer is formed between the layer where the transistor 630 is formed and the layer where the transistor 601 is formed.

In FIG. 22, a wiring 645 is formed over the insulating film 643. An insulating film 646 is formed over the insulating film 643 and the wiring 645. An opening is formed in the insulating film 646, and a wiring 647 connected to the wiring 645 is formed in the opening. A wiring 648 connected to the wiring 647 is formed over the insulating film 646. An insulating film 649 is formed over the insulating film 646 and the wiring 648. An opening is formed in the insulating film 649, and a wiring 650 connected to the wiring 648 is formed in the opening. The transistor 601 is formed over the insulating film 649. The wiring 650 is connected to the conductive film 603.

Figure 23:
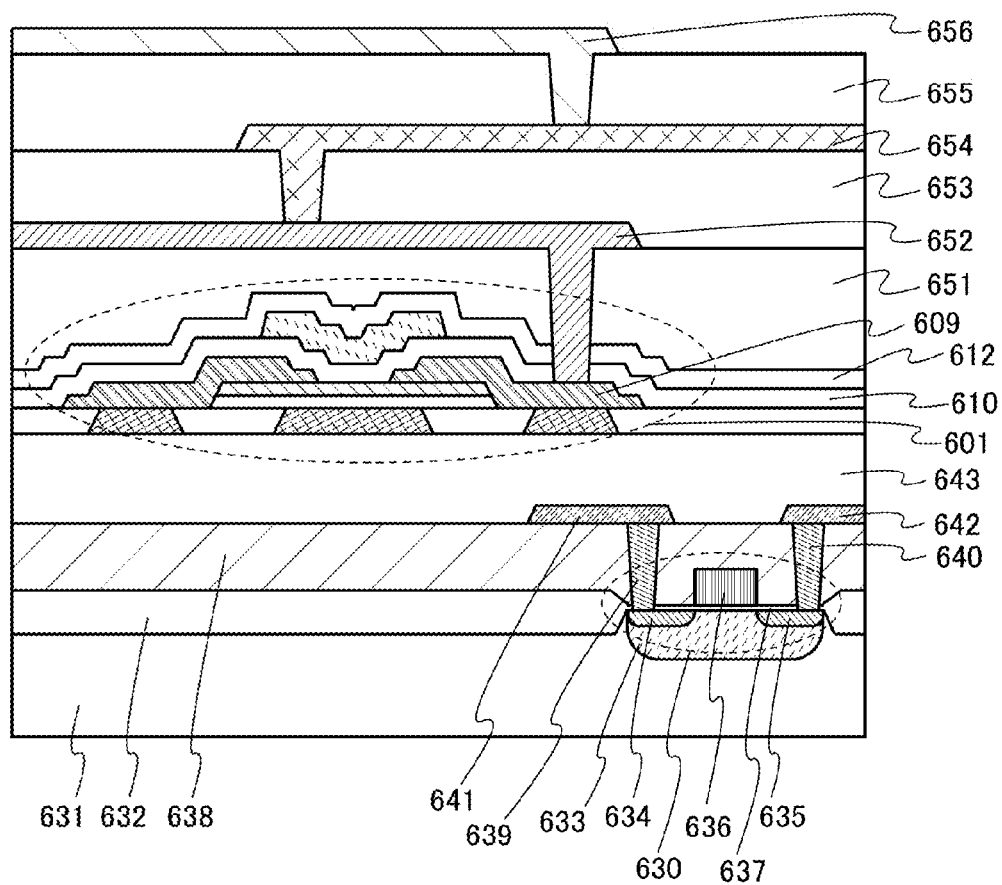
FIG. 23 illustrates a layered structure of transistors.

FIG. 23 is a cross-sectional view illustrating that a wiring layer is formed over the layer where the transistor 601 is formed.

In FIG. 23, an insulating film 651 is formed over the transistor 601. A wiring 652 is formed over the insulating film 651 and is connected to the drain electrode 609 through an opening formed in the insulating films 651, 610, and 612. An insulating film 653 is formed over the insulating film 651 and the wiring 652. A wiring 654 is formed over the insulating film 653 and is connected to the wiring 652 through an opening formed in the insulating film 653. An insulating film 655 is formed over the insulating film 653 and the wiring 654. A wiring 656 is formed over the insulating film 655 and is connected to the wiring 654 through an opening formed in the insulating film 655.

<Structure Example of Configuration Memory>

Figure 24:
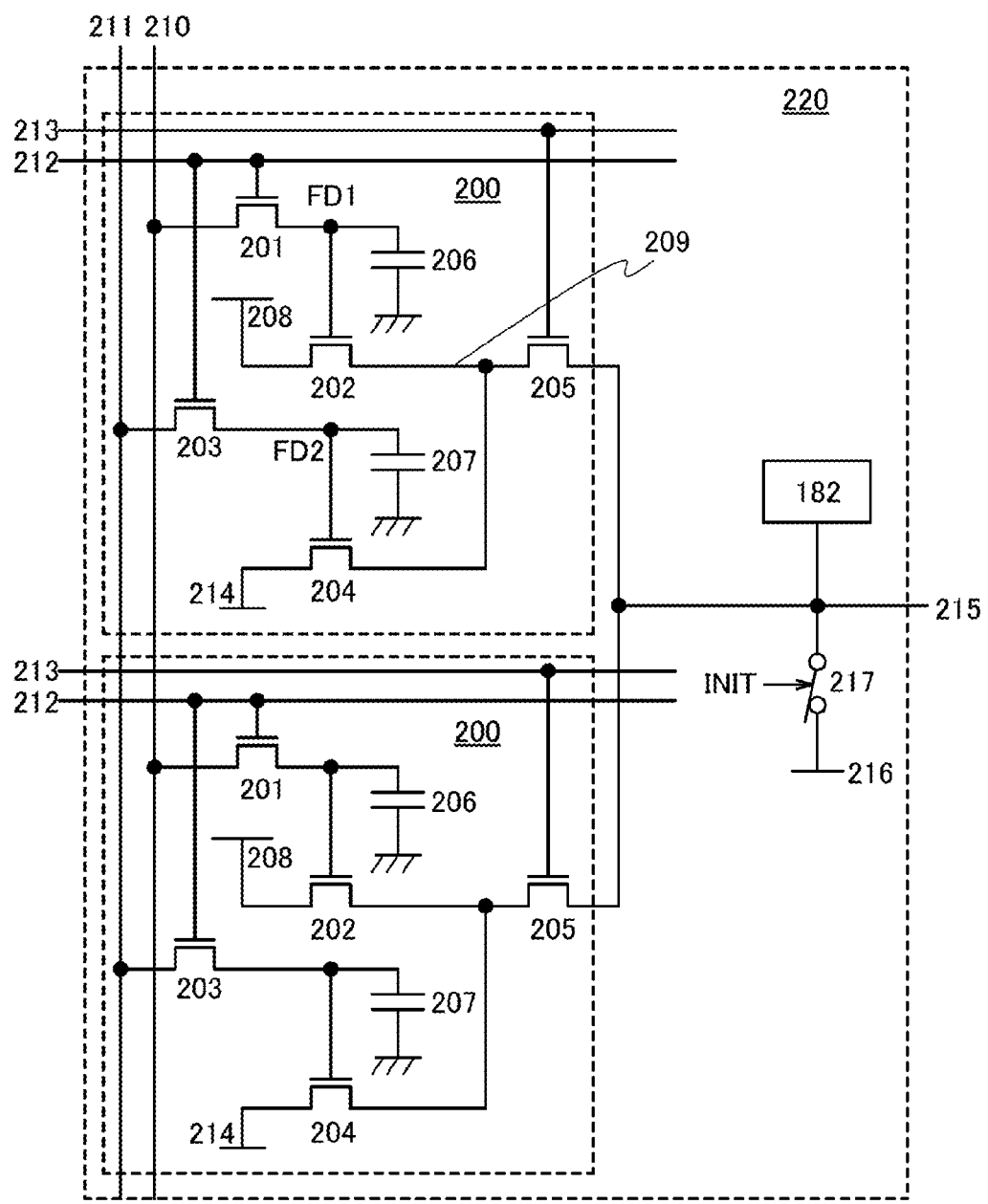
FIG. 24 is a circuit diagram of a configuration memory.

FIG. 24 illustrates an example of the structure of a memory cell included in a configuration memory.

In one embodiment of the present invention, a memory cell 200 at least includes switches 201 to 205. The memory cell 200 may also include a capacitor 206 and a capacitor 207 as illustrated in FIG. 24.

FIG. 24 illustrates an example where one transistor is used as the switch; alternatively, a plurality of transistors may be used as the switch.

The switch 201 has a function of controlling supply of the potential of a first signal including configuration data to a node FD1 in the memory cell 200. Specifically, when the switch 201 is conducting (on), the potential of the first signal that includes configuration data and is supplied to a wiring 210 is supplied to the node FD1. When the switch 201 is not conducting (is off), the potential of the node FD1 is held. The capacitor 206 is electrically connected to the node FD1 and has a function of holding the potential of the node FD1.

The on/off state of the switch 201 is selected in accordance with the potential of a signal supplied to a wiring 212.

The switch 202 has a function of controlling electrical connection between a wiring 208 and a wiring 209 in accordance with the potential of the node FD1. Specifically, when the switch 202 is on, the wiring 208 and the wiring 209 are electrically connected to each other. When the switch 202 is off, the wiring 208 and the wiring 209 are electrically separated from each other.

The switch 203 has a function of controlling supply of the potential of a second signal including configuration data to a node FD2 in the memory cell 200. Specifically, when the switch 203 is conducting (on), the potential of the second signal that includes configuration data and is supplied to a wiring 211 is supplied to the node FD2. When the switch 203 is not conducting (is off), the potential of the node FD2 is held. The capacitor 207 is electrically connected to the node FD2 and has a function of holding the potential of the node FD2.

The on/off state of the switch 203 is selected in accordance with the potential of a signal supplied to the wiring 212.

The switch 204 has a function of controlling electrical connection between a wiring 214 and the wiring 209 in accordance with the potential of the node FD2. Specifically, when the switch 204 is on, the wiring 214 and the wiring 209 are electrically connected to each other. When the switch 204 is off, the wiring 214 and the wiring 209 are electrically separated from each other.

Note that the high-level potential VDD is applied to the wiring 208 and the low-level potential VSS is applied to the wiring 214. When configuration data is to be written into the memory cell 200, the potential of the first signal and the potential of the second signal are opposite in polarity, that is, have inverted logic levels. Thus, when one of the switches 202 and 204 is on, the other is off. Which of the switches 202 and 204 is on depends on the potentials of the first and second signals, that is, configuration data. Accordingly, whether the potential applied to the wiring 209 is the high-level potential VDD or the low-level potential VSS depends on the configuration data.

The switch 205 has a function of controlling electrical connection between the wiring 209 and the wiring 215. Specifically, when the switch 205 is on, the wiring 209 and the wiring 215 are electrically connected to each other, and the potential of the wiring 209 is applied to the wiring 215. When the switch 205 is off, the wiring 209 and the wiring 215 are electrically separated from each other.

Note that in the configuration memory illustrated in FIG. 24, the transistors used as the switches 201 and 203 have a function of holding the potential of the node FD1 or the node FD2 and thus are preferably transistors with extremely small off-state current. A transistor in which a channel formation region is formed in a film of a semiconductor having a wider band gap and lower intrinsic carrier density than silicon has extremely small off-state current and thus is preferably used as the switches 201 and 203. Examples of such a semiconductor are an oxide semiconductor and gallium nitride that have a band gap more than twice as wide as that of silicon. A transistor including the semiconductor can have much smaller off-state current than a transistor including a normal semiconductor such as silicon or germanium. Consequently, the use of the transistors with the above structure as the switches 201 and 203 can prevent leakage of electric charge held at the node FD1 and the node FD2.

In the configuration memory in one embodiment of the present invention, one of the low-level potential VSS and the high-level potential VDD can be applied to the wiring 215 in accordance with configuration data. Thus, unlike in a configuration memory from which configuration data is read depending on whether or not one potential is applied to the wiring 215 to which configuration data is output, configuration data can be read correctly without precharging the wiring 215 before the configuration data is read from the memory cell 200. Consequently, a circuit for precharging is not necessarily provided in a circuit for driving the configuration memory; thus, the area of the programmable logic device can be small.

When configuration data is lost and the node FD1 and the node FD2 become floating after the PLD is powered on, setting both of the potentials of the first and second signals low can prevent the wirings 208 and 214 from being electrically connected to each other.

FIG. 24 illustrates an example of the structure of a multi-context configuration memory in which either one piece of configuration data stored in the two memory cells 200 is read from one wiring 215 by turning on the switch 205 in only one of the two memory cells 200. Alternatively, the configuration memory in one embodiment of the present invention may have a structure in which plural pieces of configuration data stored in the memory cells 200 are read from different wirings 215.

In the above-described structure, the latch 182 that has a function of keeping the potential of the wiring 215 high or low may be provided to be electrically connected to the wiring 215. In one embodiment of the present invention, with this structure, the potential of the wiring 215 can be kept high or low after power is turned on; thus, a shoot-through current can be prevented from being generated in a circuit connected to the wiring 215, such as a LUT or a multiplexer, after power is on.

Note that when the potential VDD of the wiring 210 is applied to the node FD1 through the switch 201, the node FD1 actually has a potential lower than the potential VDD by the threshold voltage of the transistor used as the switch 201. It is therefore difficult to raise the potential of the wiring 215 to the potential VDD, which the wiring 208 has, even when the switch 205 is turned on. However, providing the latch 182 allows the potential of the wiring 215 to be raised to the potential VDD and can prevent the wiring 215 from having an intermediate potential between the potential VSS and the potential VDD. When the potential VSS of the wiring 210 is applied to the node FD1 through the switch 201, the potential of the node FD1 is not lower than the potential VSS by the threshold voltage of the transistor used as the switch 201. Similarly, when the potential VSS of the wiring 211 is applied to the node FD2 through the switch 203, the potential of the node FD2 is not lower than the potential VSS by the threshold voltage of the transistor used as the switch 203. Accordingly, the switch 202 or the switch 204 can be certainly turned off, so that a shoot-through current does not flow through the switch 202 or the switch 204.

In the case where an n-channel transistor is used as the switch 201 as described above, it is easy to make the node FD1 have the potential VSS but it is difficult to make the node FD1 have the potential VDD in light of the threshold voltage of the transistor. For this reason, if a p-channel transistor is used as the switch 202, it is difficult to turn off the switch 202 completely and a shoot-through current is likely to flow through the switch 202. Consequently, in the case where an n-channel transistor is used as the switch 201, an n-channel transistor is preferably used as the switch 202 in order to prevent shoot-through current. The same can be applied to the switches 203 and 204. In other words, in the case where an n-channel transistor is used as the switch 203, an n-channel transistor is preferably used as the switch 204 in order to prevent shoot-through current.

In addition, in the case where a p-channel transistor is used as the switch 201, it is easy to make the node FD1 have the potential VDD but it is difficult to make the node FD1 have the potential VSS in light of the threshold voltage of the transistor. For this reason, if an n-channel transistor is used as the switch 202, it is difficult to turn off the switch 202 completely and a shoot-through current is likely to flow through the switch 202. Consequently, in the case where a p-channel transistor is used as the switch 201, a p-channel transistor is preferably used as the switch 202 in order to prevent shoot-through current. The same can be applied to the switches 203 and 204. In other words, in the case where a p-channel transistor is used as the switch 203, a p-channel transistor is preferably used as the switch 204 in order to prevent shoot-through current.

In the above-described structure, a wiring 216 supplied with a predetermined potential and a switch 217 that controls electrical connection between the wiring 216 and the wiring 215 may be additionally provided. In one embodiment of the present invention, with this structure, the potential of the wiring 215 can be initialized to be at a predetermined level. Thus, even if the potential of the wiring 215 becomes floating and further even if configuration data is lost after the programmable logic device is powered off, malfunction of a LUT or a multiplexer included in an LE can be prevented after the programmable logic device is powered on.

In the configuration memory, when the wirings 210 and 211 are arranged in a direction along columns of LEs and cells of switch circuits and the wirings 212 and 213 are arranged in a direction across the above direction, a distance between the wiring 210 or the wiring 211 and the wiring 215, that is, a distance between the switch circuit and the LE can be prevented from increasing with an increase in the number of memory cells 200 related to one wiring 215 in a multi-context system. Thus, in a multi-context system, a load such as parasitic resistance or parasitic capacitance of a wiring that electrically connects a plurality of switch circuits and the LE can be prevented from increasing, and the size of the switch circuit can be prevented from increasing.

Figure 25:
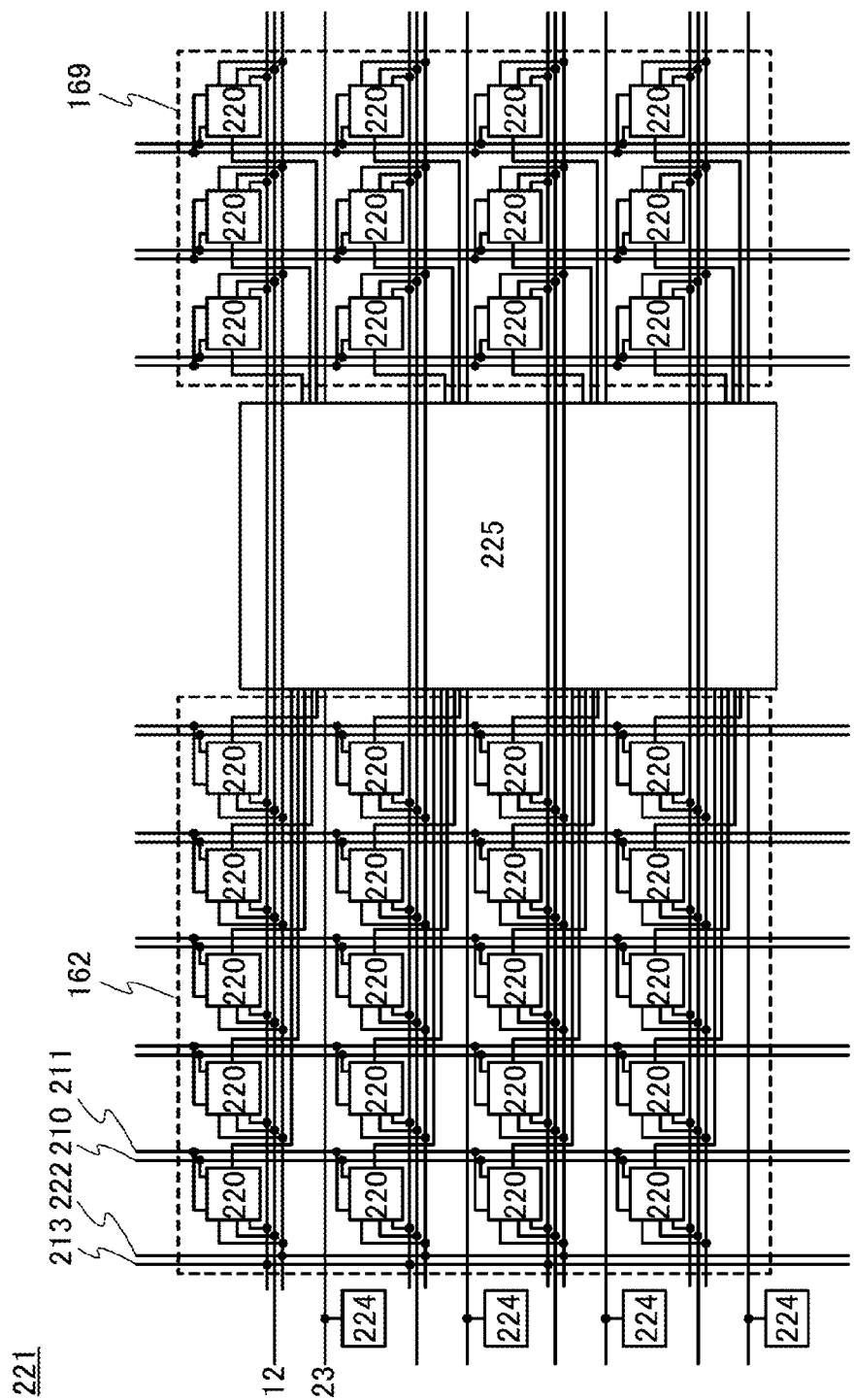
FIG. 25 illustrates an example of a structure of a logic element.

Next, using a configuration memory including a plurality of groups 220 each having the two memory cells 200, the latch 182, the switch 217, and the wiring 216 illustrated in FIG. 24 as an example, FIG. 25 illustrates one example of connections between the groups 220 in a logic element.

An LE 221 illustrated in FIG. 25 includes the configuration memory 162 composed of a plurality of groups 220, the configuration memory 169 composed of a plurality of groups 220, a logic cell 225, and a latch 224.

The logic cell 225 includes a LUT, a multiplexer, a flip-flop, and the like. The configuration memory 162 stores configuration data input to the LUT in the logic cell 225. The configuration memory 169 stores configuration data input to the multiplexer in the logic cell 225.

A signal including data applied to a wiring 223 is input to the LUT in the logic cell 225. The latch 224 for holding data is connected to the wiring 223.

The signal INIT for controlling switching of the switch 217 is input to a wiring 222.

Figure 28:
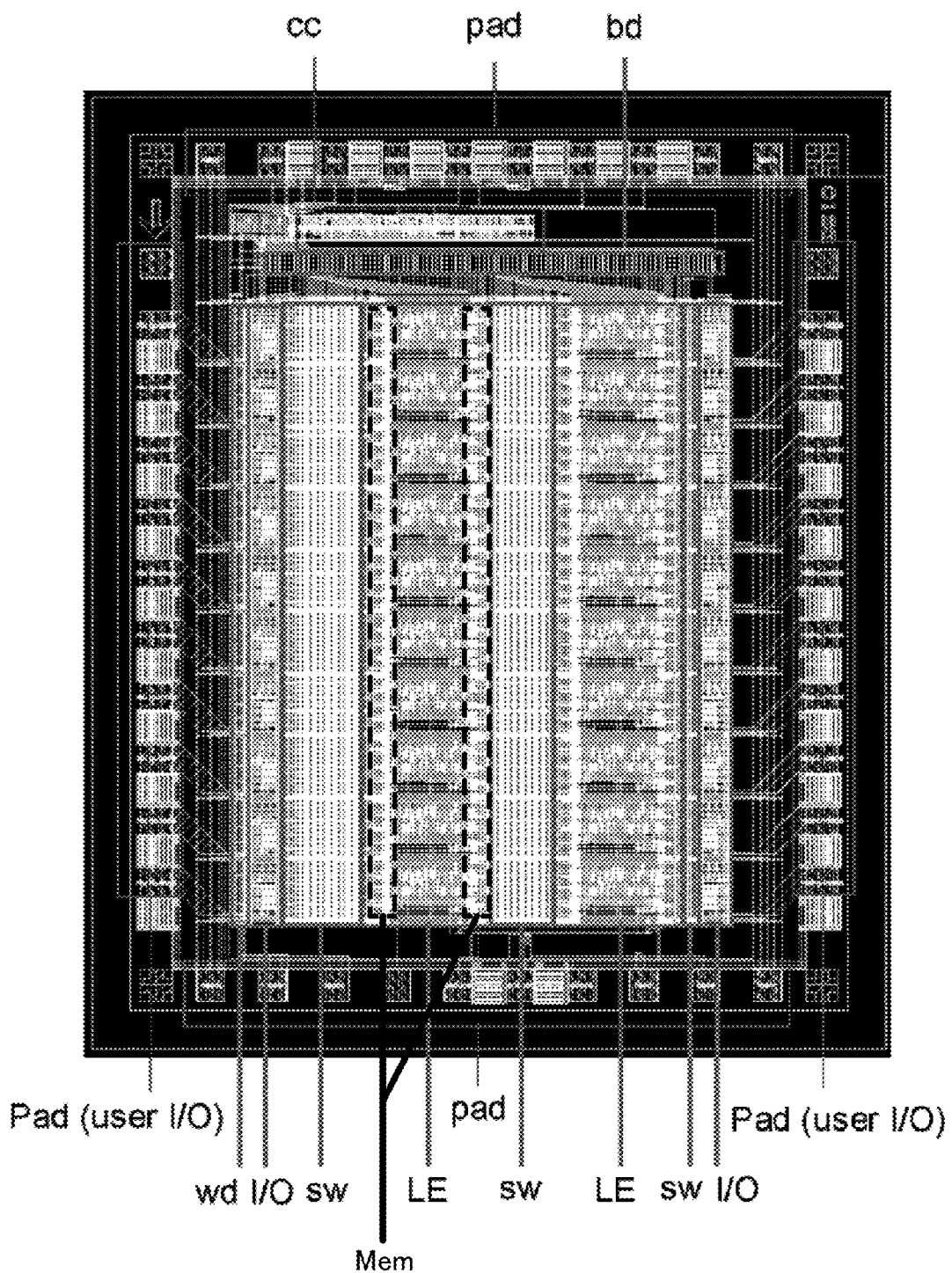
FIG. 28 shows a mask pattern of a PLD.

In one embodiment of the present invention, the LEs 221 are arranged in columns, so that the configuration memories 162 and the configuration memories 169 are arranged in rows and columns, for example, in rows and columns (Mem) illustrated in FIG. 28. Thus, the configuration memories 162 and 169 can be arranged at high density, and the layout area of the PLD can be reduced.

Next, an example of the structure of an IO including the plurality of groups 220 will be described with reference to FIG. 26. An IO 230 illustrated in FIG. 26 includes groups 220a to 220d, the latch 224, ExOR circuits 231a and 231b, a three-state buffer 232, an inverter 233, a buffer 234, and a terminal 236.

An output signal of the group 220a, specifically a signal having a potential applied to the wiring 215 in FIG. 24 is input to the ExOR circuit 231a. A signal including data is input to the ExOR circuit 231a from a wiring 213a. An output signal of the ExOR circuit 231a is input to the three-state buffer 232 as a signal A including data.

An output signal of the group 220b, specifically a signal having a potential applied to the wiring 215 in FIG. 24 is input to the ExOR circuit 231b. A signal including data is input to the ExOR circuit 231b from a wiring 213b. An output signal of the ExOR circuit 231b is input to the three-state buffer 232 as a signal EN for determining whether the impedance of the three-state buffer 232 is set high or not.

The ExOR circuits 231a and 231b have a function of inverting the polarity of signals from the wiring 213a and the wiring 213b in accordance with configuration data stored in the group 220a and the group 220b. The ExOR circuits 231a and 231b that invert the polarity of input signals in accordance with configuration data are provided in the IO as described above, whereby an intended arithmetic circuit can be achieved with a smaller number of LEs, and as a result, a large-scale circuit can be configured as the whole PLD. Since an intended arithmetic circuit can be configured with a small number of LEs, supply of power to an LE that is not used for the arithmetic circuit can be stopped to stop operation of the LE; thus, power consumption of the PLD can be reduced. Similarly, the ExOR circuits 231a and 231b that invert the polarity of input signals may be provided on the input side of the LEs.

An output signal of the group 220d, specifically a signal having a potential applied to the wiring 215 in FIG. 24 is inverted in polarity by the inverter 233 and then input to the three-state buffer 232 as a signal OD. The output signal of the group 220d has a function of controlling whether to make the output of the three-state buffer 232 an open drain output or not. In other words, when the potential of the output signal of the group 220d is low, the three-state buffer 232 operates as a normal three-state buffer. When the potential of the output signal of the group 220d is high, the potential of the signal A is low, and the potential of the signal EN is high, an output terminal of the three-state buffer 232 has a low-level potential. When the potential of the output signal of the group 220d is high and the potentials of the signal A and the signal EN are different from the above combination (i.e., except when the potential of the signal A is low and the potential of the signal EN is high), the three-state buffer 232 has high impedance.

When a pull-up resistor is provided outside the three-state buffer 232, the potential of the output signal from the three-state buffer 232 can be high even if the three-state buffer 232 has high impedance. With the use of the IO 230 in which a pull-up resistor is provided outside the three-state buffer 232, semiconductor devices with different power supply voltages can be electrically connected through the IO 230.

Figure 27:
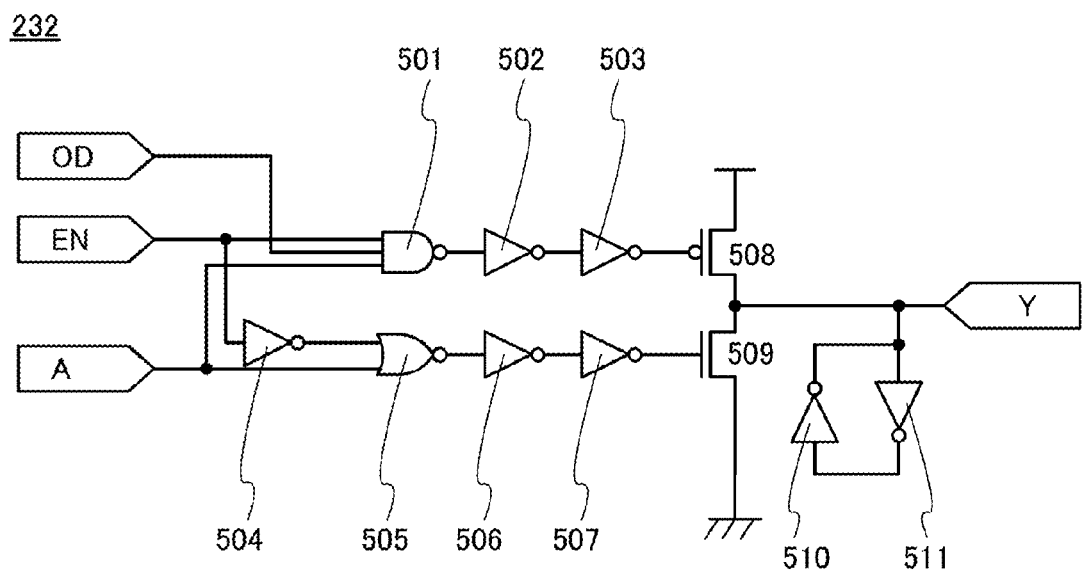
FIG. 27 is a circuit diagram of a three-state buffer.

FIG. 27 illustrates an example of the structure of the three-state buffer 232. The three-state buffer 232 illustrated in FIG. 27 includes a NAND circuit 501 to which the signal OD, the signal EN, and the signal A are input; an inverter 502 to which an output signal of the NAND circuit 501 is input; an inverter 503 to which an output signal of the inverter 502 is input; and a p-channel transistor 508 to which an output signal of the inverter 503 is input. The three-state buffer 232 also includes an inverter 504 to which the signal EN is input, a NOR circuit 505 to which an output signal of the inverter 504 and the signal A are input, an inverter 506 to which an output signal of the NOR circuit 505 is input, an inverter 507 to which an output signal of the inverter 506 is input, and an n-channel transistor 509 to which an output signal of the inverter 507 is input.

Drains of the p-channel transistor 508 and the n-channel transistor 509 are connected to each other, and the potential of the drains is output from the three-state buffer 232 as an output signal Y.

An output terminal of an inverter 510 and an input terminal of an inverter 511 are connected to the drains of the p-channel transistor 508 and the n-channel transistor 509. An input terminal of the inverter 510 is connected to an output terminal of the inverter 511.

The inverters 502 and 503 function as a buffer and are not necessarily provided in the three-state buffer 232. The inverters 506 and 507 function as a buffer and are not necessarily provided in the three-state buffer 232.

An output signal of the three-state buffer 232 is applied to the terminal 236.

A signal input to the IO 230 from the terminal 236 is input to a switch circuit through the buffer 234.

Figure 26:
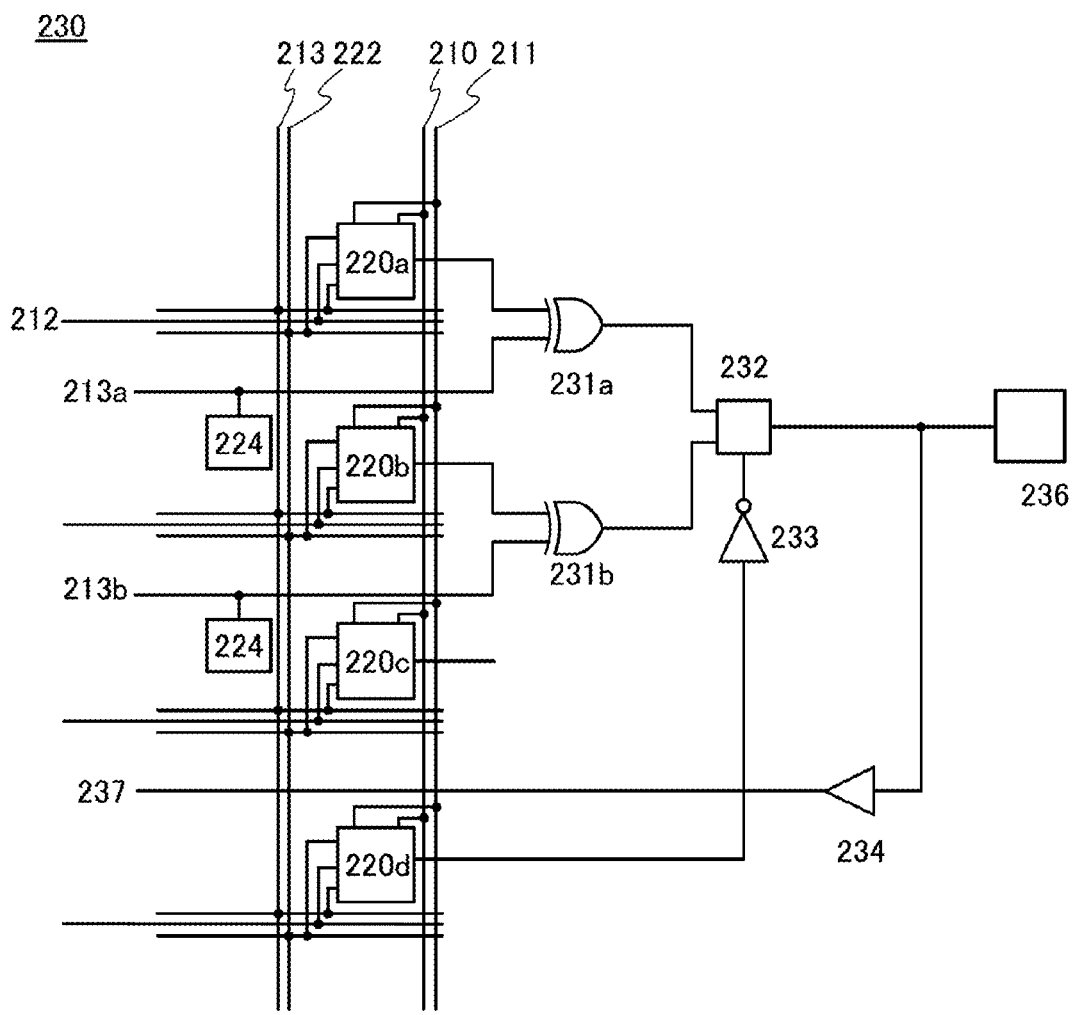
FIG. 26 illustrates an example of a structure of an IO.

Note that FIG. 26 illustrates an example where the group 220c is provided in the IO 230 as a dummy group. In the case of providing the group 220c, a function can be added to the groups 220 with minor mask revision, and the pattern periodicity of the mask layout for the groups 220 can be increased as compared to the case of not providing the group 220c. In the case where the pattern periodicity of a mask is low, shape defects are likely to occur in a photolithography process using the mask because of interference of light emitted from a light exposure apparatus, for example, the width of a conductive film, an insulating film, a semiconductor film, or the like processed by photolithography is partly narrow. However, in FIG. 26, providing the group 220c can increase the pattern periodicity of the mask layout for the groups 220, thereby preventing defective shapes of a conductive film, an insulating film, or a semiconductor film after the photolithography process.

<Mask Pattern of PLD>

FIG. 28 illustrates a mask pattern of the PLD in one embodiment of the present invention. In FIG. 28, a column (denoted by LE) of logic elements is provided between columns (each denoted by sw) of switch circuits. Moreover, the column of switch circuits is provided between a column (denoted by IO) of I/O elements and the column of logic elements.

In FIG. 28, a logic element including a plurality of configuration memories, such as that illustrated in FIG. 16C, is used. The plurality of configuration memories are arranged in rows and columns (denoted by Mem). In one embodiment of the present invention, the logic elements, the IO elements, and the switch circuits are provided to form columns; thus, the configuration memories included in the logic elements are likely to be arranged in rows and columns at high density. Thus, in the PLD in one embodiment of the present invention, as illustrated in FIG. 28, both driver circuits (denoted by bd and wd) for controlling operation of the switch circuits and the configuration memories can be provided around a region where the logic elements, the IO elements, and the switch circuits are positioned. When the configuration memories and the switch circuits are regarded as a memory cell array, it can be considered that a region where the memory array is positioned overlaps with a region where the LEs are arranged; therefore, in one embodiment of the present invention, the layout area of the PLD can be reduced with the above structure. Note that in the mask pattern of the PLD in FIG. 28, "Pad" denotes terminals and "cc" denotes a controller for controlling the operation of the driver circuit bd, the driver circuit wd, and the like.

Unlike in FIG. 28, in the case where configuration memories are not arranged in rows and columns, the layout of lead wirings that electrically connect a driver circuit and the configuration memories is complicated. A plurality of driver circuits may be provided for small regions of the configuration memories, in which case the layout of wirings for supplying control signals to each driver circuit is complicated.

Figure 29:
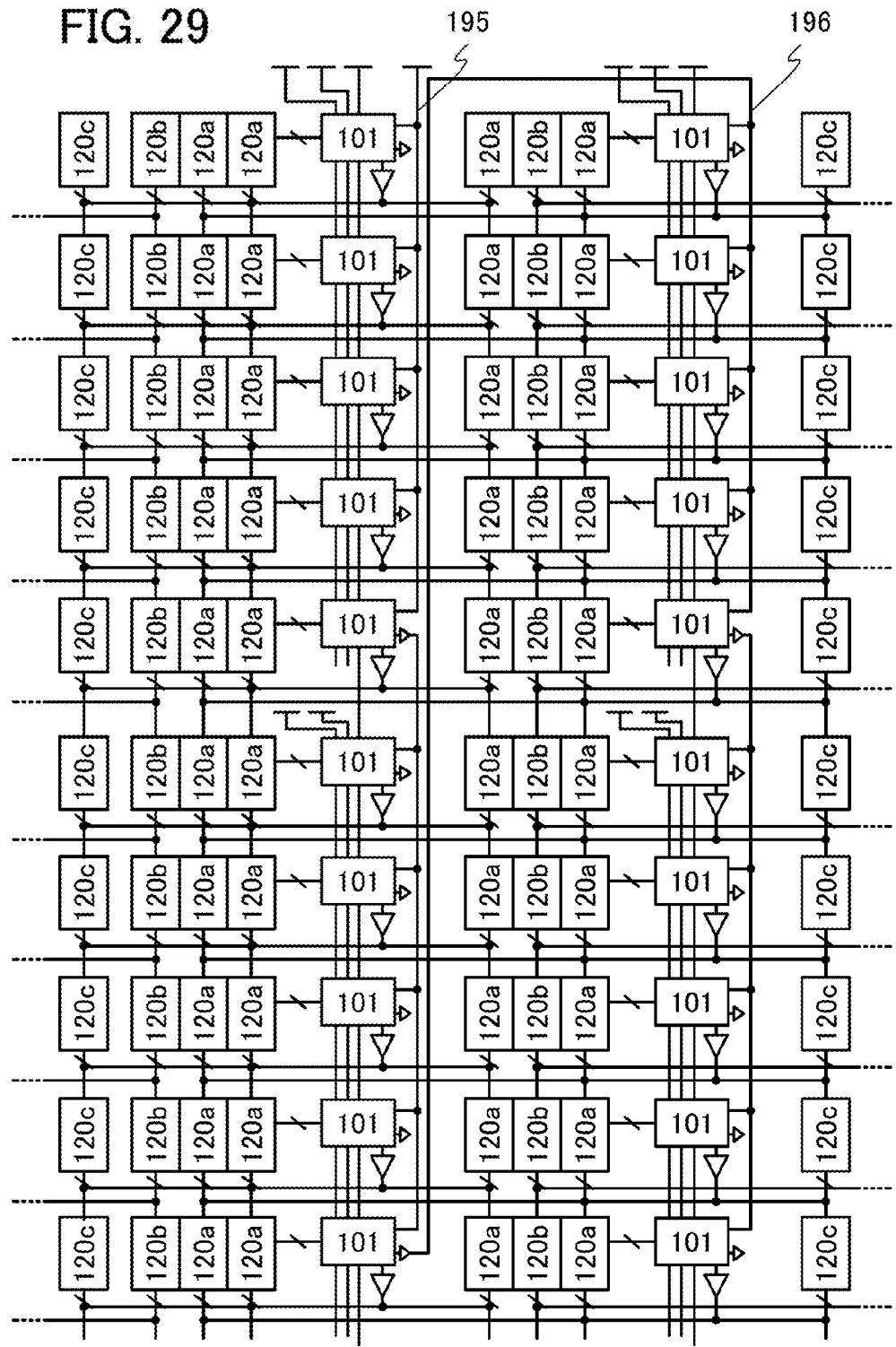
FIG. 29 illustrates an example of a structure of a PLD.

FIG. 29 illustrates an example of connections between the LEs 101 and the switch circuits 120a to 120c. In FIG. 29, switch circuits 120 that control electrical connection between output terminals of the LEs 101 and input terminals of the LEs 101 are the switch circuits 120a. Switch circuits 120 that control electrical connection between output terminals of IOs (not illustrated) and the input terminals of the LEs 101 are the switch circuits 120b. Switch circuits 120 that control electrical connection between the output terminals of the LEs 101 and input terminals of the IOs (not illustrated) are the switch circuits 120c.

As illustrated in FIG. 29, in one embodiment of the present invention, a wiring 195 and a wiring 196 to which output signals of the LEs 101 are applied are arranged between adjacent LEs 101. This structure allows the length of wirings from the LEs 101 to the switch circuits 120 to be short. Thus, the current supply capability of a buffer on the output side of the LEs 101 does not need to be high, so that the size of the buffer can be small.

Wirings through which output signals are supplied to adjacent LEs without through the switch circuits are also provided. These wirings are effective in configuring a shift register, an adder circuit, a subtractor circuit, or the like with a plurality of LEs. When a 1-bit half adder circuit or full adder circuit is added to the LE, an intended arithmetic circuit can be configured with a smaller number of LEs, for example, an adder circuit or a subtractor circuit that is generally composed of a plurality of LEs can be configured by one LE.

In the case where LEs are arranged in columns and adjacent LEs are connected without through the switch circuits, unlike in a PLD disclosed in U.S. Pat. No. 4,870,302, wirings between the LEs can be shortened.

<Comparison Between Cells>

Next, the description is made on differences in operation between a cell that includes a transistor using an OS film and a cell that includes a transistor using a silicon (Si) film and a pair of inverters.

FIG. 30 illustrates circuit diagrams of a cell 140a including a transistor using an OS film and a cell 140b including transistors using a silicon (Si) film and a pair of inverters. FIG. 30 also shows timing charts of the potential of the node FD in the cells 140a and 140b and the potential of a signal IN that includes configuration data and is supplied to the wiring 121.

In each of the cells 140a and 140b, the on/off state of the transistor 131t is controlled with the potential of the wiring 122, and a potential that corresponds to configuration data and is supplied from the wiring 121 is held at the node FD to control the on/off state of the transistor 130t. Note that the timing charts in FIG. 30 show an example where the transistor 130t is an n-channel transistor.

In the cell 140b, the potential of the node FD is held by the inverters 180 and 181. On the other hand, in the cell 140a, the potential of the node FD is held using extremely small off-state current of the transistor 131t including an OS film. Accordingly, when the transistor 131t is off in the cell 140a, the node FD serves as a floating electrode with excellent insulating property between other electrodes or wirings. For this reason, the cell 140a can hold the potential of the node FD with a smaller number of transistors than the cell 140b.

Since the node FD becomes floating in the cell 140a when the transistor 131t is off, the boosting effect described below can be expected. Specifically, when the node FD is floating in the cell 140a, the potential of the node FD is increased by a capacitance Cgs generated between the source and the gate of the transistor 130t as the potential of the signal IN changes from low level to high level. The increase in the potential of the node FD depends on the logic level of configuration data input to the gate of the transistor 130t. Specifically, when configuration data written into the cell 140a is "0", the transistor 130t is in a weak inversion mode, so that the capacitance Cgs that contributes to an increase in the potential of the node FD includes a capacitance Cos that is independent of the potential of the gate electrode, that is, the potential of the node FD. The capacitance Cos specifically includes overlap capacitance generated in a region where the gate electrode and the source region overlap with each other, and parasitic capacitance generated between the gate electrode and the source electrode. On the other hand, when configuration data written into the cell 140a is "1", the transistor 130t is in a strong inversion mode, so that the capacitance Cgs that contributes to an increase in the potential of the node FD includes, in addition to the capacitance Cos, a capacitance Cod generated between the gate electrode and the drain electrode and part of a capacitance Cox generated between a channel formation region and the gate electrode. Thus, the capacitance Cgs of the transistor 130t that contributes to an increase in the potential of the node FD is larger with the configuration data "1" than with the configuration data "0". Consequently, the cell 140a storing configuration data "1" can have a larger boosting effect than the cell 140a storing configuration data "0"; by the boosting effect, the potential of the node FD is increased with a change in the potential of the signal N. With the boosting effect, the switching speed of the cell 140a increases when the configuration data is "1", and the transistor 130t is turned off when the configuration data is "0".

In a switch included in a routing resource of a general PLD, an n-channel transistor is used in order to increase integration density. The switch, however, has a problem of reduction in switching speed because the potential of a signal passing through a gate of the n-channel transistor is lowered due to the threshold voltage. There has been suggested a method in which overdriving (driving with high potential application to a gate of an n-channel transistor) is used to increase the switching speed; however, employing this method might degrade the reliability of the n-channel transistor used in the switch. In contrast, in one embodiment of the present invention, when the configuration data is "1", the boosting effect can increase the switching speed of the cell 140a without using overdriving; consequently, it is not necessary to sacrifice the reliability to increase the switching speed.

In the cell 140b, the potential of the node FD is increased with the boosting effect but returned to the previous potential immediately by the inverters 180 and 181. As a result, the cell 140b cannot gain the benefit of higher switching speed contributing to the boosting effect.

Unlike in Reference 1 (K. C. Chun, P. Jain, J. H. Lee, and C. H. Kim, "A 3T Gain Cell Embedded DRAM Utilizing Preferential Boosting for High Density and Low Power On-Die Caches", IEEE Journal of Solid-State Circuits, vol. 46, no. 6, pp. 1495-1505, June 2011) and Reference 2 (F. Eslami and M. Sima, "Capacitive Boosting for FPGA Interconnection Networks", Int. Conf. on Field Programmable Logic and Applications, 2011, pp. 453-458), the cell 140a is expected to have another advantageous effect.

Since Reference 1 is based on the premise that a DRAM is used, the number of memory cells is large, and a read bit line (RBL) connected to an output terminal of the memory cell has large parasitic capacitance. In contrast, in the cell 140a, a signal OUT is supplied to a gate of a CMOS, so that the parasitic capacitance of the output of the cell 140a is smaller than that in Reference 1. Thus, the cell 140a also provides a secondary boosting effect such that the potential of the signal OUT is increased by the capacitance Cod generated between the drain and the gate and an increase in the potential of the node FD due to the capacitance Cgs of the transistor 130t. In other words, when the cell 140a is used as a switch circuit for controlling connection between wirings, the switching speed is further increased because of the secondary boosting effect. In addition, the cell 140a can hold the increased potential of the node FD with fewer transistors than in Reference 2.

To verify the above-described boosting effect, two kinds of 101-stage ring oscillator (RO) circuit TEGs that included the cell 140a or the cell 140b at an output terminal of each stage were fabricated, and the delay time of the cell 140a or the cell 140b was evaluated from the oscillation frequency. The channel widths W of an n-channel transistor and a p-channel transistor of an inverter included in the RO circuit TEG were 16 μm and 32 μm, respectively. The channel widths W of the transistors 130t included in the cells 140a and 140b were 16 μm. The channel width W of the transistor 131t included in the cell 140a was 4 μm, and that of the transistor 131t included in the cell 140b was 8 μm. The channel widths W of an n-channel transistor and a p-channel transistor included in the inverters 180 and 181 in the cell 140b were 4 μm and 8 μm, respectively. The channel lengths L of all the n-channel and p-channel transistors including a silicon film were 0.5 μm. As the transistor 131t in the cell 140a, a transistor that includes a CAAC-OS film containing an In—Ga—Zn-based oxide and has a channel length L of 1 μm was used. The transistor 131t was stacked over the transistor including a silicon film.

The delay time per stage of the RO with respect to an overdrive voltage that is a difference between a power supply voltage ($VDD_{RO}$) in the RO circuit TEG and a power supply voltage ($VDD_{MEM}$) in the inverters 180 and 181 of the cell 140b was measured. Note that the difference between a high-level potential and a low-level potential supplied to the wirings 121 and 122 corresponds to $VDD_{MEM}$.

Figure 31:
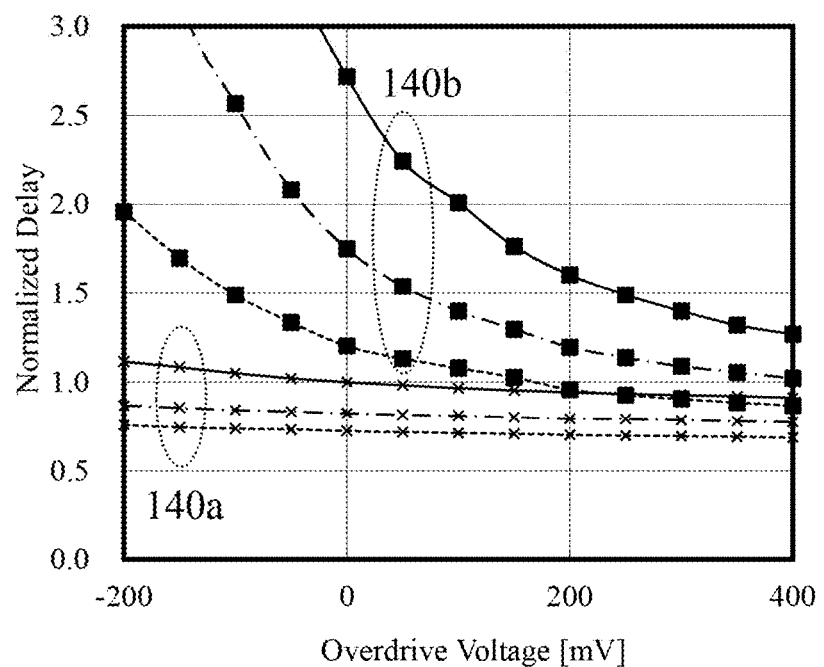
FIG. 31 shows a relation between overdrive voltage and delay time.

FIG. 31 shows the measurement results of the delay time. In FIG. 31, the horizontal axis represents overdrive voltage (mV) and the vertical axis represents delay time per stage of the RO. Note that in FIG. 31, the delay time on the vertical axis is relative to a measured delay time with $VDD_{RO}$ of 2.00 V and an overdrive voltage of 0 V. In FIG. 31, solid lines represent a delay time with $VDD_{RO}$ of 2.00 V; dashed-dotted lines, a delay time with $VDD_{RO}$ of 2.25 V; and chain lines, a delay time with $VDD_{RO}$ of 2.50 V.

As shown in FIG. 31, it is confirmed that the delay time of the RO circuit including the cell 140a is shorter than that of the RO circuit including the cell 140b, and that the delay time depends on the structures of the cells 140a and 140b.

Further, FIG. 31 shows that in the cell 140b, the overdrive effect of increasing the switching speed by an increase in overdrive voltage is more pronounced with lower $VDD_{RO}$. However, the switching speed of the cell 140b is not higher than that of the cell 140a even when an overdrive voltage of more than 20% of $VDD_{RO}$ is applied. Note that when configuration data is written into the cell 140a, the potential of the node FD is lowered due to the threshold voltage of the transistor 131t and thus becomes lower than $VDD_{MEM}$. Nevertheless, it is worth noting that the cell 140a to which the overdrive voltage is not applied achieves a higher switching speed than the cell 140b to which the overdrive voltage is applied.

It is also confirmed that with the same overdrive voltage, power consumption of the RO circuit including the cell 140a is smaller than that of the RO circuit including the cell 140b.

By SPICE simulation for the RO circuit TEG, the increase in the potential of the node FD with an increase in the potential of the signal IN in the RO circuit including the cell 140a was evaluated. In the calculation, $VDD_{RO}$ was 2.5 V. The calculation results show that with an increase in the potential of the signal IN, the potential of the node FD is increased by 0.75 V when the configuration data is "1" and by 0.07 V when the configuration data is "0".

As shown above, a semiconductor device including the cell 140a achieves high performance such as low power consumption and high switching speed even when the semiconductor device uses a single power supply voltage without using overdrive voltage.

Figure 32:
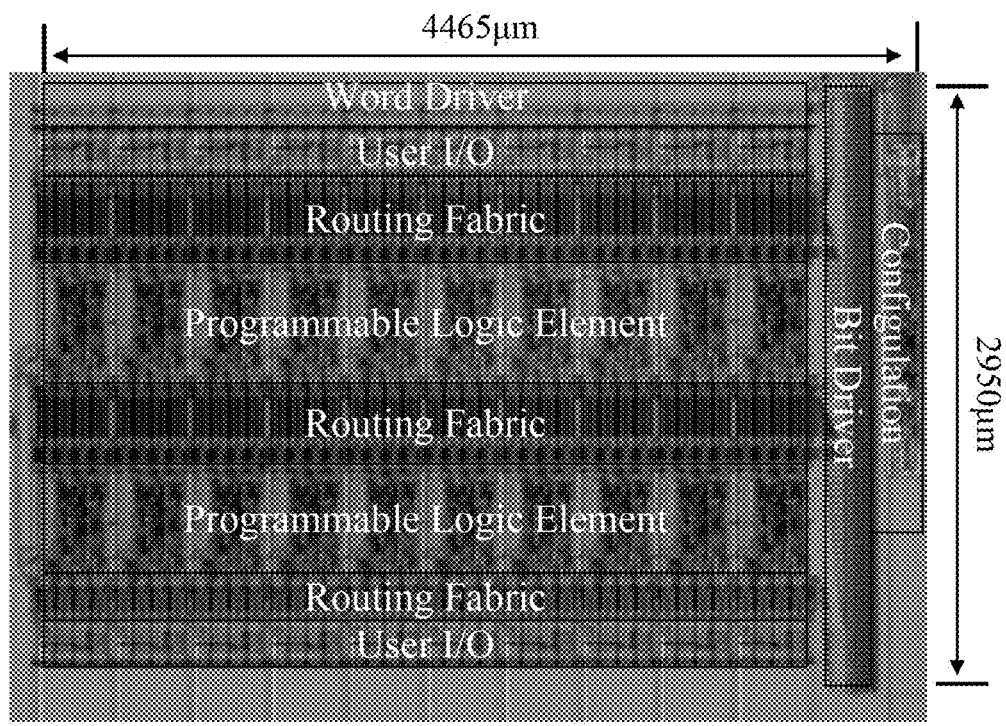
FIG. 32 is a micrograph of a PLD.

FIG. 32 is a micrograph of a fabricated PLD. In FIG. 32, regions corresponding to driver circuits (a bit driver and a word driver) for controlling operation of switch circuits and configuration memories, routing resources (routing fabrics) including the switch circuits and wirings, IO elements (user IOs), a controller (configuration controller), and PLEs (programmable logic elements) are surrounded by rectangles.

In the fabricated PLD, the configuration memory includes a transistor including a CAAC-OS film containing an In—Ga—Zn-based oxide. In the PLD, the switch circuit includes the cell 140a, and the transistor 131t included in the cell 140a includes a CAAC-OS film containing an In—Ga—Zn-based oxide.

The PLD illustrated in FIG. 32 includes 20 PLEs, 7520 memory cells in the configuration memory, and the IOs having 20 terminals. The PLE is equipped with standard functions. The transistor including the CAAC-OS film is stacked over a transistor including a silicon film. The channel length L of all the n-channel and p-channel transistors including a silicon film are 0.5 μm. The channel length L of the transistor including the CAAC-OS film containing an In—Ga—Zn-based oxide is 1 μm.

For comparison, a PLD in which an SRAM is used as a configuration memory and a switch circuit includes the cell 140b is fabricated. In the PLD including the cells 140a, the layout area of the switch circuits, the area of the routing resources, and the area of the whole PLD are smaller than those of the comparative PLD by 60%, 52%, and about 22%, respectively.

It was confirmed that in the PLD fabricated using the cells 140a, various circuits such as a count up/down circuit and a shift circuit operate normally, for example, with a single power supply voltage of 2.5 V at a frequency of 50 MHz. In the PLD including the cells 140a, data retention operation and normally-off operation (in which supply of the power supply voltage is interrupted intermittently after needed data is stored in a storage device) were also confirmed.

Figure 33:
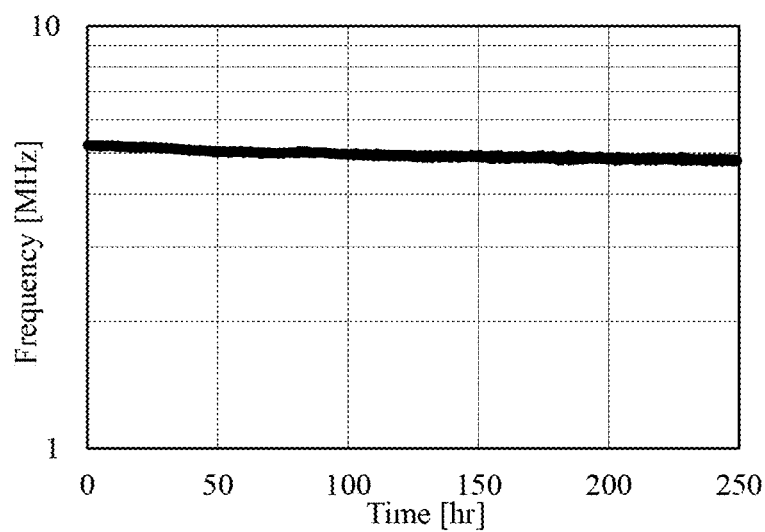
FIG. 33 shows change with time of oscillation frequency of a ring oscillator.

FIG. 33 shows change with time of the oscillation frequency of a 13-stage ring oscillator that is configured with 13 PLEs in the PLD including the cells 140a. A 250-hour measurement at room temperature does not show a significant decrease in oscillation frequency. This indicates that the configuration memory in the PLD fabricated using the cells 140a has good data retention characteristics.

<Examples of Electronic Device>

The semiconductor device or the programmable logic device in one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the semiconductor device or the programmable logic device in one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 34A to 34F illustrate specific examples of these electronic devices.

Figure 34A:
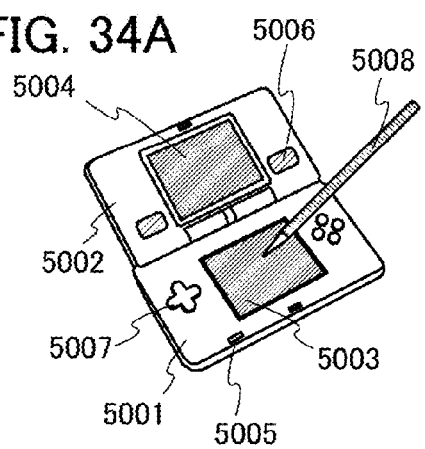
FIGS. 34A to 34F each illustrate an electronic device.

FIG. 34A illustrates a portable game console including a housing 5001, a housing 5002, a display portion 5003, a display portion 5004, a microphone 5005, a speaker 5006, an operation key 5007, a stylus 5008, and the like. Note that although the portable game console illustrated in FIG. 34A has the two display portions 5003 and 5004, the number of display portions included in the portable game console is not limited to two.

Figure 34B:
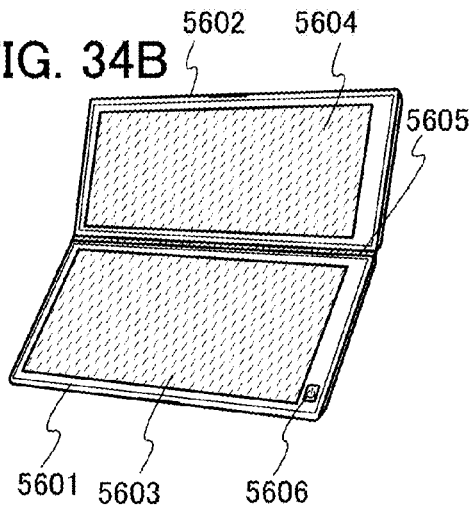

FIG. 34B illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 34C:
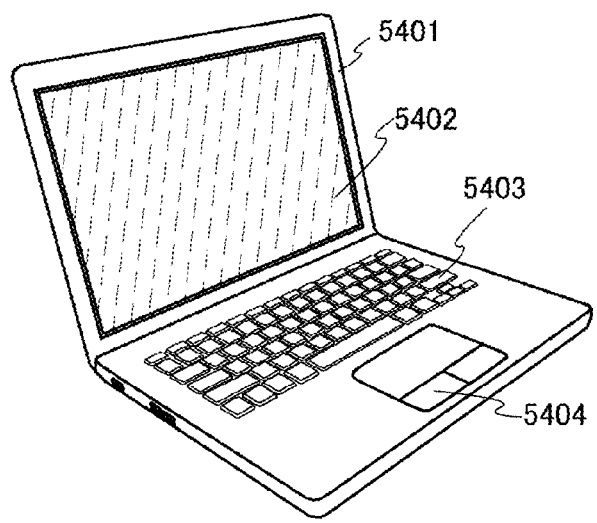

FIG. 34C illustrates a laptop including a housing 5401, a display portion 5402, a keyboard 5403, a pointing device 5404, and the like.

Figure 34D:
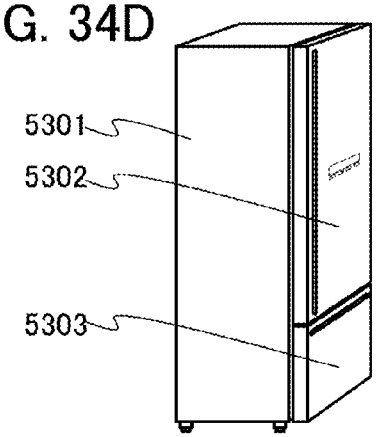

FIG. 34D illustrates an electric refrigerator-freezer including a housing 5301, a refrigerator door 5302, a freezer door 5303, and the like.

Figure 34E:
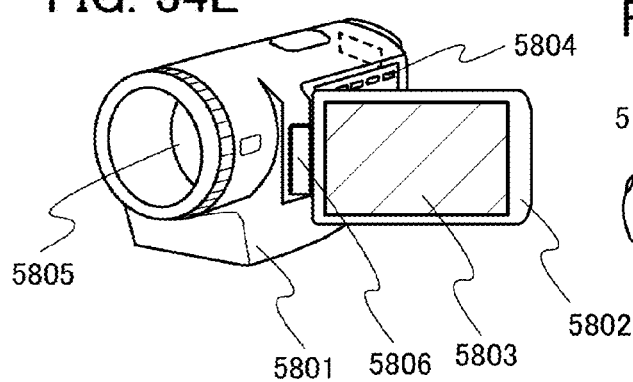

FIG. 34E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 34F:
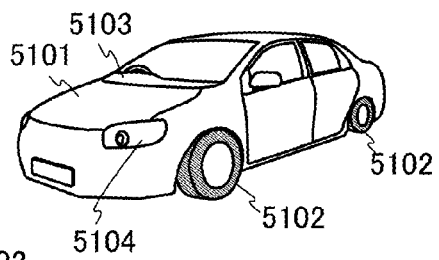

FIG. 34F illustrates a passenger car including a car body 5101, wheels 5102, a dashboard 5103, lights 5104, and the like.

EXPLANATION OF REFERENCE

31: multiplexer, 32: multiplexer, 33: multiplexer, 34: multiplexer, 35: multiplexer, 36: multiplexer, 37: multiplexer, 41: multiplexer, 42: multiplexer, 43: multiplexer, 44: OR circuit, 100: PLD, 101: LE, 102: column, 102-1: column, 102-2: column, 102-3: column, 103: wiring, 104: wiring, 104-1: wiring, 104-2: wiring, 104-3: wiring, 105: wiring, 105-1: wiring, 105-2: wiring, 105-3: wiring, 106: wiring, 106-1: wiring, 106-2: wiring, 106-3: wiring, 107: wiring, 108: wiring, 109: wiring, 110: switch circuit, 111: wiring, 111-1: wiring, 111-2: wiring, 111-3: wiring, 120: switch circuit, 120-1: switch circuit, 120-2: switch circuit, 120-3: switch circuit, 120a: switch circuit, 120b: switch circuit, 120c: switch circuit, 121: wiring, 122: wiring, 122-1: wiring, 122-2: wiring, 122-3: wiring, 122-n: wiring, 123: wiring, 123-1: wiring, 123-n: wiring, 125: wiring, 126: switch, 126t: transistor, 127: wiring, 128: wiring, 131: switch, 131t: transistor, 130: switch, 130t: transistor, 132: capacitor, 133t: transistor, 140: cell, 140-1: cell, 140-2: cell, 140-3: cell, 140-4: cell, 140-n: cell, 150: IO, 151: column, 152: wiring, 153: wiring, 154: wiring, 155: wiring, 156: wiring, 157: switch, 160: LUT, 161: flip-flop, 162: configuration memory, 163: input terminal, 164: output terminal, 165: output terminal, 166: AND circuit, 168: multiplexer, 169: configuration memory, 170: logic array, 172: PLL, 173: RAM, 174: multiplier, 175: routing resource, 180: inverter, 181: inverter, 182: latch, 183: inverter, 184: transistor, 185: wiring, 195: wiring, 196: wiring, 200: memory cell, 201: switch, 202: switch, 203: switch, 204: switch, 205: switch, 206: capacitor, 207: capacitor, 208: wiring, 209: wiring, 210: wiring, 211: wiring, 212: wiring, 213: wiring, 213a: wiring, 213b: wiring, 214: wiring, 215: wiring, 216: wiring, 217: switch, 220: group, 220a: group, 220b: group, 220c: group, 220d: group, 221: LE, 222: wiring, 223: wiring, 224: latch, 225: logic cell, 230: IO, 231a: ExOR circuit, 231b: ExOR circuit, 232: three-state buffer, 233: inverter, 234: buffer, 236: terminal, 400: semiconductor substrate, 401: element isolation insulating film, 402: impurity region, 403: impurity region, 404: gate electrode, 405: gate insulating film, 409: insulating film, 410: wiring, 411: wiring, 412: wiring, 415: wiring, 416: wiring, 417: wiring, 420: insulating film, 421: wiring, 430: semiconductor film, 431: gate insulating film, 432: conductive film, 433: conductive film, 434: gate electrode, 435: conductive film, 440: insulating film, 441: insulating film, 442: insulating film, 443: conductive film, 501: NAND circuit, 502: inverter, 503: inverter, 504: inverter, 505: NOR circuit, 506: inverter, 507: inverter, 508: p-channel transistor, 509: n-channel transistor, 510: inverter, 511: inverter, 601: transistor, 602: conductive film, 603: conductive film, 604: gate electrode, 605: insulating film, 606: insulating film, 607: oxide semiconductor film, 608: source electrode, 609: drain electrode, 610: insulating film, 611: gate electrode, 612: insulating film, 630: transistor, 631: semiconductor substrate, 632: element isolation insulating film, 633: p-well, 634: impurity region, 635: impurity region, 636: gate electrode, 637: gate insulating film, 638: insulating film, 639: wiring, 640: wiring, 641: wiring, 642: wiring, 643: insulating film, 645: wiring, 646: insulating film, 647: wiring, 648: wiring, 649: insulating film, 650: wiring, 651: insulating film, 652: wiring, 653: insulating film, 654: wiring, 655: insulating film, 656: wiring, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, 5806: joint This application is based on Japanese Patent Applications serial No. 2012-119929, No. 2012-229607, and No. 2013-008054 filed with Japan Patent Office on May 25, 2012; Oct. 17, 2012; and Jan. 21, 2013, respectively, the entire contents of which are hereby incorporated by reference.

The invention claimed is:

1. A programmable logic device comprising:
   first logic elements arranged in a first column;
   second logic elements arranged in a second column parallel to the first column;
   third logic elements arranged in a third column parallel to the first column and the second column, wherein the second column is between the first column and the third column;
   first wirings between the first column and the second column;
   second wirings between the first column and the second column;
   third wirings between the first column and the second column and between the second column and the third column;
   a first switch circuit between the first column and the second column; and
   a second switch circuit between the second column and the third column,
   wherein each of the first wirings, the second wirings, and the third wirings is electrically connected to one of the second logic elements through the first switch circuit,
   wherein one of the first wirings is electrically connected to an output terminal of one of the first logic elements,
   wherein one of the second wirings is electrically connected to an output terminal of one of the second logic elements,
   wherein each of the third wirings is electrically connected to one of the third logic elements through the second switch circuit,
   wherein the first switch circuit comprises a first switch and a second switch, and
   wherein the second switch is configured to control an electrical connection between the one of the second logic elements and any of the first wirings, the second wirings, and the third wirings in accordance with configuration data supplied to the second switch through the first switch.

2. The programmable logic device according to claim 1, further comprising:
   IO elements arranged in a fourth column parallel to the first column, the second column, and the third column, wherein the first column is between the second column and the fourth column;
   fourth wirings between the first column and the fourth column; and
   a third switch circuit between the first column and the fourth column,
   wherein the fourth wirings are electrically connected to the IO elements, and
   wherein each of the fourth wirings is electrically connected to one of the first logic elements through the third switch circuit.

3. The programmable logic device according to claim 1,
   wherein the first switch is a first transistor,
   wherein the second switch is a second transistor, and
   wherein the first transistor comprises a channel formation region in an oxide semiconductor film.

4. The programmable logic device according to claim 3, wherein the oxide semiconductor film comprises indium and zinc.

5. The programmable logic device according to claim 1,
   wherein the first switch circuit further comprises:
   a fourth wiring; and
   a third switch configured to control an electrical connection between the fourth wiring and the one of the second logic elements, and
   wherein the fourth wiring is configured to be supplied with a potential for initialization.

6. The programmable logic device according to claim 1,
   wherein another of the first wirings is electrically connected to an output terminal of another of the first logic elements, and
   wherein another of the second wirings is electrically connected to an output terminal of another of the second logic elements.

7. A programmable logic device comprising:
   first logic elements arranged in a first column;
   second logic elements arranged in a second column parallel to the first column;
   third logic elements arranged in a third column parallel to the first column and the second column, wherein the second column is between the first column and the third column;
   first wirings between the first column and the second column;
   second wirings between the first column and the second column;
   third wirings between the first column and the second column and between the second column and the third column;
   a first switch circuit between the first column and the second column; and
   a second switch circuit between the second column and the third column,
   wherein each of the first wirings, the second wirings, and the third wirings is electrically connected to one of the second logic elements through the first switch circuit,
   wherein one of the first wirings is electrically connected to an output terminal of one of the first logic elements,
   wherein one of the second wirings is electrically connected to an output terminal of one of the second logic elements,
   wherein each of the third wirings is electrically connected to one of the third logic elements through the second switch circuit,
   wherein the third wirings are provided around a top side or a bottom side of the second column,
   wherein the first switch circuit comprises a first switch and a second switch, and
   wherein the second switch is configured to control an electrical connection between the one of the second logic elements and any of the first wirings, the second wirings, and the third wirings in accordance with configuration data supplied to the second switch through the first switch.

8. The programmable logic device according to claim 7, further comprising:
   IO elements arranged in a fourth column parallel to the first column, the second column, and the third column, wherein the first column is between the second column and the fourth column;
   fourth wirings between the first column and the fourth column; and a third switch circuit between the first column and the fourth column, wherein the fourth wirings are electrically connected to the IO elements, and wherein each of the fourth wirings is electrically connected to one of the first logic elements through the third switch circuit.

9. The programmable logic device according to claim 7, wherein the first switch is a first transistor, wherein the second switch is a second transistor, and wherein the first transistor comprises a channel formation region in an oxide semiconductor film.

10. The programmable logic device according to claim 9, wherein the oxide semiconductor film comprises indium and zinc.

11. The programmable logic device according to claim 7, wherein the first switch circuit further comprises:

a fourth wiring; and a third switch configured to control an electrical connection between the fourth wiring and the one of the second logic elements, and wherein the fourth wiring is configured to be supplied with a potential for initialization.

12. The programmable logic device according to claim 7, wherein another of the first wirings is electrically connected to an output terminal of another of the first logic elements, and wherein another of the second wirings is electrically connected to an output terminal of another of the second logic elements.

13. A programmable logic device comprising:

first logic elements arranged in a first column;

second logic elements arranged in a second column;

third logic elements arranged in a third column;

fourth logic elements arranged in a fourth column;

first wirings between the first column and the second column;

second wirings between the first column and the second column;

third wirings between the first column and the second column and between the second column and the third column;

fourth wirings between the second column and the third column and between the third column and the fourth column;

a first switch circuit between the first column and the second column;

a second switch circuit between the second column and the third column; and a third switch circuit between the third column and the fourth column, wherein one of the first wirings is electrically connected to an output terminal of one of the first logic elements, wherein one of the second wirings is electrically connected to an output terminal of one of the second logic elements, wherein one of the third wirings is electrically connected to an output terminal of one of the third logic elements, wherein one of the fourth wirings is electrically connected to an output terminal of one of the fourth logic elements, wherein the first switch circuit is configured to control an electrical connection between an input terminal of one of the second logic elements and any of the first wirings, the second wirings, and the third wirings, wherein the second switch circuit is configured to control an electrical connection between an input terminal of one of the third logic elements and any of the third wirings and the fourth wirings, wherein the third switch circuit is configured to control an electrical connection between an input terminal of one of the fourth logic elements and any of the fourth wirings, wherein the third wirings are provided around a top side of the second column, wherein the fourth wirings are provided around a bottom side of the third column, wherein the first switch circuit comprises a first switch and a second switch, and wherein the second switch is configured to control an electrical connection between the one of the second logic elements and any of the first wirings, the second wirings, and the third wirings in accordance with configuration data supplied to the second switch through the first switch.

14. The programmable logic device according to claim 13, further comprising:

IO elements arranged in a fifth column, wherein the first column is between the second column and the fifth column;

fifth wirings between the first column and the fifth column; and a fourth switch circuit between the first column and the fifth column, wherein the fifth wirings are electrically connected to the IO elements, and wherein each of the fifth wirings is electrically connected to an input terminal of one of the first logic elements through the fourth switch circuit.

15. The programmable logic device according to claim 13, wherein the first switch is a first transistor, wherein the second switch is a second transistor, and wherein the first transistor comprises a channel formation region in an oxide semiconductor film.

16. The programmable logic device according to claim 15, wherein the oxide semiconductor film comprises indium and zinc.

17. The programmable logic device according to claim 13, wherein the first switch circuit further comprises:

a fifth wiring; and a third switch configured to control an electrical connection between the fifth wiring and the input terminal of the one of the second logic elements, and wherein the fifth wiring is configured to be supplied with a potential for initialization.

18. The programmable logic device according to claim 13, wherein another of the first wirings is electrically connected to an output terminal of another of the first logic elements, wherein another of the second wirings is electrically connected to an output terminal of another of the second logic elements, wherein another of the third wirings is electrically connected to an output terminal of another of the third logic elements, and wherein another of the fourth wirings is electrically connected to an output terminal of another of the fourth logic elements.

* * * * *